United States Patent
Kiuchi

(10) Patent No.: US 8,508,714 B2
(45) Date of Patent: Aug. 13, 2013

(54) EXPOSURE APPARATUS, EXPOSURE METHOD, AND METHOD FOR PRODUCING DEVICE

(75) Inventor: Tohru Kiuchi, Higashikurume (JP)

(73) Assignee: Nikon Corporation, Tokyo (JP)

( * ) Notice: Subject to any disclaimer, the term of this patent is extended or adjusted under 35 U.S.C. 154(b) by 471 days.

(21) Appl. No.: 12/923,848

(22) Filed: Oct. 12, 2010

(65) Prior Publication Data

US 2011/0026005 A1 Feb. 3, 2011

Related U.S. Application Data

(63) Continuation of application No. 11/979,330, filed on Nov. 1, 2007, now abandoned.

(30) Foreign Application Priority Data

Nov. 15, 2006 (JP) .................................. 2006-309168

(51) Int. Cl.
*G03B 27/42* (2006.01)
*G03B 27/58* (2006.01)

(52) U.S. Cl.
USPC .............................................. 355/53; 355/72

(58) Field of Classification Search
USPC ................................. 355/30, 53, 72; 250/548
See application file for complete search history.

(56) References Cited

U.S. PATENT DOCUMENTS

| 6,208,407 | B1 | 3/2001 | Loopstra |
| 7,310,132 | B2 * | 12/2007 | Van Der Schoot et al. ..... 355/72 |
| 7,589,822 | B2 * | 9/2009 | Shibazaki ...................... 355/72 |
| 2003/0223076 | A1 | 12/2003 | Hidaka et al. |
| 2004/0189964 | A1 | 9/2004 | Nijmeijer et al. |
| 2005/0018206 | A1 | 1/2005 | Hill |
| 2006/0023186 | A1 | 2/2006 | Binnard |
| 2006/0103832 | A1 | 5/2006 | Hazelton et al. |
| 2006/0114445 | A1 | 6/2006 | Ebihara |
| 2006/0139595 | A1 | 6/2006 | Koenen et al. |

(Continued)

FOREIGN PATENT DOCUMENTS

| EP | 1 713 113 A1 | 10/2006 |
| EP | 1 791 164 A1 | 5/2007 |

(Continued)

OTHER PUBLICATIONS

English translation of previously-cited JP-A-2004-104050.

(Continued)

*Primary Examiner* — Hung Henry Nguyen
(74) *Attorney, Agent, or Firm* — Oliff & Berridge, PLC

(57) ABSTRACT

An immersion exposure apparatus includes an optical system via which the exposure beam exits, a first stage on which a substrate is placed and onto which the exposure beam is irradiated, and a second stage which is movable independently from the first stage. A liquid immersion system supplies a liquid beneath the optical system and forms a liquid immersion area. A bridge member provided on the first stage has an upper surface retaining the liquid immersion area between the upper surface and the optical system. A driving device moves the first stage and the bridge member relative to each other, and a driving system moves the first stage and the second stage so that a change is made from the liquid immersion area being retained between the optical system and the first stage to the liquid immersion area being retained between the optical system and the second stage.

16 Claims, 20 Drawing Sheets

(56) References Cited

U.S. PATENT DOCUMENTS

| | | |
|---|---|---|
| 2006/0209286 A1 | 9/2006 | Nakano |
| 2006/0227308 A1 | 10/2006 | Brink et al. |
| 2006/0285092 A1 | 12/2006 | Ono |
| 2007/0115450 A1 | 5/2007 | Nagasaka et al. |
| 2007/0127006 A1 | 6/2007 | Shibazaki |
| 2007/0216881 A1 | 9/2007 | Van Der Schoot et al. |
| 2007/0285642 A1 | 12/2007 | Muto et al. |

FOREIGN PATENT DOCUMENTS

| | | |
|---|---|---|
| JP | A-2000-505958 | 5/2000 |
| JP | A-2000-511704 | 9/2000 |
| JP | A-2000-323404 | 11/2000 |
| JP | A-2001-513267 | 8/2001 |
| JP | A-2002-158168 | 5/2002 |
| JP | A-2003-247804 | 9/2003 |
| JP | A-2004/104050 | 4/2004 |
| JP | A-2004-289126 | 10/2004 |
| JP | A-2004-289128 | 10/2004 |
| JP | A-2005-268759 | 9/2005 |
| JP | A-2006-165500 | 6/2006 |
| JP | A-2006-186380 | 7/2006 |
| JP | A-2006-203116 | 8/2006 |
| JP | A-2006/245145 | 9/2006 |
| JP | A-2006-295150 | 10/2006 |
| WO | WO 98/28665 | 7/1998 |
| WO | WO 98/40791 | 9/1998 |
| WO | WO 2004/090577 A2 | 10/2004 |
| WO | WO 2004/114380 A1 | 12/2004 |
| WO | WO 2005/043607 A1 | 5/2005 |
| WO | WO 2005/074014 | 8/2005 |
| WO | WO 2006/013806 A1 | 2/2006 |

OTHER PUBLICATIONS

Jul. 3, 2012 Office Action issued in JP Application No. 2007-293198 (with English translation).

* cited by examiner

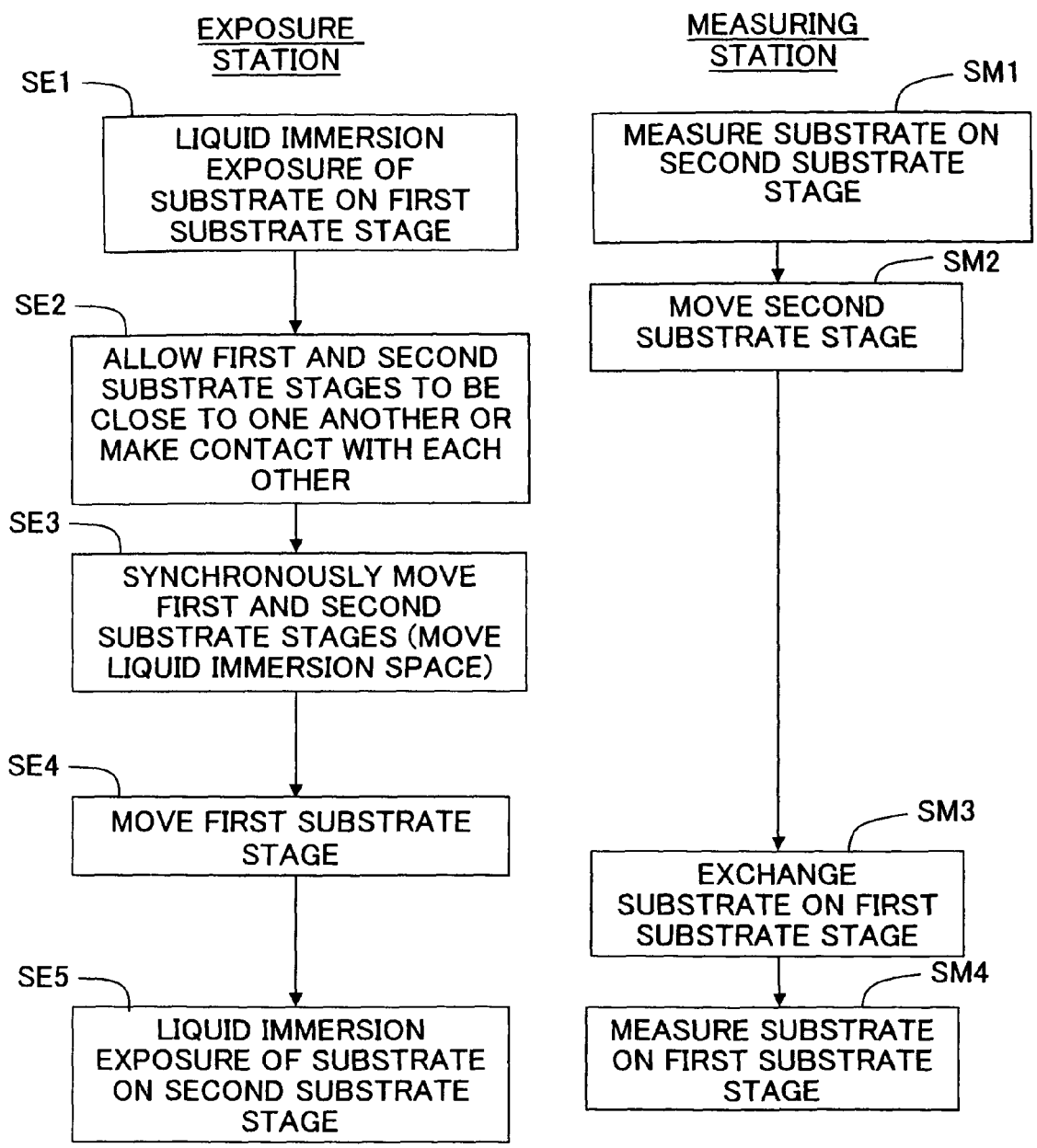

EXPOSURE APPARATUS, EXPOSURE METHOD, AND METHOD FOR PRODUCING DEVICE

This is a Continuation of application Ser. No. 11/979,330 filed Nov. 1, 2007 (abandoned Oct. 12, 2010). The disclosure of the prior application is hereby incorporated by reference herein in its entirety.

CROSS-REFERENCES TO RELATED APPLICATIONS

This application claims the benefit of priority of Japanese Patent Application No. 2006-309168 filed on Nov. 15, 2006 and U.S. Provisional Application No. 60/959,925 filed on Jul. 18, 2007, the entire disclosures of which are incorporated herein by reference.

TECHNICAL FIELD

The present invention relates to an exposure apparatus which exposes a substrate, an exposure method, and a method for producing a device.

BACKGROUND ART

In relation to the exposure apparatus usable in the photolithography process, a liquid immersion exposure apparatus is known, which exposes the substrate through a liquid as disclosed in Japanese Patent Application Laid-open Nos. 2004-289126 and 2004-289128. On the other hand, a multi-stage type (twin-stage type) exposure apparatus is known, which is provided with a plurality of substrate stages holding the substrates as disclosed in Published Japanese Translation of PCT International Publication for Patent Application No. 2000-511704, Japanese Patent Application Laid-open Nos. 2000-323404 and 2000-505958, Published Japanese Translation of PCT International Publication for Patent Application No. 2001-513267, Japanese Patent Application Laid-open No. 2002-158168, and International Publication No. 2005/074014.

DISCLOSURE OF THE INVENTION

Task to be Solved by the Invention

In the liquid immersion exposure apparatus, when all of the liquid is recovered every time when the substrate stage is separated and away from the projection optical system, for example, during the exchange of the substrate, there is such a possibility that the throughput of the exposure apparatus is lowered. When all of the liquid is recovered, and the state of a light-exit surface of the projection optical system is changed from the wet state to the dry state, then due to the vaporization of the liquid, the adhesion trace (water mark) of the liquid is formed on the light-exit surface of the projection optical system in some cases, and the temperature change occurs in other cases, thereby leading to a possibility such that the exposure accuracy is deteriorated. Therefore, it is desirable that the light-exit surface of the projection optical system is always wetted with the liquid.

In the multi-stage type exposure apparatus, when it is intended to always wet the light-exit surface of the projection optical system with the liquid by retaining or holding a cap member (shutter member) so that the cap member (shutter member) is opposite to or facing the light-exit surface of the projection optical system as in the conventional technique, it is undeniable that the possibility is present to cause any inconvenience or problem including, for example, the falling of the cap member, the leakage of the liquid on the cap member and the like. Further, there is such a possibility that the throughput of the exposure apparatus is lowered due to a delivery operation between the substrate stage and the cap member. Therefore, it is demanded to contrive such a technique that the light-exit surface of the projection optical system can be always wetted with the liquid to expose the substrate efficiently and satisfactorily even when the liquid immersion method is applied to the multi-stage type exposure apparatus.

The present invention has been made taking the foregoing circumstances into consideration, an object of which is to provide an exposure apparatus and an exposure method in which a substrate can be exposed efficiently and satisfactorily when the liquid immersion method is applied to the exposure apparatus, and a method for producing a device using the exposure apparatus and the exposure method.

Solution for the Task

In order to achieve the object as described above, the present invention adopts the following constructions corresponding to respective drawings as illustrated in embodiments.

According to a first aspect of the present invention, there is provided an exposure apparatus which exposes a substrate by irradiating an exposure beam onto the substrate, the exposure apparatus including: a first optical member via which the exposure beam exits; a first movable body which is movable on a light-exit side of the first optical member; a measuring member provided on the first movable body and having an inclined surface to which a measuring beam for position measurement is irradiated; and a transmitting member provided on the first movable body, having an end surface protruding more outwardly from the first movable body than the measuring member, and having a transmitting area through which the measuring beam is transmissive.

According to the first aspect of the present invention, the substrate can be exposed efficiently and satisfactorily.

According to a second aspect of the present invention, there is provided an exposure apparatus which exposes a substrate by irradiating an exposure beam onto the substrate, the exposure apparatus including: a first optical member via which the exposure beam exits; a first movable body which is movable on a light-exit side of the first optical member; a measuring member provided on the first movable body and having an inclined surface to which a measuring beam for position measurement is irradiated; a movable member which is provided on the first movable body, which is supported movably with respect to the first movable body, and which has an end surface arranged in a predetermined positional relationship with respect to the inclined surface of the measuring member; and a driving device capable of moving the movable member to a first position at which the end surface of the movable member protrudes more outwardly from the first movable body than the measuring member and to a second position at which the movable member does not obstruct travel of the measuring beam at least from the inclined surface of the measuring member.

According to the second aspect of the present invention, the substrate can be exposed efficiently and satisfactorily.

According to a third aspect of the present invention, there is provided an exposure apparatus which exposes a substrate by irradiating an exposure beam onto the substrate, the exposure apparatus including: an optical member via which the exposure beam exits; a first movable body which is movable on a light-exit side of the optical member; a detector which is provided on the first movable body and which detects the exposure beam; and a transmitting plate provided on the first movable body and having a first transmitting area which transmits a measuring beam for position measurement of the first movable body and a second transmitting area which transmits a detecting light beam to the detector.

According to the third aspect of the present invention, the substrate can be exposed efficiently and satisfactorily.

According to a fourth aspect of the present invention, there is provided a method for producing a device, including using the exposure apparatus as defined in any one of the foregoing aspects.

According to the fourth aspect of the present invention, the device can be produced by using the exposure apparatus which makes it possible to expose the substrate efficiently and satisfactorily.

According to a fifth aspect of the present invention, there is provided an exposure method for exposing a substrate by irradiating an exposure beam onto the substrate held by a movable body which has an inclined surface reflecting a measuring beam, the exposure method including: measuring a position of the substrate, held by the movable body, by receiving the measuring beam from the inclined surface via a transmitting member provided to extend from the movable body to outside of the inclined surface; and exposing the substrate by irradiating the exposure beam onto the substrate on the movable body of which position is measured.

According to the fifth aspect of the present invention, the substrate can be exposed efficiently and satisfactorily.

According to a sixth aspect of the present invention, there is provided a method for producing a device, including: exposing a substrate by using the exposure method as defined above; developing the exposed substrate; and processing the developed substrate.

According to the sixth aspect of the present invention, the substrate can be exposed efficiently and satisfactorily.

BRIEF DESCRIPTION OF THE DRAWINGS

FIG. 24 is a flow chart illustrating the exposure method of the present invention.

BEST MODE FOR CARRYING OUT THE INVENTION

Embodiments of the present invention will be explained below with reference to the drawings. However, the present invention is not limited to the illustrated embodiments. In the following description, the XYZ rectangular coordinates system is defined. The positional relationship in relation to the respective members will be explained with reference to the XYZ rectangular coordinates system. An X axis direction is a predetermined direction in a horizontal plane, a Y axis direction is a direction which is perpendicular to the X axis direction in the horizontal plane, and a Z axis direction is a direction which is perpendicular to the X axis direction and the Y axis direction respectively (i.e., the vertical direction). The directions of rotation (inclination) about the X axis, the Y axis, and the Z axis are designated as $\theta X$, $\theta Y$, and $\theta Z$ directions respectively.

First Embodiment

Figure 1:
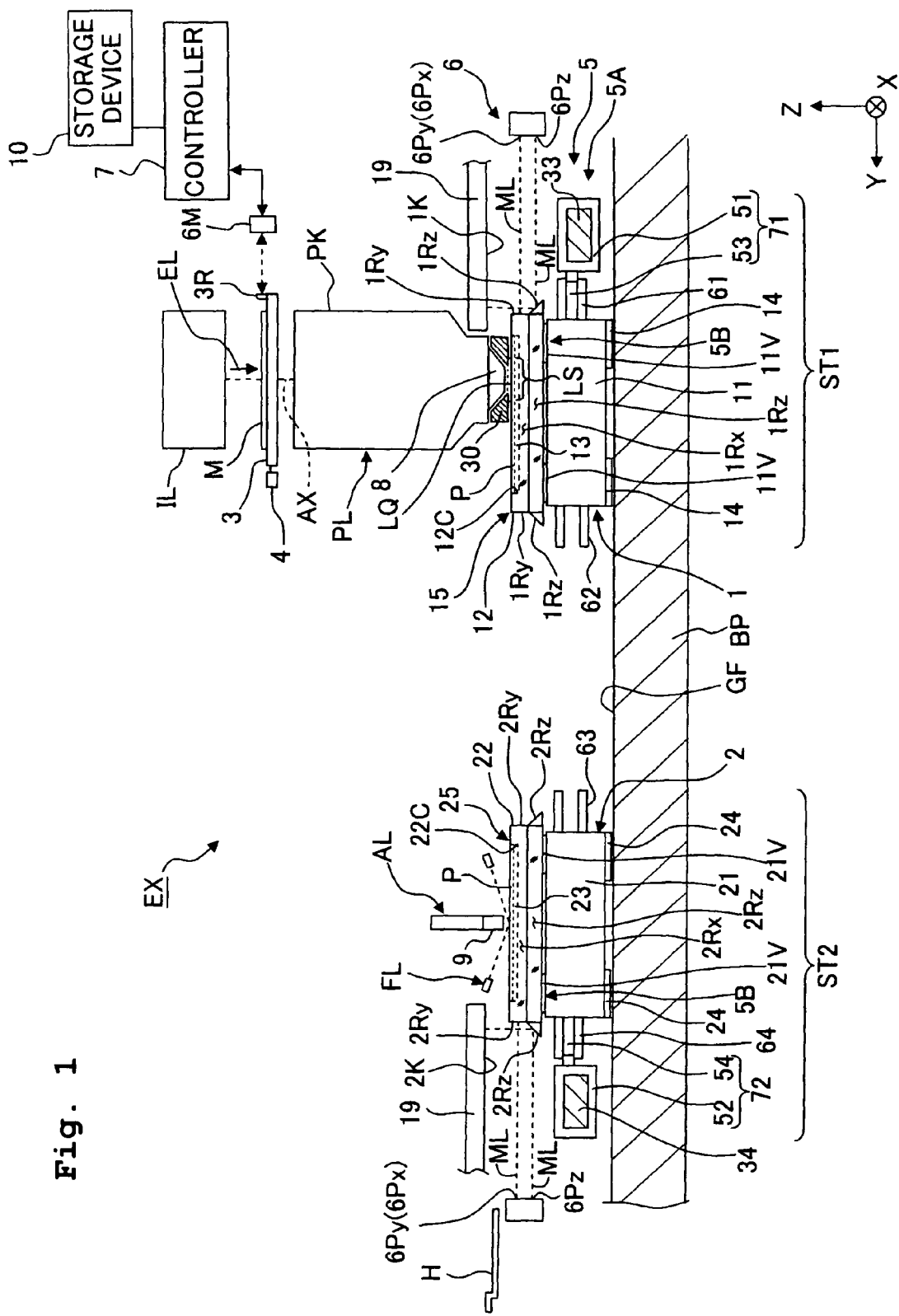
FIG. 1 is a schematic arrangement view of an exposure apparatus according to a first embodiment.

A first embodiment will be explained. FIG. 1 is a schematic arrangement view of an exposure apparatus EX according to the first embodiment. In this embodiment, an explanation will be made as exemplified by a case in which the exposure apparatus EX is an exposure apparatus of the multi-stage type (twin-stage type) provided with a plurality of (two) substrate stages 1, 2 each of which is movable while holding a substrate P as disclosed, for example, in Japanese Patent Application Laid-open No. 10-163099, Japanese Patent Application Laid-open No. 10-214783 (corresponding to U.S. Pat. No. 6,590,634), Published Japanese Translation of PCT International Publication for Patent Application Nos. 2000-505958 (corresponding to U.S. Pat. No. 5,969,441) and 2000-511704 (corresponding to U.S. Pat. No. 5,815,246), Japanese Patent Application Laid-open Nos. 2000-323404 (corresponding to U.S. Pat. No. 6,674,510) and 2000-505958 (corresponding to U.S. Pat. No. 5,969,081), Published Japanese Translation of PCT International Publication for Patent Application No. 2001-513267 (corresponding to U.S. Pat. No. 6,208,407), and Japanese Patent Application Laid-open No. 2002-158168 (corresponding to U.S. Pat. No. 6,710,849). That is, in this embodiment, the exposure apparatus EX has the first substrate stage 1 which is movable while holding the substrate P, and the second substrate stage 2 which is movable while holding the substrate P independently from the first substrate stage 1. The multi-stage type (twin-stage type) exposure apparatus is disclosed in U.S. Pat. Nos. 6,341,007, 6,400,441, 6,549,269, 6,590,634, contents of which are incorporated herein by reference within a range of permission of the domestic laws and ordinances of the designated state or the selected state.

With reference to FIG. 1, the exposure apparatus EX includes a mask stage 3 which is movable while holding a mask M, a first substrate stage 1 which is movable while holding the substrate P, a second substrate stage 2 which is movable while holding another substrate P independently from the first substrate stage 1, a mask stage-driving system 4 which moves the mask stage 3, a substrate stage-driving system 5 which moves the first substrate stage 1 and the second substrate stage 2, a measuring system 6 including laser interferometers 6Px, 6Py, 6Pz, 6M which measure the position information about the stages 1, 2, 3 respectively, an illumination system IL which illuminates the mask M with an exposure beam EL (exposure light EL), a projection optical system PL which projects, onto the substrate P, an image of a pattern of the mask M illuminated with the exposure light EL, a controller 7 which controls the operation of the entire exposure apparatus EX, and a storage device 10 which is connected to the controller 7 and which stores various information in relation to the exposure.

The substrate P referred to herein is a substrate for producing a device, and includes, for example, substrates in which various films of, for example, a photosensitive material (photoresist) and a protective film (top coat film) are formed on a base material including, for example, a semiconductor wafer such as a silicon wafer. The mask M includes a reticle on which a device pattern to be projected onto the substrate P is formed. For example, a predetermined pattern is formed by using a light-shielding film such as chromium on a transparent plate member such as a glass plate. In this embodiment, a transmission type mask is used as the mask M. However, it is also possible to use a reflection type mask. The transmission type mask is not limited to a binary mask on which the pattern is formed with the light-shielding film. The transmission type mask also includes, for example, a phase shift mask of the spatial frequency modulation type or the half tone type.

The exposure apparatus EX is provided with an exposure station ST1 in which the exposure light EL is irradiated onto the substrate P, and a measuring station ST2 in which the predetermined measurement in relation to the exposure and the exchange of the substrate P are performed. The exposure apparatus EX is provided with a base member BP having a guide surface GF which movably supports each of the first substrate stage 1 and the second substrate stage 2. The first substrate stage 1 and the second substrate stage 2 are movable on the guide surface GF between the exposure station ST1 and the measuring station ST2 while holding the substrates P respectively. In this embodiment, the guide surface GF is substantially parallel to the XY plane. The first substrate stage 1 and the second substrate stage 2 are movable in the XY directions (two-dimensional directions) and in θZ direction along the guide surface GF.

The illumination system IL, the mask stage 3, the projection optical system PL and the like are arranged in the exposure station ST1. The projection optical system PL has a plurality of optical elements. A terminal end optical element 8 (final optical element 8), which is closest to the image plane of the projection optical system PL among the plurality of optical elements of the projection optical system PL, has a light-exit surface (lower surface) via which the exposure light EL exits. The first substrate stage 1 is movable on the light-exit side of the terminal end optical element 8, of the projection optical system PL, via which the exposure light EL exits (movable on the image plane side of the projection optical system PL). The second substrate stage 2 is movable independently from the first substrate stage 1 on the light-exit side of the terminal end optical element 8 of the projection optical system PL (on the image plane side of the projection optical system PL). Although not shown, the projection optical system PL is provided on a barrel surface plate which is supported by three support columns via an anti-vibration mechanism. However, as disclosed, for example, in International Publication No. 2006/038952, the projection optical system PL may be supported by hanging the projection optical system PL, for example, with respect to an unillustrated main frame member arranged at a position above or over the projection optical system PL, or with respect to the mask base in which the mask stage 3 is placed.

Various measuring devices capable of executing the measurement in relation to the exposure of the substrate P, including, for example, a focus/leveling-detecting system FL and an alignment system AL which obtain the position information about the substrate P held by at least one of the first substrate stage 1 and the second substrate stage 2, are arranged in the measuring station ST2. The alignment system AL has a plurality of optical elements. The alignment system AL obtains the position information about the substrate P by using the optical elements. The focus/leveling-detecting system FL also has a plurality of optical elements. The focus/leveling-detecting system FL also obtains the position information about the substrate P by using the optical elements.

A transport system H is provided in the vicinity of the measuring station ST2 in order to exchange the substrate P. By using the transport system H, the controller 7 is capable of executing the substrate exchange operation in which the substrate P for which the exposure process has been performed is unloaded from the first substrate stage 1 (or the second substrate stage 2) moved to the substrate exchange position (loading position) of the measuring station ST2, and another substrate P to be subjected to the exposure process is loaded onto the first substrate stage 1 (or the second substrate stage 2). In this embodiment, although the loading position and the unloading position are located in a same position in the measuring station ST2, the loading and unloading may be performed at different positions.

The exposure apparatus EX of the embodiment of the present invention is the liquid immersion exposure apparatus to which the liquid immersion method is applied in order that the exposure wavelength is substantially shortened to improve the resolution and the depth of focus is substantially widened. The exposure apparatus EX is provided with a nozzle member 30 which is capable of forming a liquid immersion space LS for the liquid LQ so that the optical path space for the exposure light EL is filled with the liquid LQ. The optical path space for the exposure light EL is a space which includes the optical path in which the exposure light EL travels. The liquid immersion space LS is the space which is filled with the liquid LQ. The nozzle member 30 is also referred to as "liquid immersion space forming member" or "containment member (confinement member), etc. The exposure apparatus EX irradiates the exposure light EL onto the substrate P via the projection optical system PL and the liquid LQ to expose the substrate P.

The nozzle member 30 includes a seal member which is disclosed, for example, in Japanese Patent Application Laid-open Nos. 2004-289126 (corresponding to U.S. Pat. No.

6,952,253) and 2004-289128 (corresponding to U.S. Pat. No. 7,110,081). The nozzle member 30 is provided with a flow passage for supplying and recovering the liquid LQ with respect to the optical path space for the exposure light EL. The flow passage is omitted from the illustration in the drawings. A liquid supply device (not shown) which supplies the liquid LQ to the optical path space for the exposure light EL and a liquid recovery device (not shown) which recovers the liquid LQ are connected to the flow passage. The liquid supply device is capable of supplying the liquid LQ for forming the liquid immersion space LS to the optical path space for the exposure light EL via the flow passage. The liquid recovery device is capable of recovering the liquid LQ in the liquid immersion space LS via the flow passage. The liquid supply device includes a liquid supply section which is capable of feeding out the liquid LQ, a supply tube which has one end connected to the liquid supply section, a tank which accommodates the liquid LQ, a filter, a pressurizing pump, and the like. The liquid recovery device includes a liquid recovery section which is capable of recovering the liquid LQ, a recovery tube which has one end connected to the liquid recovery section, a tank which accommodates the liquid LQ, a filter, a suction pump, and the like. It is not necessarily indispensable that the exposure apparatus EX is provided with all of the liquid supply device and the liquid recovery device as well as the tank, filter unit, pump and the like constructing each of the liquid supply and recovery devices. Any equipment of the factory or the like, in which the exposure apparatus EX is installed, may be used instead of all or a part(s) of the liquid supply and recovery devices.

In this embodiment, water (pure or purified water) is used as the liquid LQ. Not only the ArF excimer laser beam but also the emission line radiated, for example, from a mercury lamp and the far ultraviolet light beam (DUV light beam) such as the KrF excimer laser beam are transmissive through pure water. The optical element 8 is formed of calcium fluoride ($CaF_2$). Calcium fluoride has a high affinity for water. Therefore, the liquid LQ can make tight contact with approximately the entire surface of a liquid contact surface 2a of the optical element 8. The optical element 8 may be silica glass having high affinity for water.

As the nozzle member 30, it is also allowable to use nozzle members having structures disclosed, for example, in International Publication No. 2004/086468 (corresponding to United States Patent Application Publication No. 2005/0280791), International Publication No. 2005/024517, European Patent application publication No. 1420298, International Publication Nos. 2004/055803, 2004/057589 and 2004/057590, International Publication No. 2005/029559 (corresponding to United States Patent Application Publication No. 2006/0231206), U.S. Pat. No. 6,952,253, and the like.

The nozzle member 30 is capable of forming the liquid immersion space LS between the nozzle member 30 and an object opposite to or facing the nozzle member 30. In this embodiment, the nozzle member 30 is arranged in the vicinity of the terminal end optical element 8 of the projection optical system PL. The liquid immersion space LS can be formed between the nozzle member 30 and the object arranged at a position at which the exposure light EL can be irradiated, i.e., between the nozzle member 30 and the object arranged at the position opposite to the light-exit surface of the terminal end optical element 8, on the light-exit side of the terminal end optical element 8 (on the image plane side of the projection optical system PL). The nozzle member 30 forms the liquid immersion space LS of the liquid LQ to fill, with the liquid LQ, the optical path space for the exposure light EL on the light-exit side of the terminal end optical element 8, specifically the optical path space for the exposure light EL between the terminal end optical element 8 and the object by retaining the liquid LQ between the nozzle member 30 and the object.

The nozzle member 30 is provided, for example, with a supply port formed in an inner surface of the nozzle member 30 opposite to or facing the optical element 8 of the projection optical system PL; a recovery port formed in a lower surface (bottom surface) of the nozzle member 30 to which an object is arranged to be opposite or facing; a supply flow passage formed in the nozzle member 30 and connected to the supply tube of the liquid supply device; and a recovery flow passage formed in the nozzle member 30 and connected to the recovery tube of the liquid recovery device. The supply port may include a first supply port which is formed on the side in the +X direction of the optical element 8, and a second supply port which is formed on the side in the −X direction of the optical element 8. The first and second supply ports may be arranged to interpose the projection area in the X direction. The supply port may have, for example, a rectangular form which is long in the Y direction, a circular arc-shaped form, or the like. The recovery port may be formed to be a rectangular frame-shaped recovery port (or optionally, for example, circular-shaped recovery port) arranged to surround the optical element 8 of the projection optical system PL, and the recovery port may be provided outside the supply port with respect to the optical element 8. Alternatively, the supply port may be a groove-shaped recess, and may be provided with a mesh filter, which is a porous member formed with a large number of small holes or pores in a mesh form and fitted to cover the recovery port.

The nozzle member 30 may be supported and hung with respect to the main frame (not shown) which holds the projection optical system PL. Alternatively, the nozzle member 30 may be provided on another frame member separate from the main frame. Further alternatively, when the projection optical system PL is supported in a hanging manner, the nozzle member 30 may be supported by being hung integrally with the projection optical system PL, or the nozzle member 30 may be provided, for example, on a measuring frame which is hung and supported independently from the projection optical system PL. In the case of the latter, it is also allowable that the projection optical system PL is not supported in a hanging manner.

The object, which is opposable (can be opposite) to the nozzle member 30 and the terminal end optical element 8, include any object which has an opposing surface which is opposable to or which can face the terminal end optical element 8, and which is movable on the light-exit side of the terminal end optical element 8. In this embodiment, the object, which can be opposite to the nozzle member 30 and the terminal end optical element 8, includes at least one of the first substrate stage 1 and the second substrate stage 2 which are movable on the light-exit side of the terminal end optical element 8. The object, which can be opposite to or can face the nozzle member 30 and the terminal end optical element 8, also includes the substrate P held by each of the first and second substrate stages 1, 2. The first and second substrate stages 1, 2 (first and second substrate tables 12, 22) have opposing surfaces 15, capable of being opposite to the nozzle member 30 and the terminal end optical element 8, respectively. Each of the first and second substrate stages 1, 2 is movable to a position at which the opposing surface can be opposite to or can face the nozzle member 30 and the terminal end optical element 8, and at which a space, capable of retaining the liquid LQ between at least a part of the opposing surface 15, 25 and the nozzle member 30 and the terminal end optical element 8, can be formed. Note that the object may include a measuring stage which will be explained later. Further, the liquid immersion space LS formed between the object and the nozzle member 30 and the terminal end optical element 8 is referred, on the object, simply to as "liquid immersion area" or the like.

The nozzle member 30 can form the liquid immersion space LS of the liquid LQ between the nozzle member 30 and the terminal end optical element 8 and the first and second substrate stages 1, 2 by retaining the liquid LQ between the nozzle member 30 and the terminal end optical element 8 and at least a part or parts of the opposing surfaces 15, 25 of the first and second stages 1, 2 so that the optical path space for the exposure light EL on the light-exit side of the terminal end optical element 8 is filled with the liquid LQ.

In this embodiment, the nozzle member 30 forms the liquid immersion space LS between the object (at least one of the first substrate stage 1, the second substrate stage 2, and the substrate P) and the terminal end optical element 8 and the nozzle member 30 so that a partial area (local area) of a surface of the object is covered with the liquid LQ of the liquid immersion space LS. That is, in this embodiment, the exposure apparatus EX adopts the local liquid immersion system in which the liquid immersion space LS is formed between the substrate P and the terminal end optical element 8 and the nozzle member 30 so that the partial area on the substrate P is covered with the liquid LQ of the liquid immersion space LS at least during the exposure of the substrate P. In this embodiment, a local liquid immersion apparatus (liquid immersion system) which forms the liquid immersion space LS is constructed by including the nozzle member 30 and the like. Note that when the exposure is performed for a shot area located in the circumference (edge) portion of the substrate P, the liquid immersion space LS extends (protrudes) also to the outside of the substrate P, thereby covering a part of the opposing surface 15 and a part of the opposing surface 25 as well.

In this embodiment, as described later on, the exposure apparatus EX is provided with measuring mirrors 1Rz, 2Rz provided on or for the first substrate stage 1 and the second substrate stage 2 respectively and having inclined surfaces (surfaces inclined with respect to the XY plane) to which measuring beam (measuring light) ML for the position measurement from the laser interferometer 6Pz is irradiated; and predetermined members 81, 82 (hereinafter referred to as "transmitting members") provided on or for the first substrate stage 1 and the second substrate stage 2 respectively, having end surfaces protruding outwardly in the XY plane than the measuring mirrors 1Rz, 2Rz respectively, and having transmitting areas through which the measuring light ML is transmissive. The transmitting member 81 is provided for the first substrate stage 1, and the transmitting member 82 is provided for the second substrate stage 2. Each of the transmitting members 81, 82 is a plate-shaped member having upper and lower surfaces. Each of the transmitting members 81, 82 is capable of forming the space in which the liquid LQ can be retained, between the nozzle member 30 and the terminal end optical element 8. The transmitting member may be provided for only one of the first and second substrate stages 1, 2.

The alignment system AL of the measuring station ST2 has an optical element 9 which can be opposite to the object (at least one of the first substrate stage 1, the second substrate stage 2, and the substrate P). Each of the first substrate stage 1 and the second substrate stage 2 is movable to a position opposite to the optical element 9 of the alignment system AL. The alignment system AL detects, for example, an alignment mark on the substrate P and reference marks on the first and second substrate stages 1, 2 via the optical element 9 to obtain the position information about the substrate P held by at least one of the first substrate stage 1 and the second substrate stage 2.

In the following description, the terminal end optical element 8, of the projection optical system PL, via which the exposure light EL exits and which is arranged in the exposure station ST1, is appropriately referred to as "first optical element 8". The optical element 9 of the alignment system AL for obtaining the position information about the substrate P, which is arranged in the measuring station ST2, is appropriately referred to as "second optical element 9". The position, which is opposite to the first optical element 8 and onto which the exposure light EL from the first optical element 8 is irradiated, is appropriately referred to as "irradiation position". The position, which is opposite to the second optical element 9, is appropriately referred to as "opposing position (opposite position)". Since the substrate P is exposed at the irradiation position, the irradiation position can be also referred to as "exposure portion". Further, since the mark detection is performed at the opposing position, the opposing position can also be referred to as "detection position" or "measurement position".

Therefore, the first substrate stage 1 and the second substrate stage 2 are movable while holding the substrates P respectively in the predetermined area on the guide surface GF including the position which is opposite to the first optical element 8 and at which the exposure light EL is irradiated from the first optical element 8 and the position which is opposite to the second optical element 9.

The exposure apparatus EX of the embodiment of the present invention is the scanning type exposure apparatus (so-called scanning stepper) in which the image of the pattern of the mask M is projected onto the substrate P while synchronously moving the mask M and the substrate P in the predetermined scanning directions. In the embodiment of the present invention, the Y axis direction is the scanning direction (synchronous movement direction) for the substrate P. The scanning direction (synchronous movement direction) for the mask M is also the Y axis direction. The exposure apparatus EX irradiates the exposure light EL onto the substrate P via the projection optical system PL and the liquid LQ while moving the substrate P in the Y axis direction with respect to the projection area of the projection optical system PL and moving the mask M with respect to an illumination area of the illumination system IL in synchronization with the movement of the substrate P in the Y axis direction so that the substrate P is exposed. Accordingly, the image of the pattern of the mask M is projected onto the substrate P.

The illumination system IL illuminates a predetermined illumination area on the mask M with the exposure light EL having a uniform illuminance distribution. Lights usable as the exposure light EL irradiated from the illumination system IL include, for example, emission lines (g-ray, h-ray, i-ray) irradiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used as the exposure light EL.

The mask stage 3 is movable in the X axis direction, the Y axis direction, and the θZ direction while holding the mask M by the mask stage-driving system 4 including, for example, an actuator such as a linear motor. The position information about the mask stage 3 (mask M) is measured by the laser interferometer 6M of the measuring system 6. The laser interferometer 6M measures the position information about the mask stage 3 in relation to the X axis direction, the Y axis direction, and the θZ direction by using the measuring mirror 3R provided on the mask stage 3. The controller 7 drives the mask stage-driving system 4 based on the measurement result of the measuring system 6 to control the position of the mask M held by the mask stage 3.

The projection optical system PL projects the image of the pattern of the mask M onto the substrate P at a predetermined projection magnification. The projection optical system PL has a plurality of optical elements. The optical elements are supported by a barrel PK. In this embodiment, the projection optical system PL is a reduction system having the projection magnification of, for example, ¼, ⅕, ⅛ or the like. The projection optical system PL may be any one of the 1× magnification system and the magnifying system. In this embodiment, an optical axis AX of the projection optical system PL is parallel to the Z axis direction. The projection optical system PL may be any one of the dioptric system including no catoptric optical element, the catoptric system including no dioptric optical element, and the catadioptric system including catoptric and dioptric optical elements. The projection optical system PL may form any one of the inverted image and the erecting image.

The exposure light EL, which is radiated from the illumination system IL and which passes via the mask M, comes into the projection optical system PL from the object plane side of the projection optical system PL. the projection optical system PL is capable of making the exposure light EL, incident from the object plane side, to exit from the light-exit surface (lower surface) of the first optical element 8 so that the substrate P is irradiated therewith.

The first substrate stage 1 has a body 11 of the stage (stage body 11), and a first substrate table 12 which is supported by the stage body 11 and which has a substrate holder 13 for detachably holding the substrate P. The stage body 11 is supported in a non-contact manner by, for example, an air bearing 14 on or over the upper surface (guide surface GF) of the base member BP. The first substrate table 12 has a recess 12C. The substrate holder 13 is arranged in the recess 12C. A partial area of the opposing surface 15, which is disposed around the recess 12C of the first substrate table 12, is substantially flat, and has an approximately same height as that of (flush with) the surface of the substrate P held by the substrate holder 13. That is, the first substrate table 12 has the opposing surface 15 having the area which is substantially flush with the surface of the substrate P held by the substrate holder 13 of the first substrate table 12. The first substrate stage 1 is movable, by the substrate stage-driving system 5, in the directions of six degrees of freedom of the X axis, Y axis, Z axis, θX, θY, and θZ directions on the base member BP while holding the substrate P with the substrate holder 13.

The second substrate stage 2 has a body of the stage (stage body) 21, and a second substrate table 22 which is supported by the stage body 21 and which has a substrate holder 23 for detachably holding the substrate P. The stage body 21 is supported in a non-contact manner by, for example, an air bearing 24 on or over the upper surface (guide surface GF) of the base member BP. The second substrate table 22 has a recess 22C. The substrate holder 23 is arranged in the recess 22C. A partial area of the opposing surface 25, which is disposed around the recess 22C of the second substrate table 22, is substantially flat, and has an approximately same height as that of (flush with) the surface of the substrate P held by the substrate holder 23. That is, the second substrate table 22 has the opposing surface 25 having the area which is substantially flush with the surface of the substrate P held by the substrate holder 23 of the second substrate table 22. The second substrate stage 2 is movable, by the substrate stage-driving system 5, in the directions of six degrees of freedom of the X axis, Y axis, Z axis, θX, θY, and θZ directions on the base member BP while holding the substrate P with the substrate holder 23.

The first substrate stage 1, including the stage body 11 and the first substrate table 12, has approximately same shape and approximately same size as those of the second substrate stage 2 including the stage body 21 and the second substrate table 22, and the first and second substrate stages 1, 2 are constructed approximately in the same manner. In this embodiment, the first and second substrate tables 12, 22 of the first and second substrate stages 1, 2 are substantially rectangular in the XY plane respectively.

The substrate stage-driving system 5 includes, for example, an actuator such as a linear motor, and is capable of moving each of the first substrate stage 1 and the second substrate stage 2. The substrate stage-driving system 5 is provided with a coarse movement system 5A which moves each of the stage bodies 11, 21 on the base member BP, and a fine movement system 5B which moves the substrate tables 12, 22 on the stage bodies 11, 21, respectively.

The coarse movement system 5A includes, for example, an actuator such as a linear motor, and is capable of moving each of the stage bodies 11, 21 on the base member BP in the X axis direction, the Y axis direction, and the θZ direction. When the stage bodies 11, 21 are moved in the X axis direction, the Y axis direction, and the θZ direction by the coarse movement system 5A, the substrate tables 12, 22, which are provided on the stage bodies 11, 21 respectively, are also moved in the X axis direction, the Y axis direction, and the θZ direction together with the stage bodies 11, 21 respectively.

Figure 2:
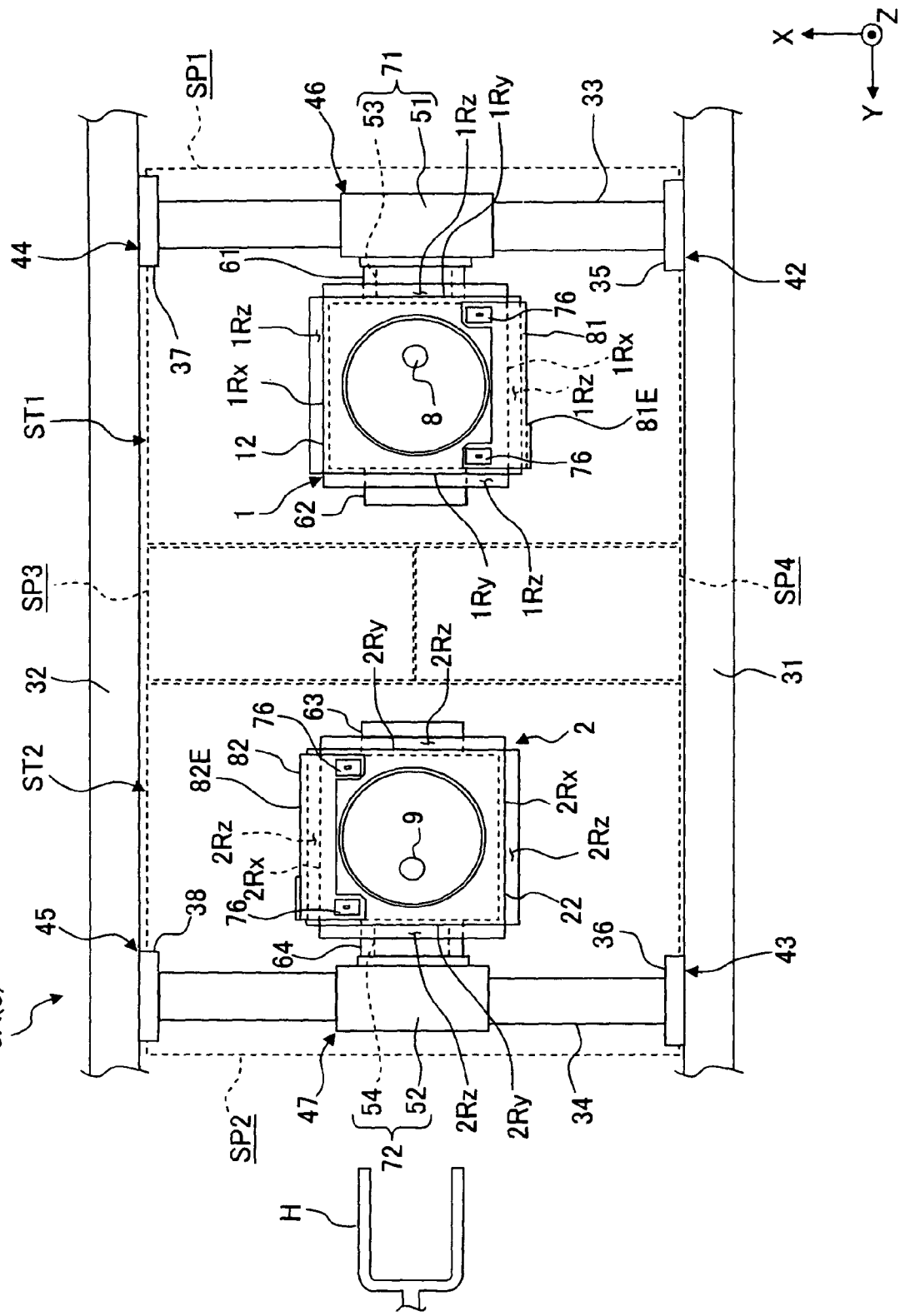
FIG. 2 is a plan view of first and second substrate stages and a substrate stage-driving system according to the first embodiment.

FIG. 2 shows the first substrate stage 1 and the second substrate stage 2 as viewed from an upper position. With reference to FIG. 2, the coarse movement system 5A, which is provided to move the first substrate stage 1 and the second substrate stage 2, includes a plurality of linear motors 42, 43, 44, 45, 46, 47. The coarse movement system 5A is provided with a pair of Y axis guide members 31, 32 which extend in the Y axis direction. Each of the Y axis guide members 31, 32 is provided with a magnet unit having a plurality of permanent magnets. The Y axis guide member 31, which is one of the pair, supports two slide members 35, 36 movably in the Y axis direction; and the Y axis guide member 32, which is the other of the pair, supports two slide members 37, 38 movably in the Y axis direction. Each of the slide members 35, 36, 37, 38 is provided with a coil unit having an armature coil. That is, in this embodiment, Y axis linear motors 42, 43, 44, 45 of the moving coil type are formed by the slide members 35, 36, 37, 38 each having the coil unit and the Y axis guide members 31, 32 each having the magnet unit.

The coarse movement system 5A is provided with a pair of X axis guide members 33, 34 which extend in the X axis direction. Each of the X axis guide members 33, 34 is provided with a coil unit having an armature coil. The X axis guide member 33, which is one of the pair, supports a slide member 51 movably in the X axis direction; and the X axis guide member 34, which is the other of the pair, supports a slide member 52 movably in the X axis direction. Each of the slide members 51, 52 is provided with a magnet unit having a plurality of permanent magnets. With reference to FIGS. 1 and 2, the slide member 51 is connected to the stage body 11 of the first substrate stage 1, and the slide member 52 is connected to the stage body 21 of the second substrate stage 2. That is, in this embodiment, an X axis linear motor 46 of the moving magnet type is formed by the slide member 51 having the magnet unit and the X axis guide member 33 having the coil unit. Similarly, an X axis linear motor 47 of the moving magnet type is formed by the slide member 52 having the magnet unit and the X axis guide member 34 having the coil unit. With reference to FIGS. 1 and 2, the first substrate stage 1 (stage body 11) is moved in the X axis direction by the X axis linear motor 46, and the second substrate stage 2 (stage body 21) is moved in the X axis direction by the X axis linear motor 47.

The slide members 35, 37 are fixed to one end and the other end of the X axis guide member 33 respectively, and the slide members 36, 38 are fixed to one end and the other end of the X axis guide member 34 respectively. Therefore, the X axis guide member 33 is movable in the Y axis direction by the Y axis linear motors 42, 44, and the X axis guide member 34 is movable in the Y axis direction by the Y axis linear motors 43, 45. With reference to FIGS. 1 and 2, the first substrate stage 1 (stage body 11) is moved in the Y axis direction by the Y axis linear motors 42, 44, and the second substrate stage 2 (stage body 21) is moved in the Y axis direction by the Y axis linear motors 43, 45.

By making the thrust forces, which are generated by the pair of Y axis linear motors 42, 44 respectively, to be slightly different from each other, it is possible to control the position of the first substrate stage 1 in the θZ direction. By making the thrust forces, which are generated by the pair of Y axis linear motors 43, 45 respectively, to be slightly different from each other, it is possible to control the position of the second substrate stage 2 in the θZ direction.

In this embodiment, the substrate tables 12, 22 are supported movably by the stage bodies 11, 21.

As shown in FIG. 1, the fine movement system 5B includes actuators 11V, 21V such as voice coil motors intervening between the stage bodies 11, 21 and the substrate tables 12, 22 respectively; and unillustrated measuring devices (for example, an encoder system) for measuring the driving amount of each of the actuators. The fine movement system 5B is capable of moving the substrate tables 12, 22 on the stage bodies 11, 21 respectively in at least the Z axis, θX, and θY directions. The fine movement system 5B is capable of moving (finely moving) the substrate tables 12, 22 on the stage bodies 11, 21 respectively in the X axis, Y axis, and θZ directions.

In this way, the driving system 5, which includes the coarse movement system 5A and the fine movement system 5B, is capable of moving each of the first substrate table 12 and the second substrate table 22 in the directions of six degrees of freedom of the X axis, Y axis, Z axis, θX, θY, and θZ directions.

The first substrate stage 1 (stage body 11) and the second substrate stage 2 (stage body 21) are releasably connected to the slide members 51, 52 respectively via joint members as disclosed, for example, in Published Japanese Translation of PCT International Publication for Patent Application Nos. 2000-505958 (corresponding to U.S. Pat. No. 5,969,441) and 2000-511704 (corresponding to U.S. Pat. No. 5,815,246) and Japanese Patent Application Laid-open No. 2001-223159 (corresponding to U.S. Pat. No. 6,498,350).

As shown in FIGS. 1 and 2, the first substrate stage 1 is provided with a first joint member 61 which is provided on a side surface of the stage body 11 on the −Y side, and a second joint member 62 which is provided on a side surface on the +Y side. Similarly, the second substrate stage 2 is provided with a third joint member 63 which is provided on a side surface of the stage body 21 on the −Y side, and a fourth joint member 64 which is provided on a side surface on the +Y side.

On the other hand, the substrate stage-driving system 5 is provided with a joint member 53 which is provided on the slide member 51, and a joint member 54 which is provided on the slide member 52. The joint member 53 is provided on the side surface of the slide member 51 on the +Y side so that the joint member 53 is directed toward the measuring station ST2 (+Y side). The joint member 54 is provided on the side surface of the slide member 52 on the −Y side so that the joint member 54 is directed toward the exposure station ST1 (−Y side).

The slide member 51 and the joint member 53 are releasably connected to each other as described later on. The slide member 51 and the joint member 53 are movable together. The slide member 52 and the joint member 54 are fixed to each other. The slide member 52 and the joint member 54 are movable together. Therefore, the linear motors 42, 44, 46 are capable of moving the slide member 51 and the joint member 53 together, and the linear motors 43, 45, 47 are capable of moving the slide member 52 and the joint member 54 together.

The first joint member 61 of the stage body 11 and the third joint member 63 of the stage body 21 are successively connected releasably to the joint member 53 provided for the slide member 51. The second joint member 62 of the stage body 11 and the fourth joint member 64 of the stage body 21 are successively connected releasably to the joint member 54 provided for the slide member 52.

That is, the stage body 11 of the first substrate stage 1 and the stage body 21 of the second substrate stage 2 are successively connected releasably to the joint member 53 provided for the slide member 51 via the first joint member 61 and the third joint member 63. The stage body 11 of the first substrate stage 1 and the stage body 21 of the second substrate stage 2 are successively connected releasably to the joint member 54 provided for the slide member 52 via the second joint member 62 and the fourth joint member 64.

In the following description, the joint member 53 to which the stage body 11 of the first substrate stage 1 and the stage body 21 of the second substrate stage 2 are successively connected releasably and the slide member 51 which is fixed to the joint member 53 are appropriately referred to as "first connecting member 71" in combination. Further, the joint member 54 to which the stage body 11 of the first substrate stage 1 and the stage body 21 of the second substrate stage 2 are successively connected releasably and the slide member 52 which is fixed to the joint member 54 are appropriately referred to as "second connecting member 72" in combination.

Therefore, the linear motors 42, 44, 46 are capable of moving the first connecting member 71. The linear motors 43, 45, 47 move the second connecting member 72.

As shown in FIG. 2, the exposure apparatus EX is provided with a first area SP1, a second area SP2, a third area SP3, and a fourth area SP4 which are defined on the base member BP. The first area SP1 includes the position opposite to the first optical element 8 of the projection optical system PL, and is an area defined on at least a part of the exposure station ST1. The second area SP2 is an area different from the first area SP1. The second area SP2 includes the position opposite to the second optical element 9 of the alignment system AL, and is an area defined on at least a part of the measuring station ST2. The first area SP1 and the second area SP2 are defined in the Y axis direction. In this embodiment, the first area SP1 is arranged on the −Y side of the second area SP2. The third area SP3 and the fourth area SP4 are arranged between the first area SP1 and the second area SP2. The third area SP3 and the fourth area SP4 are defined in the X axis direction intersecting the Y axis direction. In this embodiment, the third area SP3 is arranged on the +X side of the fourth area SP4.

The first substrate stage 1 is movable, by the substrate stage-driving system 5, while holding the substrate P in the predetermined area on the base member BP including the first area SP1 and the second area SP2. Similarly, the second substrate stage 2 is movable, by the substrate stage-driving system 5, while holding the substrate P independently from the first substrate stage 1 in the predetermined area on the base member BP including the first area SP1 and the second area SP2.

In this embodiment, when the first substrate stage 1 is moved from the second area SP2 to the first area SP1, the first substrate stage 1 is moved from the second area SP2 to the first area SP1 via at least a part of the third area SP3. When the first substrate stage 1 is moved from the first area SP1 to the second area SP2, the first substrate stage 1 is moved from the first area SP1 to the second area SP2 via at least a part of the third area SP3. When the second substrate stage 2 is moved from the second area SP2 to the first area SP1, the second substrate stage 2 is moved from the second area SP2 to the first area SP1 via at least a part of the fourth area SP4. When the second substrate stage 2 is moved from the first area SP1 to the second area SP2, the second substrate stage 2 is moved from the first area SP1 to the second area SP2 via at least a part of the fourth area SP4.

The controller 7 executes the release of the connection between the first connecting member 71 and the substrate stage 1 (or the second substrate stage 2), the release of the connection between the second connecting member 72 and the second substrate stage 2 (or the first substrate stage 1), the connection between the first connecting member 71 and the second substrate stage 2 (or the first substrate stage 1), and the connection between the second connecting member 72 and the first substrate stage 1 (or the second substrate stage 2) on the base member BP at a predetermined timing. That is, the controller 7 executes the exchange operation for the first connecting member 71 and the second connecting member 72 with respect to the first substrate stage 1 and the second substrate stage 2 at the predetermined timing.

The first connecting member 71 is alternately connected to the first joint member 61 of the stage body 11 and the third joint member 63 of the stage body 21. The second connecting member 72 is alternately connected to the second joint member 62 of the stage body 11 and the fourth joint member 64 of the stage body 21. That is, the first connecting member 71 is alternately connected to the stage body 11 of the first substrate stage 1 and the stage body 21 of the second substrate stage 2 via the first joint member 61 and the third joint member 63; and the second connecting member 72 is alternately connected to the stage body 11 of the first substrate stage 1 and the stage body 21 of the second substrate stage 2 via the second joint member 62 and the fourth joint member 64.

The first connecting member 71 moves one of the connected substrate stages of the first substrate stage 1 and the second substrate stage 2 by the drive of the linear motors 42, 44, 46. The second connecting member 72 moves the other of the connected substrate stages 1, 2 by the drive of the linear motors 43, 45, 47.

In this embodiment, the stage body (11, 21) and the substrate table (12, 22) are relatively movable. However, the stage body and the substrate table may be provided integrally. In this case, the stage body may be movable in the directions of six degrees of freedom.

Next, an explanation will be made with reference to FIGS. 1 and 2 about an example of the measuring system 6 measuring the position information about the first and second substrate stages 1, 2. The first substrate table 12 of the first substrate stage 1 and the second substrate table 22 of the second substrate stage 2 have measuring mirrors 1Rx, 1Ry, 1Rz, 2Rx, 2Ry, 2Rz to each of which the measuring light ML from the measuring system 6 is irradiated to measure the positions of the first substrate table 12 and the second substrate table 22.

The measuring system 6 includes laser interferometers 6Px, 6Py, 6Pz capable of radiating the measuring light ML for the position measurement onto each of the measuring mirrors 1Rx, 1Ry, 1Rz, 2Rx, 2Ry, 2Rz. The measuring system 6 is capable of measuring the position information about the first and second substrate tables 12, 22 by irradiating the measuring light ML for the position measurement onto each of the measuring mirrors 1Rx, 1Ry, 1Rz, 2Rx, 2Ry, 2Rz provided at predetermined positions on the first and second substrate tables 12, 22 respectively. In this embodiment, the measuring system 6 is capable measuring the position information in relation to the directions of six degrees of freedom of the X axis, Y axis, Z axis, θX, θY, and θZ directions of the first and second substrate tables 12, 22 by using the measuring mirrors 1Rx, 1Ry, 1Rz, 2Rx, 2Ry, 2Rz provided at the predetermined positions on the first and second substrate tables 12, 22 respectively.

The measuring mirror 1Rx is arranged at an upper portion of each of the side surfaces of the first substrate table 12 on the +X side and the −X side. The measuring mirror 1Ry is arranged at an upper portion of each of the side surfaces of the first substrate table 12 on the +Y side and the −Y side. The measuring mirror 1Rz is arranged at a lower portion of each of the side surfaces of the first substrate table 12 on the +X side, the −X side, the +Y side, and the −Y side.

The measuring mirror 2Rx is arranged at an upper portion of each of the side surfaces of the second substrate table 22 on the +X side and the −X side. The measuring mirror 2Ry is arranged at an upper portion of each of the side surfaces of the second substrate table 22 on the +Y side and the −Y side. The measuring mirror 2Rz is arranged at a lower portion of each of the side surfaces of the second substrate table 22 on the +X side, the −X side, the +Y side, and the −Y side.

The measuring system 6 has the laser interferometers 6Px, 6Py, 6Pz which measures the position information about the first and second substrate tables 12, 22 by irradiating the measuring light ML onto each of the measuring mirrors 1Rx, 1Ry, 1Rz, 2Rx, 2Ry, 2Rz provided at predetermined positions on the first and second substrate tables 12, 22 of the first and second substrate tables 1, 2 respectively. The laser interferometers 6Px, 6Py, 6Pz are provided on or for each of the exposure station ST1 and the measuring station ST2. The laser interferometers 6Px, 6Py, 6Pz, which are provided for the exposure station ST1, measure the position information about the first substrate table 12 (or the second substrate table 22) present or located in the exposure station ST1. The laser interferometers 6Px, 6Py, 6Pz, which are provided for the measuring station ST2, measure the position information about the second substrate table 22 (or the first substrate table 12) present in the measuring station ST2.

The laser interferometer 6Px is capable of irradiating the measuring light ML, having a measuring axis directed in the X axis direction, onto each of the measuring mirrors 1Rx, 2Rx to measure the positions of the first and second substrate tables 12, 22 in relation to the X axis direction. The laser interferometer 6Py is capable of irradiating the measuring light ML, having a measuring axis directed in the Y axis direction, onto each of the measuring mirrors 1Ry, 2Ry to measure the positions of the first and second substrate tables 12, 22 in relation to the Y axis direction. The laser interferometer 6Pz is capable of irradiating the measuring light ML, having an measuring axis directed in the Z axis direction, onto each of the measuring mirrors 1Rz, 2Rz to measure the positions of the first and second substrate tables 12, 22 in relation to the Z axis direction.

The measuring mirrors 1Rz, 2Rz have inclined surfaces 1Sz, 2Sz onto each of which the measuring light ML for the position measurement from the laser interferometers 6Pz is irradiated. The inclined surfaces 1Sz, 2Sz are inclined with respect to the XY plane as described above. However, the inclined surfaces 1Sz, 2Sz are also inclined with respect to the measuring lights ML irradiated from the laser interferometers 6Pz. The inclined surfaces 1Sz, 2Sz of the measuring mirrors 1Rz, 2Rz function as the reflecting surfaces for reflecting the irradiated measuring lights ML. In the following description, the inclined surfaces of the measuring mirrors 1Rz, 2Rz, which are capable of reflecting the irradiated measuring lights ML, are appropriately referred to as "reflecting surfaces".

The measuring mirrors 1Rz, 2Rz are arranged on the side surfaces of the first substrate stage 1 and the second substrate stage 2 respectively so that the reflecting surfaces (inclined surfaces) 1Sz, 2Sz are directed upwardly. The reflecting surfaces 1Sz, 2Sz of the measuring mirrors 1Rz, 2Rz are inclined by a predetermined angle (for example, 45 degrees) with respect to the XY plane so that the reflecting surfaces 1Sz, 2Sz are directed upwardly. The measuring lights ML, which are emitted from the laser interferometers 6Pz and which are irradiated onto the measuring mirrors 1Rz, 2Rz respectively, are reflected by the reflecting surfaces 1Sz, 2Sz of the measuring mirrors 1Rz, 2Rz respectively; and the measuring lights ML are irradiated onto measuring mirrors 1K, 2K provided on predetermined support frames 19. The measuring lights ML, which are irradiated onto the measuring mirrors 1K, 2K and which are reflected by the measuring mirrors 1K, 2K respectively, are received by the laser interferometers 6Pz via the reflecting surfaces 1Sz, 2Sz of the measuring mirrors 1Rz, 2Rz of the first and second substrate tables 12, 22 respectively. The laser interferometers 6Pz are capable of measuring the position information about the first and second substrate tables 12, 22 in the Z axis direction by using the received measuring lights ML. The technique, which relates to the laser interferometer capable of measuring the position information about the first and second substrate tables 12, 22 in the Z axis direction (Z interferometer), is disclosed, for example, in Japanese Patent Application Laid-open No. 2000-323404 (corresponding to U.S. Pat. No. 7,206,058) and Published Japanese Translation of PCT International Publication for Patent Application No. 2001-513267 (corresponding to U.S. Pat. No. 6,208,407).

By providing at least one of the laser interferometer 6Px and the laser interferometer 6Py as a plurality of laser interferometers 6Px (6Py) and by irradiating at least one of the measuring light ML having the measuring axis directed in the X axis direction and the measuring light ML having the measuring axis directed in the Y axis direction as a plurality of the measuring lights ML each having the measuring axis directed in the X axis (Y axis) direction, the measuring system 6 is capable of measuring the position information about the first and second substrate tables 12, 22 in the θZ direction by using the plurality of measuring lights ML. By providing the laser interferometer 6Pz as a plurality of interferometers 6Pz and by irradiating the measuring light ML having the measuring axis directed in the Z direction as a plurality of measuring lights ML having the measuring axis in the Z direction, the measuring system 6 is capable of measuring the position information about the first and second substrate tables 12, 22 in the θX and θY directions by using the plurality of measuring lights ML.

In the following description, the laser interferometers 6Px, 6Py, 6Pz are appropriately referred to as "X interferometer 6Px", "Y interferometer 6Py", and "Z interferometer 6Pz" respectively.

The measuring system 6 has the alignment system AL which includes the second optical element 9. The alignment system AL is arranged in the measuring station ST2. The alignment system AL is capable of detecting the alignment mark of the substrate P and the reference marks arranged on the opposing surfaces 15, 25 of the first and second substrate tables 12, 22.

The measuring system 6 has the focus/leveling-detecting system FL. The focus/leveling-detecting system FL is arranged in the measuring station ST2, and detects the surface position information about the surfaces of the substrate P held by the first and second substrate tables 12, 22 (position information in relation to the Z axis, θX, and θY directions). The focus/leveling-detecting system FL alternately detects, in the measuring station ST2, the surface position information about the surface of the substrate P held by the first substrate table 12 and the surface position information about the surface of the substrate P held by the second substrate table 22.

The controller 7 drives the substrate stage-driving system 5 based on the measurement result of the measuring system 6 to control the positions of the first and second substrate tables 12, 22 to thereby control the positions of the substrates P held by the substrate holders 13, 23 of the first and second substrate tables 12, 22.

In the exposure station ST1, the substrate P is exposed via the projection optical system PL and the liquid LQ. In the measuring station ST2, the measurement in relation to the exposure and the exchange of the substrate P are performed. Each of the first substrate stage 1 and the second substrate stage 2 is movable between the first area SP1 of the exposure station ST1 and the second area SP2 of the measuring station ST2 while holding the substrate P.

Figure 3:
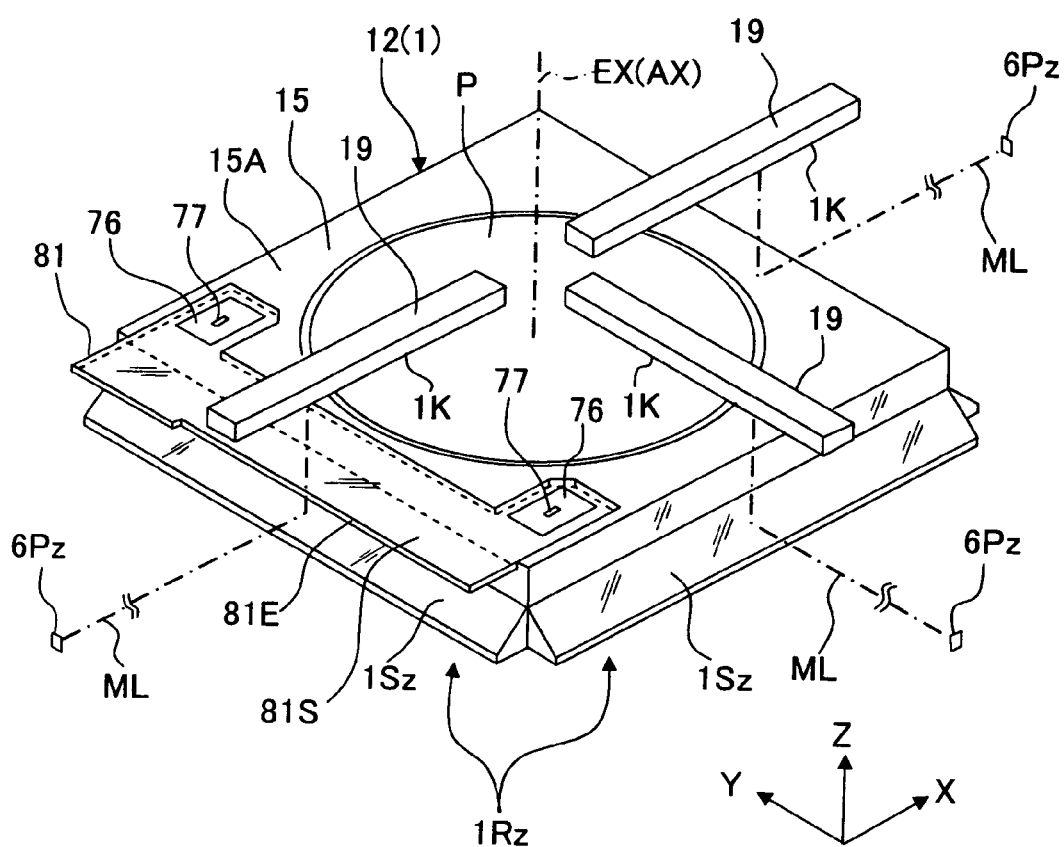
FIG. 3 is a perspective view illustrating the vicinity of a first substrate table according to the first embodiment.
Figure 4:
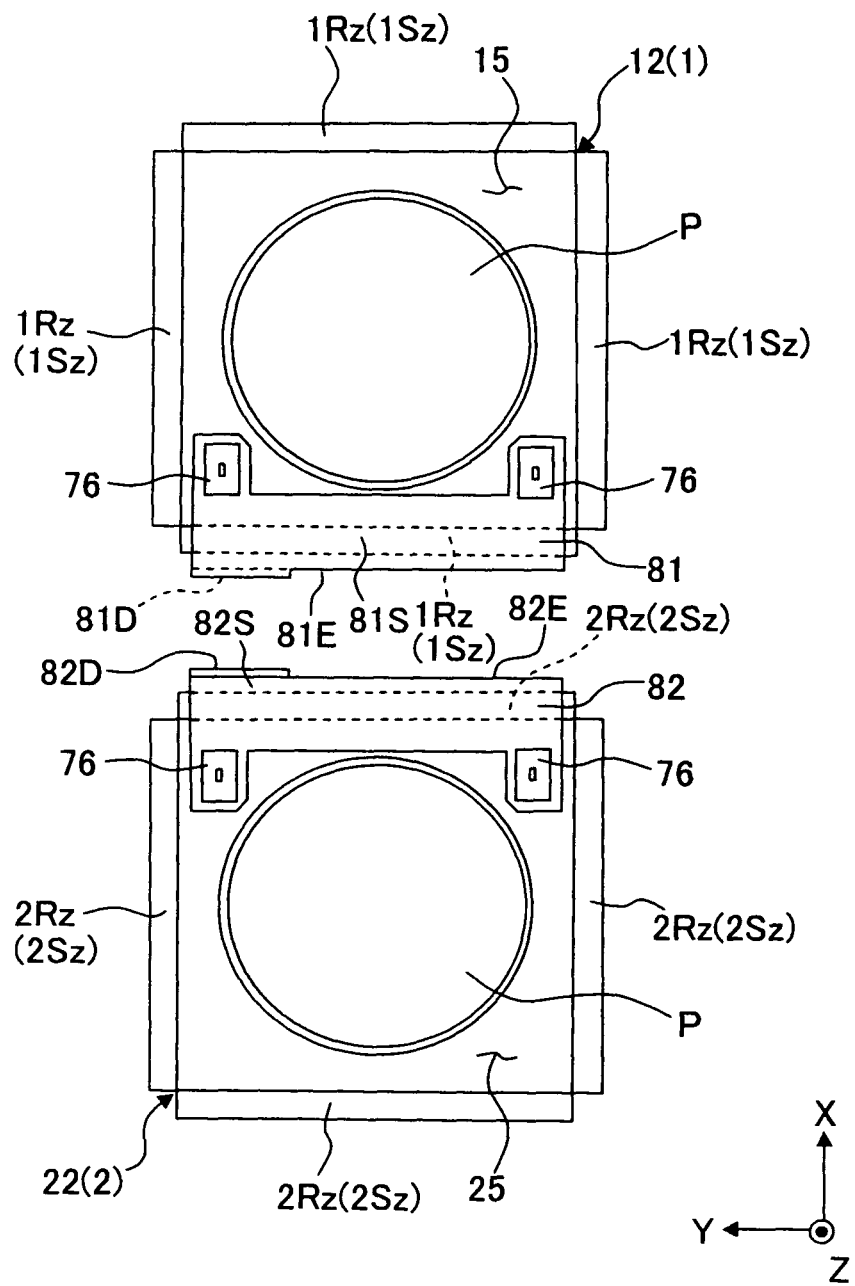
FIG. 4 is a plan view of the first and second substrate tables according to the first embodiment.
Figure 5:
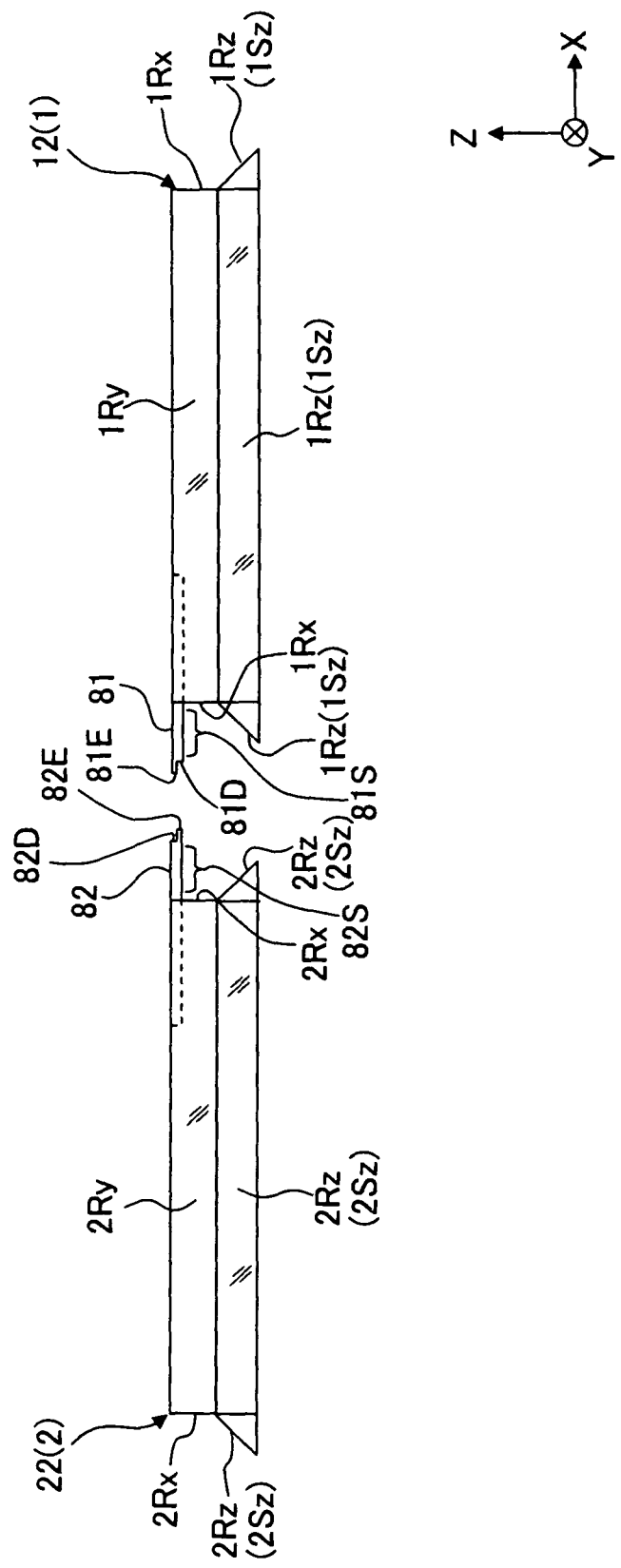
FIG. 5 is a side view of the first and second substrate tables according to the first embodiment.
Figure 6:
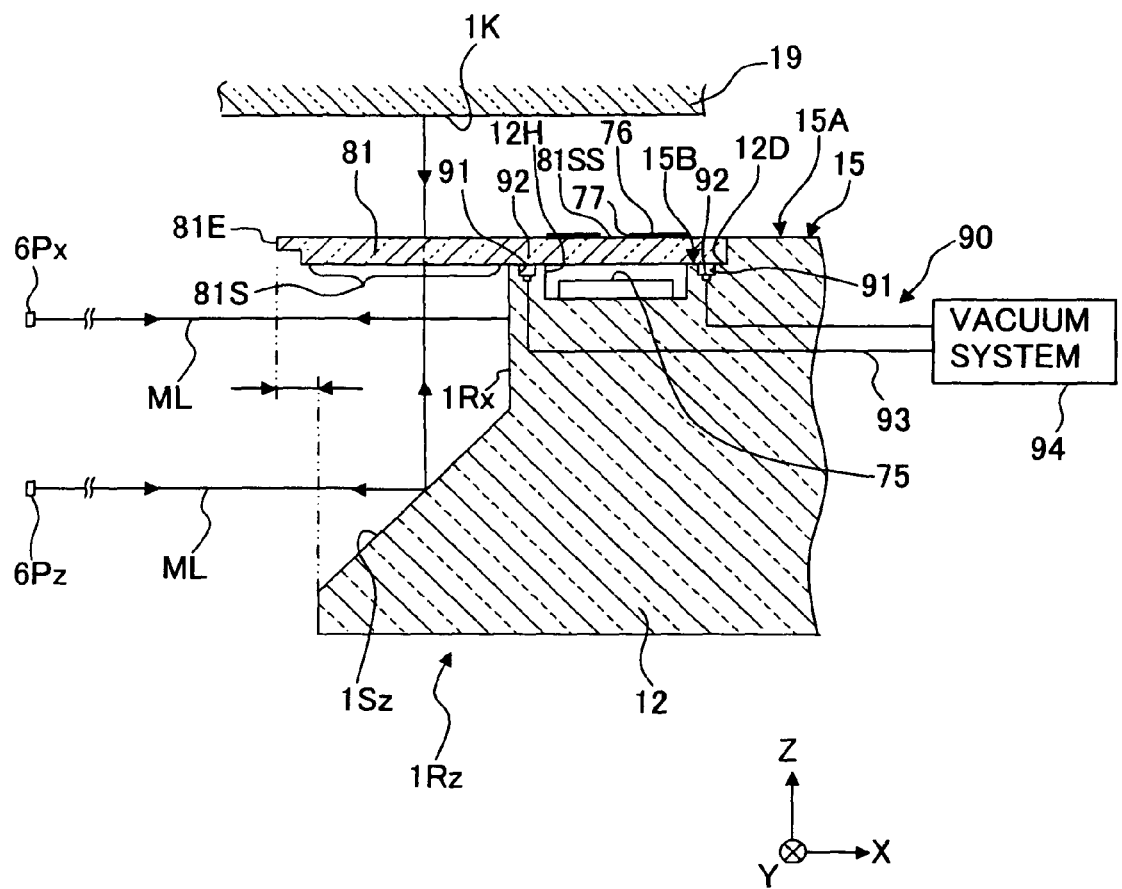
FIG. 6 is a side sectional view illustrating the vicinity of a transmitting member provided on the first substrate table.

Next, the transmitting members 81, 82 will be explained with reference to FIGS. 2 to 6. FIG. 3 is a perspective view illustrating the vicinity of the first substrate table 12 on which the transmitting member 81 is provided. FIG. 4 is a plan view of the first and second substrate tables 12, 22 on which the transmitting members 81, 82 are provided; and FIG. 5 is a side view thereof. FIG. 6 is a side sectional view illustrating the vicinity of the transmitting member 81 provided for the first substrate table 12. In the following description with reference to FIGS. 2 to 6, although the transmitting member 81 provided for the first substrate table 12 is mainly explained, a similar explanation is applied also to the transmitting member 82 provided for the second substrate table 22.

The transmitting member 81 has a protruding portion 81S which protrudes from (the side surface of) the first substrate table 12 more outwardly than the measuring mirror 1Rz. The protruding portion 81S has an end surface 81E. The end surface 81E also protrudes from the first substrate table 12 more outwardly than the measuring mirror 1Rz. The protruding portion 81S defines a transmitting area 81S through which the measuring light ML is transmissive. In this embodiment, the transmitting member 81 is formed, for example, of a glass material such as silica glass through which the measuring light ML is transmissive. The measuring mirror 1Rz is arranged on the side surface of the first substrate table 12 so that the measuring mirror 1Rz protrudes outwardly (in the −X direction as shown in the drawing) from the side surface of the first substrate table 12. The end surface 81E of the transmitting member 81 is arranged on the first substrate table 12 so that the end surface 81E protrudes outwardly (in the –X direction as shown in the drawing) in the XY plane more than the measuring mirror 1Rz.

Each of the measuring mirrors 1Rz is arranged on the side surface of the first substrate table 12 so that the reflecting surface 1Sz is directed upwardly (in the +Z direction). The reflecting surface 1Sz of the measuring mirror 1Rz is inclined with respect to the XY plane by a predetermined angle (for example, 45 degrees).

The transmitting member 81 is a plate-shaped member (glass member) having upper and lower surfaces. The transmitting member 81 is arranged on the first substrate table 12 so that the upper surface of the transmitting member 81 is substantially flush with a partial area 15A of the opposing surface 15 of the first substrate table 12 (positions in the Z axis direction thereof are approximately equal to each other). The transmitting area 81S of the transmitting member 81 is a plane-parallel. The upper and lower surfaces of the transmitting area 81S of the transmitting member 81 held by the first substrate table 12 are substantially parallel to the XY plane.

The transmitting member 81 is arranged at a position above or over the measuring mirror 1Rz so that at least a part of the lower surface of the transmitting member 81 is opposite to or facing the reflecting surface 1Sz of the measuring mirror 1Rz. The transmitting member 81 is connected to a part of the opposing surface of the first substrate table 12 so that the transmitting area 81S is opposite to the reflecting surface 1Sz of the measuring mirror 1Rz at the position above or over the measuring mirror 1Rz.

The measuring mirror 1Rz and the transmitting member 81 are arranged in a predetermined positional relationship on the first substrate table 12 so that the measuring light ML via one of the reflecting surface 1Sz of the measuring mirror 1Rz and the transmitting area 81S of the transmitting member 81 comes into the other of the reflecting surface 1Sz and the transmitting area 81S.

That is, as shown in FIG. 6, the measuring light ML, which is emitted or radiated from the Z interferometer 6Pz and which is irradiated onto the measuring mirror 1Rz, is reflected by the reflecting surface 1Sz of the measuring mirror 1Rz, and then comes into the transmitting area 81S of the transmitting member 81 arranged at the position above the measuring mirror 1Rz. The measuring light ML, which comes into the transmitting area 81S of the transmitting member 81, is transmitted through the transmitting area 81S, and then is irradiated onto a measuring mirror 1K provided on a predetermined support frame 19. The measuring light ML, which is irradiated onto the measuring mirror 1K and which is reflected by the measuring mirror 1K, comes into the transmitting area 81S of the transmitting member 81. Afterwards, the measuring light ML is transmitted through the transmitting area 81S, and then exits from the transmitting area 81S. Then, the measuring light ML, which exits from the transmitting area 81S of the transmitting member 81, comes into the reflecting surface 1Sz of the measuring mirror 1Rz. The measuring light ML, which comes into the reflecting surface 1Sz of the measuring mirror 1Rz, is reflected by the reflecting surface 1Sz, and then comes into the Z interferometer 6Pz. The Z interferometer 6Pz receives the measuring light ML from the reflecting surface 1Sz of the measuring mirror 1Rz.

As shown in FIG. 6, the area 15A which is substantially flush with the surface of the substrate P held by the substrate holder 13 and an area 15B which is located at a position lower than the area 15A are formed on the opposing surface 15 of the first substrate table 12 opposable to the first optical element 8. The area 15B is formed to be continued to the side surface of the first substrate table 12. A step 12D is formed between the area 15A and the area 15B.

The exposure apparatus EX is provided with a holding mechanism 90 which is provided on or for the first substrate table 12 and which detachably holds at least a part of the transmitting member 81. At least a part of the holding mechanism 90 is formed in the area 15B of the opposing surface 15. The lower surface of the transmitting member 81 and the area 15B of the opposing surface 15 are capable of making contact with each other.

The transmitting member 81 is arranged so that a part of the lower surface of the transmitting member 81 is opposite to the area 15B of the opposing surface 15 of the first substrate table 12. The holding mechanism 90 includes a groove 91 which is formed in the area 15B of the opposing surface 15 and which is provided to form a space with respect to the lower surface of the transmitting member 81 arranged to make contact with the area 15B; a suction port 92 which is formed inside the groove 91; and a vacuum system 94 which is connected to the suction port 92 via a flow passage 93. The vacuum system 94 is capable of sucking, via the suction port 92, a gas present in the space formed between the groove 91 and the lower surface of the transmitting member 81. The operation of the vacuum system 94 is controlled by the controller 7. The vacuum system 94 of the holding mechanism 90 is driven to suck the gas in the space via the suction port 92 in a state that the lower surface of the transmitting member 81 makes contact with the area 15B of the opposing surface 15 of the first substrate table 12 and that the space is formed between the groove 91 and the lower surface of the transmitting member 81. By doing so, the controller 7 can attract and hold the lower surface of the transmitting member 81 in the area 15B of the opposing surface 15 of the first substrate table 12. The controller 7 can release the attraction and holding of the transmitting member 81, by stopping the driving of the vacuum system 94 of the holding mechanism 90. That is, the holding mechanism 90 of this embodiment includes the so-called vacuum chuck mechanism.

The upper surface of the transmitting member 81 held by the holding mechanism 90 is substantially flush with the area 15A of the opposing surface 15 of the first substrate table 12. That is, the area 15A of the opposing surface 15 of the first substrate table 12 is substantially flush with the upper surface of the transmitting member 81 held by the holding mechanism 90 and with the surface of the substrate P held by the substrate holder 13.

In the following description, the area 15A, of the opposing surface 15, which is substantially flush with the surface of the substrate P and the upper surface of the transmitting member 81 is appropriately referred to as "top surface 15A". The area 15B, of the opposing surface 15, which is capable of holding the lower surface of the transmitting member 81, is appropriately referred to as "holding surface 15B".

The end surface 81E of the transmitting member 81 held by the holding mechanism 90 protrudes outwardly more than the measuring mirror 1Rz.

The exposure apparatus EX is provided with an optical sensor 75 which is provided on or for the first substrate table 12 and into which the light beam comes via the transmitting member 81. The optical sensor 75 is arranged in a recess 12H formed at the inside of the holding surface 15B. The transmitting member 81 is arranged so that at least a part of the lower surface of the transmitting member 81 is opposite to the holding surface 15B of the first substrate table 12. Light beam (light) via the transmitting member 81 can come into the optical sensor 75 arranged in the recess 12H.

In this embodiment, the transmitting member 81 has a light-shielding film 76 which is formed, for example, with chromium or the like in a partial area of the upper surface of the transmitting member 81; and a slit-shaped aperture 77 which is formed on a part of the light-shielding film 76. The transmitting member 81 is exposed at the aperture 77. The light beam is transmissive through the aperture 77. An area of the transmitting member 81, which is opposite to the aperture 77, is appropriately referred to as "second transmitting area 81SS (82SS)" in relation to the transmitting area (first transmitting area) 81S (82S) described above.

The size of the light-shielding film 76, in the XY plane, substantially parallel to the top surface 15A of the first substrate table 12 is greater than that of the recess 12H. Only the light passing through the aperture 77 comes into the optical sensor 75 in a state that the transmitting member 81 is held by the holding mechanism 90. That is, the optical sensor 75 receives only the light passing through the aperture 77 of the transmitting member 81 in the state that the transmitting member 81 is held by the holding mechanism 90.

In this embodiment, the optical sensor 75 is an optical sensor which constitutes at least a part of a spatial image-measuring system as disclosed, for example, in Japanese Patent Application Laid-open No. 2002-14005 (corresponding to United States Patent Application Publication No. 2002/0041377) and Japanese Patent Application Laid-open No. 2002-198303 (corresponding to United States Patent Application Publication No. 2002/0041377).

The optical sensor 75 may be an optical sensor which is capable of measuring the intensity (transmittance) of the exposure light EL as disclosed, for example, in International Publication Nos. 2005/074014 (corresponding to United States Patent Application Publication No. 2007/0127006) and 2006/013806 (corresponding to European Patent Application Publication No. 1791164). Various detectors or measuring devices including, for example, an uneven illuminance measuring device, an illuminance meter, and a wave aberration measuring device may be arranged in the recess 12H formed in the top surface 15A of the first substrate table 12, instead of or together with the optical sensor 75. The light is allowed to come into the detector or the measuring device after being transmitted through the aperture of each of various patterns provided on or for the transmitting member 81.

Those usable as the detector or the measuring device include, for example, an uneven illuminance sensor disclosed, for example, in Japanese Patent Application Laid-open No. 57-117238 (corresponding to U.S. Pat. No. 4,465, 368), a spatial image measuring device measuring the light intensity of a spatial image (projected image) of a pattern projected by the projection optical system PL disclosed, for example, in Japanese Patent Application Laid-open No. 2002-14005 (corresponding to United States Patent Application Publication No. 2002/0041377), an illuminance monitor disclosed, for example, in Japanese Patent Application Laid-open No. 11-16816 (corresponding to United States Patent Application Publication No. 2002/0061469), and a wave aberration measuring device disclosed, for example, in International Publication No. 99/60361 (corresponding to European Patent No. 1,079,223).

The transmitting member 81 provided for the first substrate table 12 has been mainly explained above. In this embodiment, a holding mechanism 90, which is the same as or equivalent to the holding mechanism 90 provided for the first substrate table 12, is provided also for the second substrate table 22. A transmitting member 82, which is the same as or equivalent to the transmitting member 81, is detachably held by the holding mechanism 90. An end surface 82E of the transmitting member 82 held by the holding mechanism 90 of the second substrate table 22 protrudes outwardly more than the measuring mirror 2Rz. The measuring mirror 2Rz and the transmitting member 82 are arranged in a predetermined positional relationship on the second substrate table 22 so that the measuring light ML via one of the reflecting surface 2Sz of the measuring mirror 2Rz and the transmitting area 82S of the transmitting member 82 comes into the other of the reflecting surface 2Sz and the transmitting area 82S. The second substrate table 22 is provided with an optical sensor 75. A light beam (light), which is transmitted through an aperture 77 of a light-shielding film 76 formed on the transmitting member 82, comes into the optical sensor 75.

In this embodiment, one piece of the transmitting member 81 is arranged in the vicinity of the edge on the −X side of the opposing surface 15 of the first substrate table 12 so that the transmitting member 81 is opposite to the reflecting surface 1Sz of the measuring mirror 1Rz arranged on the side surface on the −X side of the first substrate table 12. Further, one piece of the transmitting member 82 is arranged in the vicinity of the edge on the +X side of the opposing surface 25 of the second substrate table 22 so that the transmitting member 82 is opposite to the reflecting surface 2Sz of the measuring mirror 2Rz arranged on the side surface on the +X side of the second substrate table 22.

The end surface 81E of the transmitting member 81 is substantially linear. The transmitting member 81 is held by the holding mechanism 90 of the first substrate table 12 so that the end surface 81E is substantially parallel to the Y axis. Similarly, the end surface 82E of the transmitting member 82 is substantially linear. The transmitting member 82 is held by the holding mechanism 90 of the second substrate table 22 so that the end surface 82E is substantially parallel to the Y axis.

In this embodiment, as described later on, the controller 7 uses the substrate stage-driving system 5 to synchronously move the first substrate stage 1 and the second substrate stage 2 in the X axis direction in a state that the end surface 81E on the −X side of the transmitting member 81 of the first substrate table 12 and at least a part of the end surface 82E on the +X side of the transmitting member 82 of the second substrate table 22 are close to each other or make contact with each other. In this embodiment, a step 81D is formed at a part of the end surface 81E on the −X side of the transmitting member 81 of the first substrate table 12. A step 82D, which is adapted to (meshed or engaged with) the step 81D of the transmitting member 81 of the first substrate table 12, is formed at a part of the end surface 82E on the +X side of the transmitting member 82 of the second substrate table 22.

Next, an explanation will be made with reference to FIGS. 7 to 12 and 24 about an example of the exposure method and the operation of the exposure apparatus constructed as described above.

In this embodiment, when one of the first substrate stage 1 and the second substrate stage 2 is arranged in the first area SP1 of the exposure station ST1, the other of the first substrate stage 1 and the second substrate stage 2 executes the predetermined process in the second area SP2 of the measuring station ST2.

For example, the exposure apparatus EX performs an operation in which one of the first substrate stage 1 and the second substrate stage 2 is arranged at a position, in the exposure station ST1, at which the exposure light EL from the first optical element 8 is irradiated to expose the substrate P held by the one substrate stage, concurrently with at least a part of an operation in which the other of the first substrate stage 1 and the second substrate stage 2 is arranged at a position, in the measuring station ST2, at which the other of the first substrate stage 1 and the second substrate stage 2 is opposite to the second optical element 9 to measure the substrate P held by the other of the first substrate stage 1 and the second substrate stage 2. Further, the exposure apparatus EX performs the substrate exchange operation such that the other of the first substrate stage 1 and the second substrate stage 2 is arranged in the second area SP2 of the measuring station ST2 in a state that the one of the first substrate stage 1 and the second substrate stage 2 is arranged in the first area SP1 of the exposure station ST1, wherein the exposure apparatus EX uses the transport system H to unload the substrate P, for which the exposure process has been performed from the other of the first substrate stage 1 and the second substrate stage 2, and to load another substrate P, which is to be subjected to the exposure process, onto the other of the first substrate stage 1 and the second substrate stage 2.

In this embodiment, the first substrate stage 1 and the second substrate stage 2 are successively arranged in the first area SP1 of the exposure station ST1 to successively execute the operation in which the exposure light EL is irradiated onto the substrate P held by the first substrate stage 1 arranged in the first area SP1 and the operation in which the exposure light EL is irradiated onto the substrate P held by the second substrate stage 2 arranged in the first area SP1.

Figure 7:
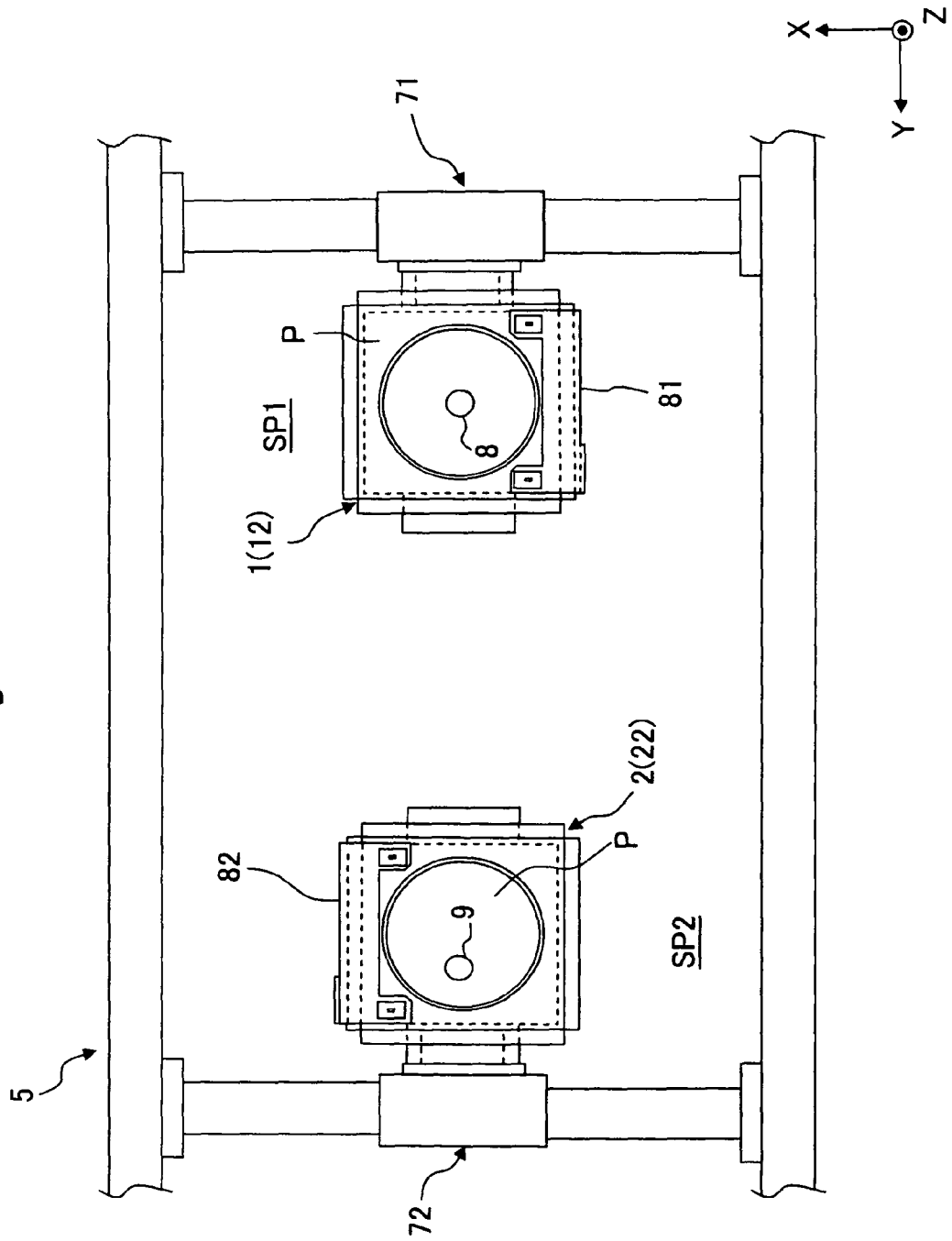
FIG. 7 schematically illustrates an exposure method according to the first embodiment.

As shown in FIG. 7, the controller 7 arranges the second substrate stage 2 at the substrate exchange position in the measuring station ST2; and the controller 7 uses the transport system H to load the substrate P, which is to be subjected to the exposure process, on the second substrate stage 2. The controller 7 starts, for example, the predetermined measurement process in relation to the substrate P held by the second substrate stage 2 in the measuring station ST2 (SM1).

On the other hand, the first substrate stage 1, holding the substrate P, for which the measurement process has been already completed in the measuring station ST2, is arranged in the first area SP1 of the exposure station ST1. The controller 7 starts the exposure of the substrate P held by the first substrate stage 1 in the exposure station ST1 (SE1).

The controller 7 executes the liquid immersion exposure of the substrate P held by the first substrate stage 1 in the exposure station ST1. The controller 7 exposes the substrate P in a state that the substrate P held by the first substrate stage 1 is opposite to the first optical element 8 of the projection optical system PL and that the optical path space for the exposure light EL on the light-exit side of the first optical element 8 is filled with the liquid LQ. A plurality of shot areas are defined on the substrate P. The controller 7 successively exposes, via the projection optical system PL and the liquid LQ, each of the plurality of shot areas on the substrate P held by the first substrate stage 1, while using the substrate stage-driving system 5 to move the first substrate stage 1 in the first area SP1.

The measurement process and/or the like is executed for the substrate P held by the second substrate stage 2 in the measuring station ST2 during the period in which the exposure process is executed for the substrate P held by the first substrate stage 1 in the exposure station ST1. For example, the controller 7 measures the position information about the substrate P held by the second substrate stage 2 arranged in the measuring station ST2. The position information about the substrate P herein includes at least one of the alignment information of the substrate P with respect to a predetermined reference position (position information in relation to the X, Y, and θZ directions of the plurality of shot areas on the substrate P) and the surface position information about the substrate P with respect to a predetermined reference surface (position information in relation to the Z, θX, and θY directions).

That is, the controller 7 executes the above-described detecting operation using the alignment system AL and the detecting operation using the focus/leveling-detecting system FL. For example, in the detecting operation using the focus/leveling-detecting system FL, the controller 7 uses the focus/leveling-detecting system FL to detect the surface position information about the predetermined reference surface and the surface of the substrate P, while measuring, in the measuring station ST2, the position information about the position in the Z axis direction of the second substrate stage 2 with the Z interferometer 6Pz. The controller 7 determines the approximate plane (approximate surface) of the surface of the substrate P (respective shot areas) based on the reference surface in the coordinate system defined by the measuring system 6 including the Z interferometer 6Pz.

In the second substrate stage 2, the measuring mirrors 2Rz are arranged on the four side surfaces of the second substrate stage 2 respectively. Upon executing the measurement process for the substrate P on the second substrate stage 2 in the measuring station ST2, the measuring system 6 makes the measuring lights ML from the Z interferometers 6Pz to be irradiated onto at least three, among the four measuring mirrors 2Rz, which are arranged on three side surfaces among the four side surfaces respectively, to measure the position information in the Z axis direction of the second substrate stage 2. In this embodiment, in the measuring station ST2, three Z interferometers 6Pz are arranged on the +X side, the −X side, and the +Y side with respect to the second optical element 9. The measuring lights ML are irradiated from the Z interferometers 6Pz onto the measuring mirrors 2Rz of the second substrate stage 2. At least a part of the measuring light ML irradiated from the Z interferometer 6Pz is transmitted through the transmitting member 82 of the second substrate stage 2.

In the detecting operation using the alignment system AL, in the measuring station ST2, the controller 7 uses the alignment system AL to detect the alignment mark provided on the substrate P corresponding to the shot areas on the substrate P respectively and detects the reference mark formed on a part of the second substrate stage 2, while measuring the position information in the X axis direction and the Y axis direction of the second substrate stage 2 which holds the substrate P with the X interferometer 6Px and the Y interferometer 6Py. With this, the positional information of the alignment mark (and consequently of the shot areas) and of the reference mark. Note that a short area, among the shot areas, for which the detection of the alignment mark is performed by the alignment system AL, may be all the shot areas on the substrate P. However, in this embodiment, such shot area or areas is/are only a part of the shot areas. Then, based on the position information measured for the shot areas, the controller 7 determines the position information about the position of each of the plurality of shot areas on the substrate P with respect to the predetermined reference position by the calculation process.

After the exposure process is completed for the substrate P held by the first substrate stage 1 in the exposure station ST1, and after the measurement process is completed for the substrate P held by the second substrate stage 2 in the measuring station ST2, then the controller 7 starts the movement of the second substrate stage 2 from the second area SP2 of the measuring station ST2 to the first area SP1 of the exposure station ST1. Note that the movement of the second substrate stage 2 may be started before the exposure process for the substrate P in the exposure station ST1 is completed.

Figure 8:
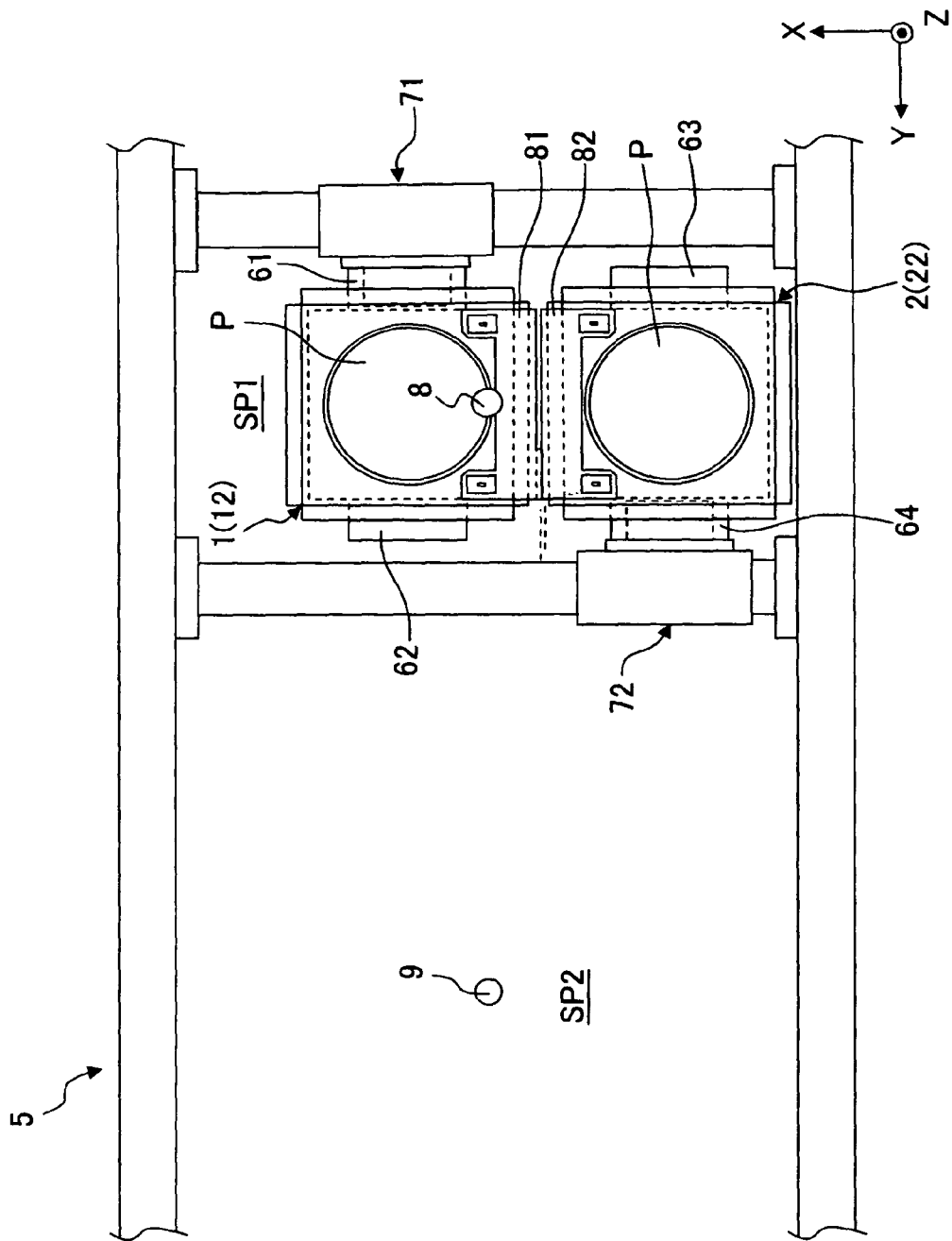
FIG. 8 schematically illustrates the exposure method according to the first embodiment.

In this embodiment, the controller 7 arranges the first substrate stage 1 at the position opposite to the first optical element 8 also when the controller 7 moves the second substrate stage 2 from the second area SP2 to the first area SP1. By doing so, the liquid LQ of the liquid immersion space LS is continuously retained between the first optical element 8 and the first substrate stage 1 (substrate P) even during the execution of the operation in which the second substrate stage 2 is moved from the second area SP2 to the first area SP1. In accordance with the operation as described above, as shown in FIG. 8, both of the first substrate stage 1 and the second substrate stage 2 are arranged in the first area SP1 of the exposure station ST1. At the point of time when the exposure process is completed for the substrate P held by the first substrate stage 1, the first substrate stage 1 is moved, while retaining the liquid LQ between the first substrate stage 1 and the first optical element, to a predetermined position in the first area SP, as shown in FIG. 8, at which the exchange operation for the connecting members is to be performed.

Subsequently, the controller 7 executes the exchange operation for the first connecting member 71 and the second connecting member 72 with respect to the first substrate stage 1 and the second substrate stage 2, while maintaining the state that the first substrate stage 1 and the first optical element 8 are opposite to each other. That is, the controller 7 releases the connection between the first connecting member 71 and the first joint member 61 of the first substrate stage 1 to release the first substrate stage 1 from the first connecting member 71. Further, the controller 7 releases the connection between the second connecting member 72 and the fourth joint member 64 of the second substrate stage 2 to release the second substrate stage 2 from the second connecting member 72.

Figure 9:
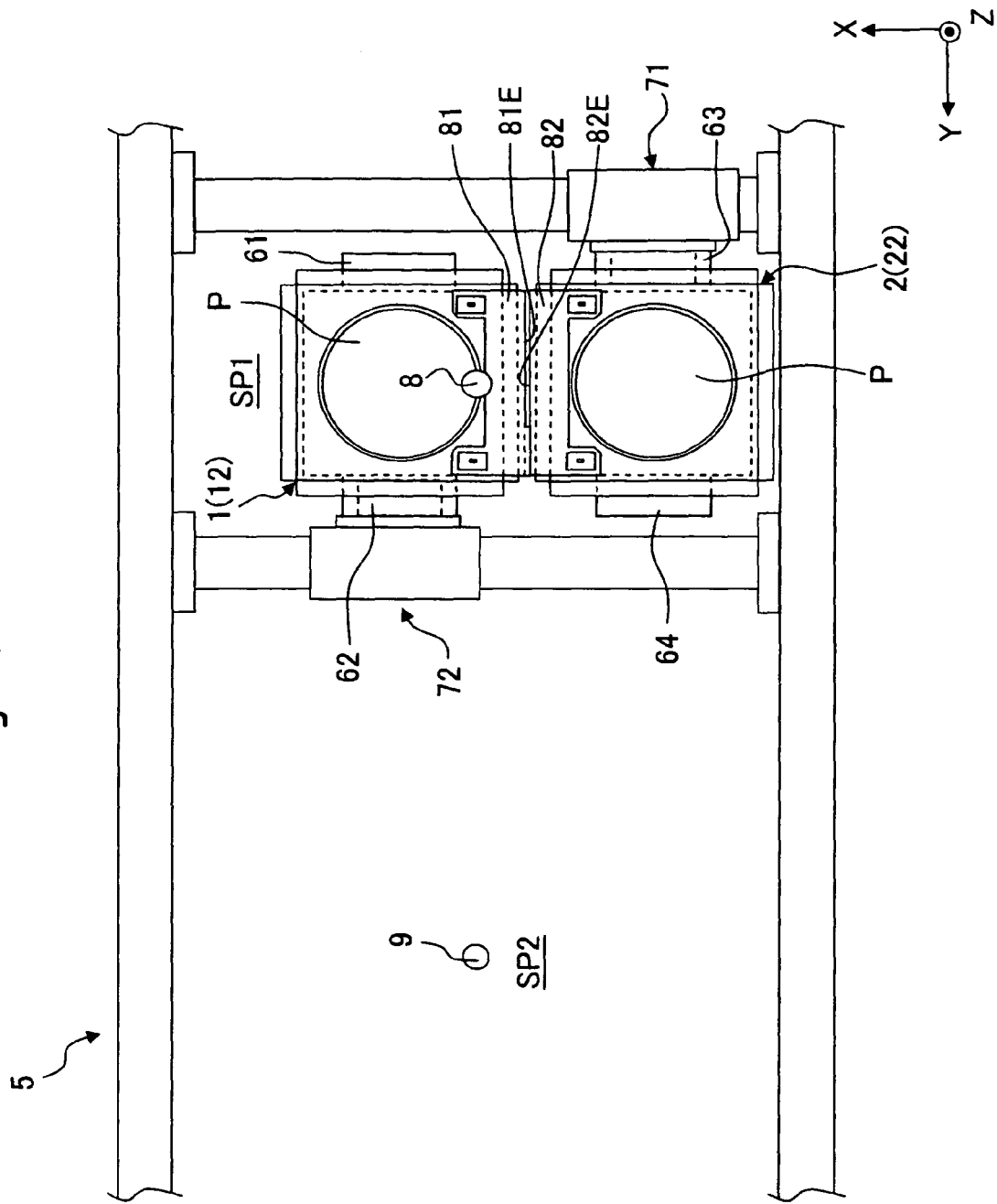
FIG. 9 schematically illustrates the exposure method according to the first embodiment.

After that, as shown in FIG. 9, the controller 7 moves the first connecting member 71 in the −X direction to connect the first joint member 71 to the third joint member 63 of the second substrate stage 2, and the controller 7 moves the second connecting member 72 in the +X direction to connect the second connecting member 72 to the second joint member 62 of the first substrate stage 1.

In the exchange operation as described above, the first connecting member 71, which has been connected to the first substrate stage 1, is connected to the second substrate stage 2, and the second connecting member 72, which has been connected to the second substrate stage 2, is connected to the first substrate stage 1.

Subsequently, in order to perform the liquid immersion exposure of the substrate P on the second substrate stage 2, the controller 7 uses the substrate stage-driving system 5 to change the state that the first optical element 8 is opposite to at least one of the first substrate stage 1 and the transmitting member 81 (namely, state that the liquid LQ is retained between the first optical element 8 and at least one of the first substrate stage 1 and the transmitting member 81) to the state that the first optical element 8 is opposite to at least one of the second substrate stage 2 and the transmitting member 82 (namely, state that the liquid LQ is retained between the first optical element 8 and at least one of the second substrate stage 2 and the transmitting member 82).

In this embodiment, the substrate stage-driving system 5 synchronously moves the first substrate stage 1 and the second substrate stage 2 in a state that the end surface 81E of the transmitting member 81 of the first substrate stage 1 and the end surface 82E of the transmitting member 82 of the second substrate stage 2 are close to each other or make contact with each other in the first area SP1 of the guide surface GF including the position at which the exposure light EL from the first optical element 8 is irradiated, as disclosed, for example, in International Publication No. 2005/074014 (corresponding to United States Patent Application Publication No. 2007/0127006). The sentence "the end surface 81E of the transmitting member 81 of the first substrate stage 1 and the end surface 82E of the transmitting member 82 of the second substrate stage 2 are close to each other" means that the liquid LQ does not leak from any space or gap between the end surface 81E of the transmitting member 81 of the first substrate stage 1 and the end surface 82E of the transmitting member 82 of the second substrate stage 2, or that the liquid LQ leaks in a small amount of such an extent that the operation of the exposure apparatus is not affected thereby.

The substrate stage-driving system 5 allows the end surface 81E of the transmitting member 81 of the first substrate stage 1 and the end surface 82E of the transmitting member 82 of the second substrate stage 2 to be close to each other or make contact with each other so that at least one of the transmitting member 81, the transmitting member 82, the first substrate stage 1, and the second substrate stage 2 forms a space capable of retaining the liquid LQ with respect to the first optical element 8 when the first substrate stage 1 and the second substrate stage 2 are synchronously moved (SE2).

Figure 10:
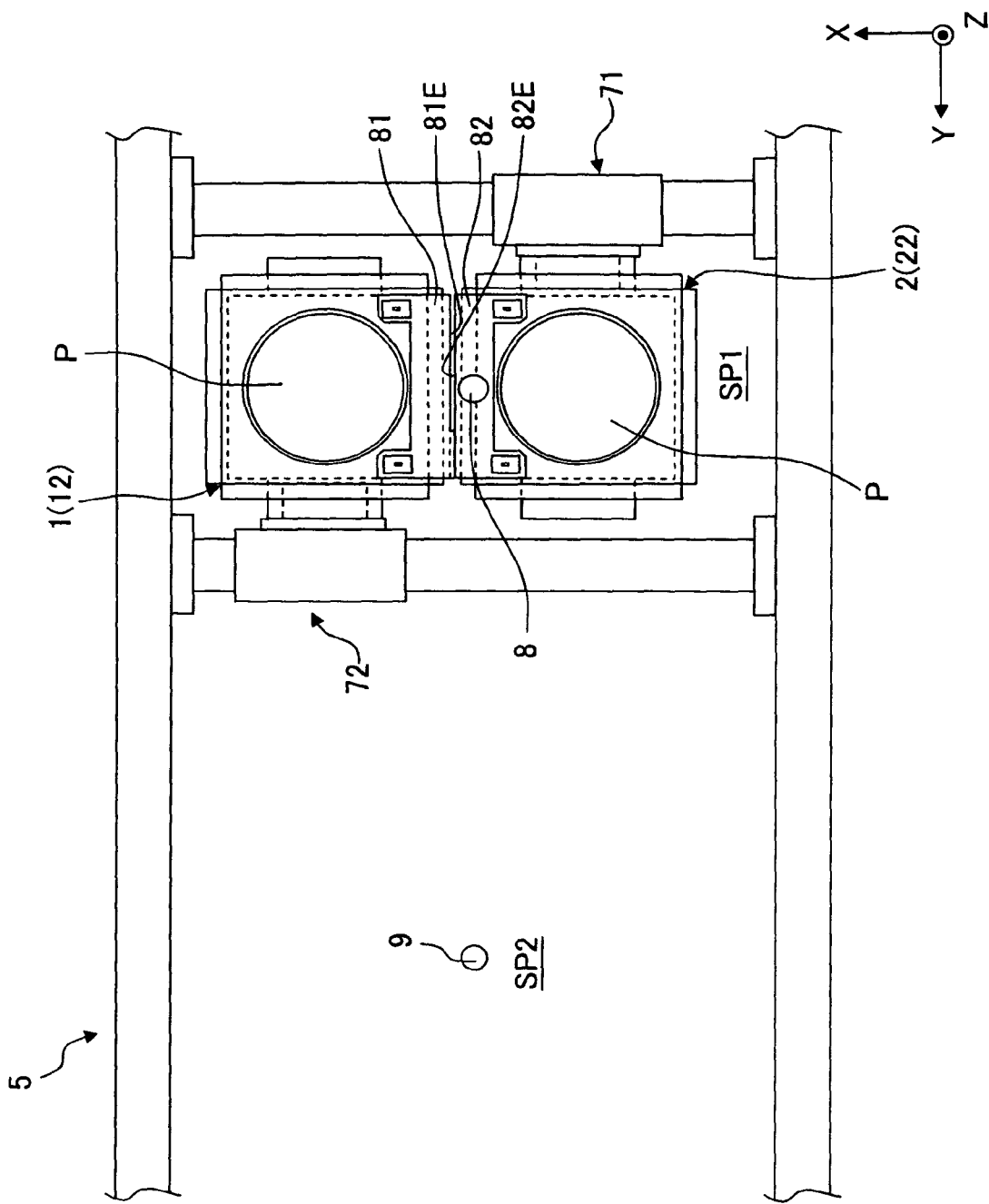
FIG. 10 schematically illustrates the exposure method according to the first embodiment.

The controller 7 makes at least one of the transmitting member 81, the transmitting member 82, the first substrate stage 1, and the second substrate stage 2 continuously to form the space capable of retaining the liquid LQ with respect to the first optical element 8. That is, the controller 7 uses the substrate stage-driving system 5 in the first area SP1 of the guide surface GF including the position opposite to the first optical element 8, in the state that the end surface 81E of the transmitting member 81 and the end surface 82E of the transmitting member 82 are close to each other or make contact with each other, to move the first substrate stage 1 and the second substrate stage 2 synchronously in the XY plane with respect to the first optical element 8 (SE3). In this embodiment, the controller 7 synchronously moves the first substrate stage 1 and the second substrate stage 2 in the +X direction in the state that the end surface 81E of the transmitting member 81 of the first substrate stage 1 and the end surface 82E of the transmitting member 82 of the second substrate stage 2 are close to each other or make contact with each other. Accordingly, it is possible to make the change from the state that at least one of the first substrate stage 1 and the transmitting member 81 is opposite to the optical element 8 as shown in FIG. 9 to the state that at least one of the second substrate stage 2 and the transmitting member 82 is opposite to the first optical element 8 as shown in FIG. 10. That is, it is possible to make the change from the state that the liquid LQ is retained between the first optical element 8 and at least one of the first substrate stage 1 and the transmitting member 81 to the state that the liquid LQ is retained between the first optical element 8 and at least one of the second substrate stage 2 and the transmitting member 82. Although not shown, during the process in which the change is made from the state shown in FIG. 9 to the state shown in FIG. 10, the controller 7 firstly synchronously moves the first substrate stage 1 and the second substrate stage 2 in the −Y direction until the liquid immersion space LS arrives at the position of the step 81D formed at the end surface 81E of the transmitting member 81 in the Y direction in the state that the end surface 81E of the transmitting member 81 of the first substrate stage 1 and the end surface 82E of the transmitting member 82 of the second substrate stage 2 are close to each other or make contact with each other. Subsequently, the controller 7 can synchronously move the first substrate stage 1 and the second substrate stage 2 in the +X direction so that the liquid immersion space LS passes over the steps 81D, 82D formed at the end surfaces 81E, 82E of the transmitting members 81, 82, respectively, to be moved onto the second substrate stage 2. The controller 7 can synchronously move the first substrate stage 1 and the second substrate stage 2 in the +Y direction so that the first optical element 8 is positioned in the arrangement as shown in FIG. 10. Here, after the liquid immersion space LS is moved from the first substrate stage 1 (or from the transmitting member 81) to the second substrate stage 2 (or to the transmitting member 82), it is allowable to start the movement of the first substrate stage 1 to the second area SP2, and the movement of the second substrate stage 2 to a predetermined position in the first area SP1 including, for example, to a position at which the measurement by the optical sensor 75 is performed or to an exposure start position, without arranging the first and second substrate stages 1, 2 as shown in FIG. 10. Alternatively, at the point of time when the first and second substrate stages 1, 2 are arranged as shown in FIGS. 8 and 9, it is allowable to position the first and second substrate stages 1, 2 such that the first optical element 8 is located substantially at a same position as the steps 81D, 82D of the transmitting members 81, 82 with respect to the Y-axis.

In this embodiment, the measuring mirrors 1Rz are arranged on the four side surfaces of the first substrate table 12 respectively so that the measuring mirrors 1Rz protrude (project) from the side surfaces. Further, the measuring mirrors 2Rz are arranged on the four side surfaces of the second substrate table 22 respectively so that the measuring mirrors 2Rz protrude (project) from the side surfaces. When the change is made from the state that the liquid LQ is retained between the first substrate stage 1 and the first optical element 8 to the state that the liquid LQ is retained between the second substrate stage 2 and the first optical element 8, the end surface 81E of the transmitting member 81 protruding outwardly in the −X direction more than the measuring mirror 1Rz and the end surface 82E of the transmitting member 82 protruding outwardly in the +X direction more than the measuring mirror 2Rz are made to be close to each other or brought into contact with each other. Accordingly, it is possible to satisfactorily allow the end surface 81E of the transmitting member 81 and the end surface 82E of the transmitting member 82 to be close to each other or make contact with each other, while suppressing the contact (collision) between the measuring mirror 1Rz of the first substrate stage 1 and at least one of the second substrate stage 2 and the measuring mirror 2Rz and the contact (collision) between the measuring mirror 2Rz of the second substrate stage 2 and at least one of the first substrate stage 1 and the measuring mirror 1Rz. Therefore, it is possible to smoothly make the change from the state that the liquid LQ is retained between the first substrate stage 1 and the first optical element 8 to the state that the liquid LQ is retained between the second substrate stage 2 and the first optical element 8, while suppressing the leakage of the liquid LQ in the state that the liquid immersion space LS of the liquid LQ is formed. That is, it is possible to make the change from the state that the first substrate stage 1 and the first optical element 8 are opposite to each other to the state that the second substrate stage 2 and the first optical element 8 are opposite to each other in such a state that the optical path space for the exposure light EL on the light-exit side of the first optical element 8 is continuously filled with the liquid LQ.

Figure 12:
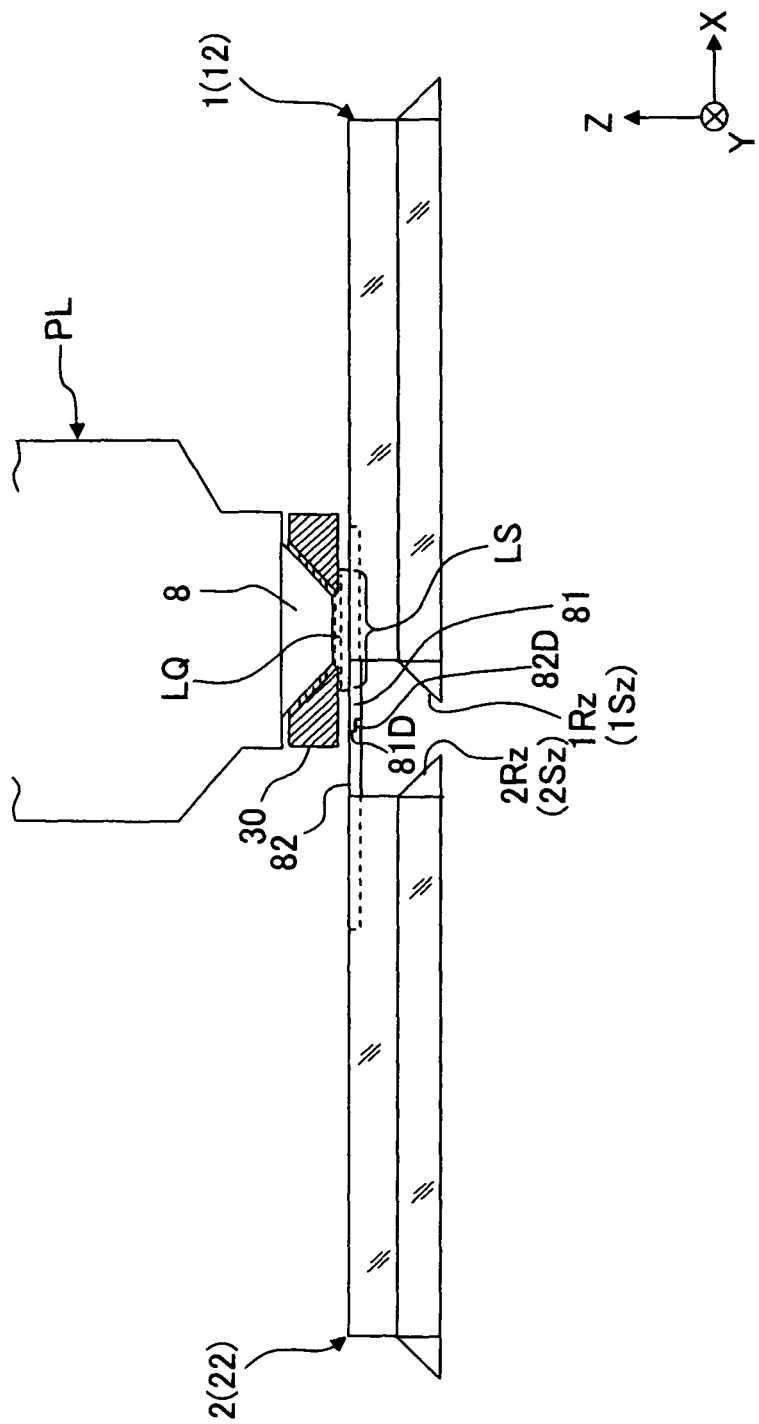
FIG. 12 schematically illustrates the exposure method according to the first embodiment.

In this embodiment, the steps 81D, 82D, which are meshed or engaged with each other, are formed on the end surfaces 81E, 82E of the transmitting members 81, 82 respectively. Therefore, as schematically shown in FIG. 12, the movement of the first and second substrate stages 1, 2 is controlled, for example, such that the liquid immersion space LS passes along or across the upper surfaces of the transmitting members 81, 82 on the steps 81D, 82D in a state that the steps 81D, 82D are meshed with each other, thereby suppressing the leakage of the liquid LQ more effectively.

After that, the controller 7 controls the substrate stage-driving system 5 to move the first substrate stage 1 to the measuring station ST2 while maintaining the state that the second substrate stage 2 is opposite to the first optical element 8 (SE4).

Figure 11:
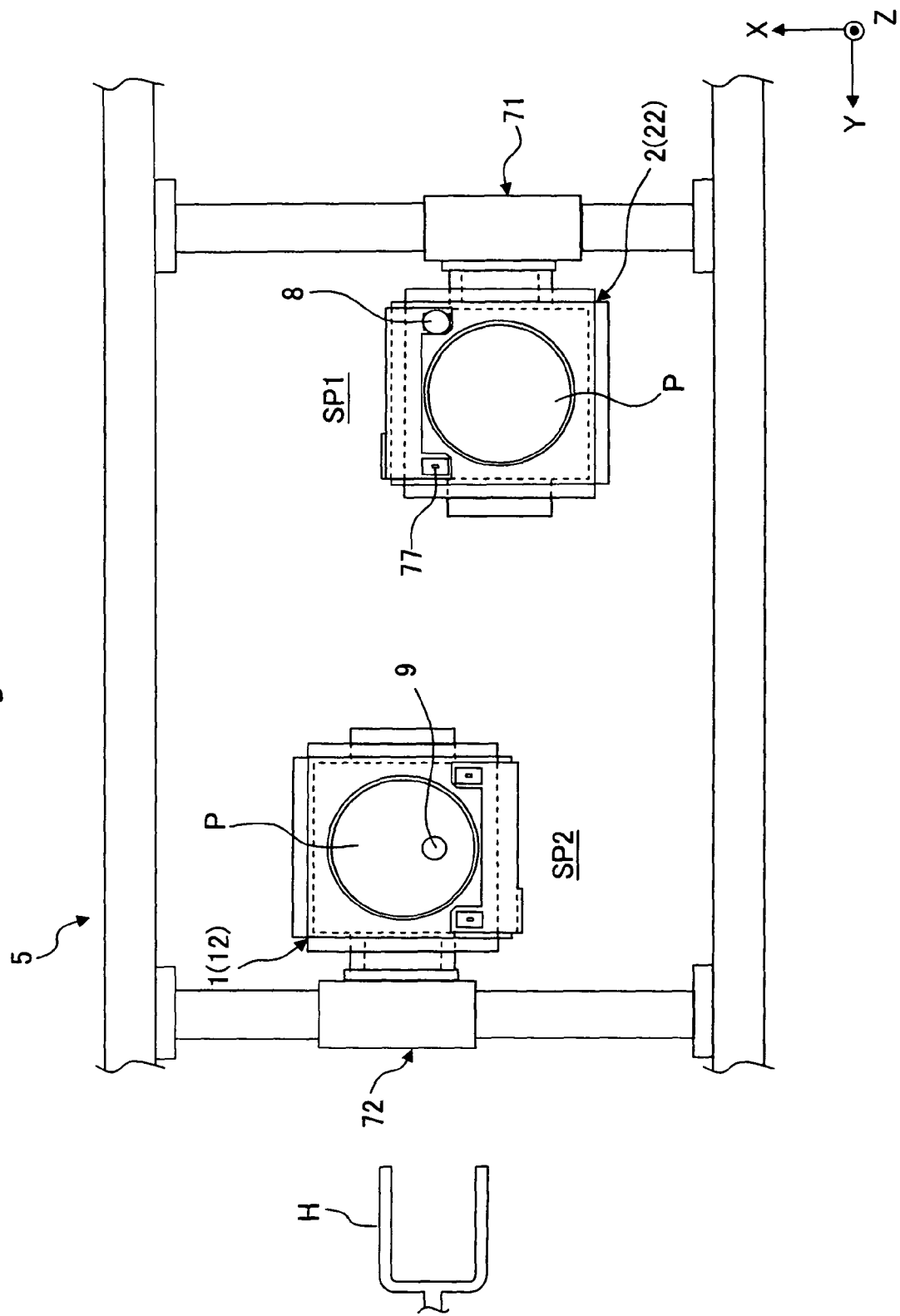
FIG. 11 schematically illustrates the exposure method according to the first embodiment.

As shown in FIG. 11, the second substrate stage 2 is arranged in the first area SP1 of the exposure station ST1, and the first substrate stage 1 is arranged in the second area SP2 of the measuring station ST2. The substrate P, which is held by the first substrate stage 1 having been moved to the measuring station ST2, is unloaded at the substrate exchange position by the transport system H; and a new substrate P, which is to be exposed, is loaded on the first substrate stage 1 (SM3). The controller 7 starts the measurement process for the substrate P loaded on the first substrate stage 1 in the measuring station ST2, and/or the like (SM4).

In the first substrate stage 1, the measuring mirrors 1Rz are arranged on the four side surfaces of the first substrate stage 1 respectively. When the measurement process is executed for the substrate P on the first substrate stage 1 in the measuring station ST2, the measuring system 6 irradiates the measuring lights ML from the Z interferometers 6Pz onto measuring mirrors 1Pz among the four measuring mirrors 1Pz which are arranged on at least three side surfaces, of the four side surfaces, respectively to measure the information about the position in the Z axis direction of the first substrate stage 1. In this embodiment, the three Z interferometers 6Pz are arranged in the measuring station ST2 on the +X side, the −X side, and the +Y side with respect to the second optical element 9. The measuring lights ML are irradiated from the Z interferometers 6Pz onto the measuring mirrors 1Rz of the first substrate stage 1. At least parts of the measuring lights ML irradiated from the Z interferometers 6Pz are transmitted through the transmitting member 81 of the first substrate stage 1.

The controller 7 executes the liquid immersion exposure of the substrate P held by the second substrate stage 2 in the exposure station ST1 (SE5). The controller 7 exposes the substrate P in the state that the optical path space for the exposure light EL on the light-exit side of the first optical element 8 is filled with the liquid LQ and that the substrate P held by the second substrate stage 2 and the first optical element 8 of the projection optical system PL are opposite to each other. The plurality of shot areas are defined on the substrate P. The controller 7 successively exposes, via the projection optical system PL and the liquid LQ, each of the plurality of shot areas on the substrate P held by the second substrate stage 2, while using the substrate stage-driving system 5 to move the second substrate stage 2 in the first area SP1.

If necessary, before starting the exposure of the substrate P, the controller 7 can make the exposure light EL to be irradiated onto the aperture 77 through the liquid LQ while allowing the first optical element 8 and the aperture 77 to be opposite to each other. The exposure light EL, existing from the first optical element 8 and irradiated onto the aperture 77 through the liquid LQ, comes into the optical sensor 75. The controller 7 can execute the predetermined process, for example, such that the calibration is executed for the projection optical system PL based on the detection result obtained by the optical sensor 75.

Upon exposing the substrate P, the controller 7 exposes the substrate P while adjusting the position of the substrate P held by the second substrate stage 2 in the exposure station ST1 by using the measurement result obtained in the measuring station ST2.

For example, the controller 7 measures, with the Z interferometers 6Pz, the position in the Z axis direction of the second substrate stage 2 arranged in the exposure station ST1 to determine the positional relationship between an approximate plane of the surface of the substrate P and the image plane of the projection optical system PL in the coordinate system defined by the measuring system 6 including the Z interferometers 6Pz. The position information about the reference surface in the Z axis direction and the approximate plane of the surface of the substrate P based on the reference surface in the coordinate system defined by the measuring system 6 including the Z interferometers 6Pz have been already measured in the measuring station ST2. The position information about the image plane of the projection optical system PL with respect to the reference surface is previously stored in the controller 7. Therefore, the controller 7 can determine the positional relationship between the approximate plane of the surface of the substrate P and the image plane of the projection optical system PL in the coordinate system defined by the measuring system 6 including the Z interferometers 6Pz based on the measurement result obtained by measuring, with the Z interferometers 6Pz, the position in the Z axis direction of the second substrate stage 2 arranged in the exposure station ST1. The controller 7 exposes the substrate P while controlling the position of the second substrate stage 2 based on the position information measured with the measuring system 6 including the Z interferometers 6Pz so that the surface of the substrate P and the image plane of the projection optical system PL are in the predetermined positional relationship (the surface of the substrate P and the image plane of the projection optical system PL are matched to each other).

In the second substrate stage 2, the measuring mirrors 2Rz are arranged on the four side surfaces of the second substrate stage 2 respectively. When the measurement is executed for the position information about the second substrate stage 2 in the exposure station ST1, the measuring system 6 makes the measuring lights ML from the Z interferometers 6Pz to be irradiated onto measuring mirrors 2Pz among the four measuring mirrors 2Pz arranged on at least three surfaces of the four surfaces respectively to measure the position information about the second substrate stage 2 in the Z axis direction. In this embodiment, the three Z interferometers 6Pz are arranged in the exposure station ST1 on the +X side, the −X side, and the −Y side with respect to the first optical element 8. The measuring lights ML are irradiated from the Z interferometers 6Pz onto the measuring mirrors 2Rz of the second substrate stage 2. At least parts of the measuring lights ML irradiated from the Z interferometers 6Pz are transmitted through the transmitting member 82 of the second substrate stage 2. Note that the mark of the mask M is detected by, for example, the optical sensor 75 prior to the exposure of the substrate P, or the reference mark and the mark of the mask M are detected by an unillustrated alignment sensor prior to the exposure of the substrate P, and then the substrate P is exposed, by using also the result of this detection, while controlling the position of the second substrate stage 2.

The processes as described above are repeated thereafter. That is, the exposure process is executed for the substrate P held by the second substrate stage 2 in the exposure station ST1, and the measurement process is executed for the substrate P held by the first substrate stage 1 in the measuring station ST2. After the completion of the exposure process for the substrate P held by the second substrate stage 2 in the exposure station ST1 and the measurement process for the substrate P held by the first substrate stage 1 in the measuring station ST2, the controller 7 uses the substrate stage-driving system 5 to move the first substrate stage 1, arranged in the second area SP2 of the measuring station ST2, to the first area SP1 of the exposure station ST1. The exchange operation is executed to exchange the first connecting member 71 and the second connecting member 72. The first connecting member 71 is released from the second substrate stage 2, and the first connecting member 71 is connected to the first substrate stage 1; and the second connecting member 72 is released from the first substrate stage 1, and the second connecting member 72 is connected to the second substrate stage 2. The controller 7 makes the change from the state that the second substrate stage 2 and the first optical element 8 are opposite to each other to the state that the first substrate stage 1 and the first optical element 8 are opposite to each other. After that, the controller 7 uses the substrate stage-driving system 5 to move the second substrate stage 2, arranged in the first area SP1 of the exposure station SP1, to the second area SP2 of the measuring station ST2. The controller 7 successively exposes the plurality of shot areas of the substrate P held by the first substrate stage 1 while moving the first substrate stage 1 in the exposure station ST1; and the controller 7 executes the predetermined process including, for example, the exchange of the substrate P on the second substrate stage 2 and the measurement process in the measuring station ST2.

After moving, to the exposure station ST1, the first substrate stage 1 holding the substrate P for which the measurement process has been completed in the measuring station ST2 and upon executing the exposure process for the substrate P in the exposure station ST1, the controller 7 uses the Z interferometers 6Pz to measure the position in the Z axis direction of the first substrate stage 1 arranged in the exposure station ST1, and the controller 7 determines the positional relationship between the approximate plane of the surface of the substrate P and the image plane of the projection optical system PL based on the measurement result.

In the first substrate stage 1, the measuring mirrors 1Rz are arranged on the four side surfaces of the first substrate stage 1 respectively. Upon executing the measurement of the position information about the first substrate stage 1 in the exposure station ST1, the measuring system 6 makes the measuring lights ML from the Z interferometers 6Pz to be irradiated onto measuring mirrors 1Pz among the four measuring mirrors 1Pz which are arranged on at least three side surfaces of the four side surfaces respectively to measure the position information about the position in the Z axis direction of the first substrate stage 1. In this embodiment, the three Z interferometers 6Pz are arranged in the exposure station ST1 on the +X side, the −X side, and the −Y side with respect to the first optical element 8. The measuring lights ML are irradiated from the Z interferometers 6Pz onto the measuring mirrors 2Rz of the first substrate stage 1. At least parts of the measuring lights ML irradiated from the Z interferometers 6Pz are transmitted through the transmitting member 81 of the first substrate stage 1.

As explained above, according to this embodiment of the present invention, the transmitting members 81, 82, which have the end surfaces 81E, 82E protruding outwardly more than the measuring mirrors 1Rz, 2Rz respectively and which have the transmitting areas 81S, 82S through which the measuring lights ML from the Z interferometers 6Pz are transmissive, are arranged for the first and second substrate stages 1, 2 respectively. Accordingly, at least one of the transmitting member 81, the transmitting member 82, the first substrate stage 1, and the second substrate stage 2 can be arranged at the position opposite to the first optical element 8 without obstructing the measuring operation of the Z interferometer 6Pz, and the optical path space for the exposure light EL on the light-exit side of the first optical element 8 can be always filled with the liquid LQ continuously without executing the operation for recovering all of the liquid LQ. Therefore, the exposure of the substrate P held by the first substrate stage 1 and the exposure of the substrate P held by the second substrate stage 2 can be executed while suppressing the decrease in the throughput of the exposure apparatus EX. It is possible to suppress the occurrence of the water mark caused by the absence or disappearance of the liquid LQ, the occurrence of the temperature change caused by the heat of vaporization, and the like; and it is possible to suppress the deterioration of the exposure accuracy.

In this embodiment, the measuring mirrors 1Rz, 2Rz, which are provided to measure the positions of the first and second substrate tables 12, 22, protrude outwardly on the side surfaces of the first substrate stage 1 (first substrate table 12) and the side surfaces of the second substrate stage 2 (second substrate table 22), respectively. It is difficult to make the opposing surface (top surface) 15 of the first substrate stage 1 and the opposing surface (top surface) 25 of the second substrate stage 2 to be close to each other or brought into contact with each other. According to this embodiment, the movement of the liquid immersion space LS from one to the other of the first substrate stage 1 and the second substrate stage 2 is executed by using the transmitting members 81, 82 which have the end surfaces 81E, 82E protruding outwardly more than the measuring mirrors 1Rz, 2Rz and through which the measuring lights ML are transmissive. Therefore, it is possible to make the change from one to the other of the state that the first substrate stage 1 and the first optical element 8 are opposite to each other and the state that the second substrate stage and the first optical element 8 are opposite to each other, in the state that the space capable of retaining the liquid LQ is continuously formed while suppressing, for example, the collision of the measuring mirrors 1Rz, 2Rz of the first and second substrate stages 1, 2, and without obstructing the measuring operation of the Z interferometer 6Pz.

According to this embodiment, the transmitting members 81, 82 are detachably held to the first and second substrate stages 1, 2 by the holding mechanisms 90. Therefore, for example, the deteriorated transmitting members 81, 82 can be easily exchanged with new transmitting members 81, 82.

According to this embodiment, the apertures 77, which shape the light beam coming into the optical sensor 75, are provided on each of the transmitting members 81, 82. Therefore, it is unnecessary to provide any new optical member to shape the light beam coming into the optical sensor 75. Therefore, it is possible to reduce the number of parts.

In this embodiment, the transmitting member 81 is arranged so that the transmitting member 81 is opposite to the reflecting surface 1Sz of the measuring mirror 1Rz arranged on the side surface on the −X side of the first substrate table 12. The measuring light ML, which is irradiated onto the measuring mirror 1Rz arranged on the side surface on the −X side of the first substrate table 12, is transmitted through at least a part of the transmitting member 81. The transmitting member 81 is, for example, a plane-parallel, and the upper and lower surfaces of the transmitting area 81S of the transmitting member 81, held by the holding mechanism 90, are substantially parallel to the XY plane. If the thickness of the transmitting member 81 is nonuniform in relation to the Y axis direction, and/or any warpage arises in the transmitting member 81, then there is a possibility that the optical path length of the measuring light ML might be changed depending on the position in the Y axis direction of the transmitting area 81S of the transmitting member 81, thereby affecting the measurement accuracy of the Z interferometer 6Pz. The same or equivalent situation regarding the above possibility is applied also in relation to the measuring mirror 2Rz provided for the second substrate table 22.

Accordingly, if necessary, the controller 7 is capable of correcting, for example, the error of the measured value of the Z interferometer 6Pz caused, for example, due to the warpage and the uneven thickness of the transmitting member 81. An explanation will be made below about an exemplary method for correcting the measured value of the Z interferometer 6Pz due to the transmitting member 81.

Figure 13:
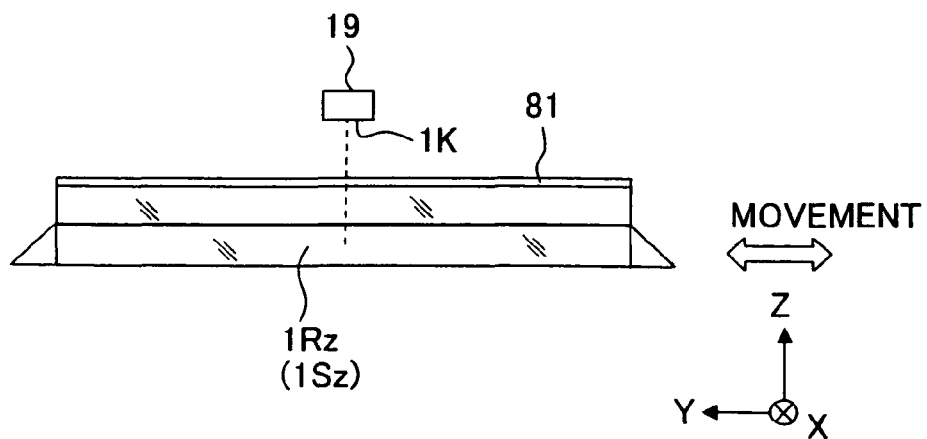
FIG. 13 schematically illustrates the exposure method according to the first embodiment.

At first, before exposing the substrate P, the controller 7 previously uses the Z interferometer 6Pz to execute the operation to obtain the position information about the first substrate stage 1 in the Z axis direction. That is, the controller 7 makes the measuring light ML from the Z interferometer 6Pz to be irradiated and makes the measuring light ML to be received by the Z interferometer 6Pz via the reflecting surface 1Sz of the measuring mirror 1Rz and the transmitting area 81S of the transmitting member 81, to thereby obtain the position information about the first substrate stage 1 in the Z axis direction. In this procedure, as schematically shown in FIG. 13, the controller 7 makes the measuring light ML to be irradiated from the Z interferometer 6Pz and makes the measuring light ML to be received by the Z interferometer 6Pz via the reflecting surface 1Sz of the measuring mirror 1Rz and the transmitting area 81S of the transmitting member 81 while monitoring, for example, the driving amount of the above-described actuator 11V with the encoder system or the like to thereby move the first substrate table 12 (first substrate stage 1) in the Y axis direction such that the position in the Z axis direction of the first substrate table 12 is not changed. Accordingly, the Z interferometer 6Pz successively receives the measuring light ML via the respective positions in the Y axis direction of the transmitting member 81.

Figure 14:
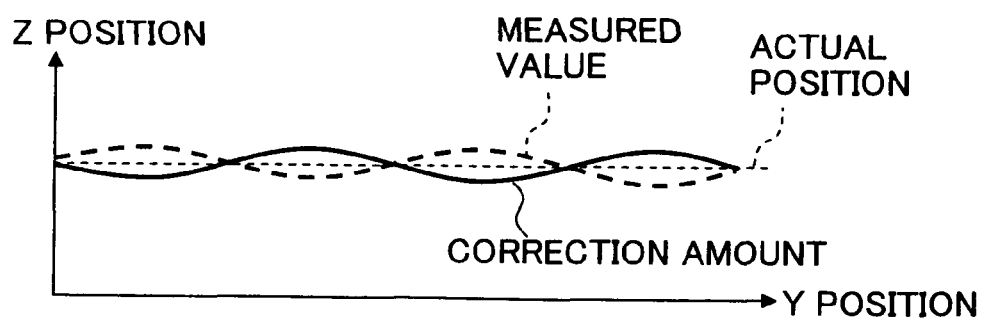
FIG. 14 schematically illustrates the change in measured value of an interferometer resulting from the transmitting member.

In this situation, if the transmitting member 81 has any uneven thickness in the Y axis direction, and/or any warpage arises, then the measured value of the Z interferometer 6Pz is changed in relation to the Y axis direction, as schematically shown in FIG. 14, depending on the change of the optical path length caused due to the uneven thickness and/or the like.

The controller 7 derives the correction amount in relation to the measured value of the Z interferometer 6Pz corresponding to the position in the Y axis direction of the transmitting area 81S of the transmitting member 81. That is, if any uneven thickness or the like is present in the transmitting member 81, any error, which is caused due to the uneven thickness or the like of the transmitting member 81, arises between the actual position (Z position) of the first substrate table 12 and the position of the first substrate table 12 measured by the Z interferometer 6Pz. The controller 7 derives the correction amount to cancel the error, corresponding to the position in the Y axis direction of the transmitting area 81S of the transmitting member 81. The controller 7 stores the derived correction amount in the storage device 10.

For example, upon exposing the substrate P, when the controller 7 measures the position information about the first substrate table 12 with the Z interferometer 6Pz, the controller 7 adjusts the measured value of the Z interferometer 6Pz based on the measurement result of the Z interferometer 6Pz and the storage information of the storage device 10. That is, the controller 7 adjusts (corrects) the measured value of the Z interferometer 6Pz, which may possibly include the error caused due to the uneven thickness or the like of the transmitting member 81, based on the correction amount previously determined and stored in the storage device 10. Then, the controller 7 controls, by using the substrate stage-driving system 5 (mainly the fine movement system 5B), the position in the Z axis direction of the first substrate table 12 based on the measured value of the Z interferometer 6Pz after the adjustment (correction). Accordingly, the position in the Z axis direction of the first substrate table 12 can be satisfactorily adjusted based on the measured value of the Z interferometer 6Pz in which the error caused due to the uneven thickness or the like of the transmitting member 81 is canceled.

On the other hand, the controller 7 can also adjust the position of the first substrate table 12 by determining, based on the measured value of the Z interferometer 6Pz and the correction amount stored in the storage device 10, the driving amount of the substrate stage-driving system 5 (mainly the fine movement system 5B) so as to move the first substrate table 12 to the desired position and by driving the substrate stage-driving system 5 based on the determined driving amount, without adjusting (correcting) the measured value of the Z interferometer 6Pz based on the correction amount stored in the storage device 10.

The explanation has been made herein about a case that the position of the first substrate table 12 is adjusted. However, the second substrate table 22 is also dealt with equivalently or in the same manner as described above. In this embodiment, each of the transmitting members 81, 82 is a member entirely formed of a transmissive material such as glass. However, it is also allowable to use a composite member in which only the transmitting area 81S (82S) (a first transmitting area) and a second transmitting area opposite to the aperture are formed of the transmissive material. Alternatively, a metal film or a fluoride film may be partially formed on the transmitting member 81, 82 in order to strengthen the transmitting member 81, 82 or to improve the liquid repellence with respect to the liquid LQ.

Second Embodiment

Next, a second embodiment will be explained. In the following description, the constitutive parts or components, which are same as or equivalent to those of the first embodiment described above, are designated by the same reference numeral, and any explanation thereof will be simplified or omitted.

Figure 15:
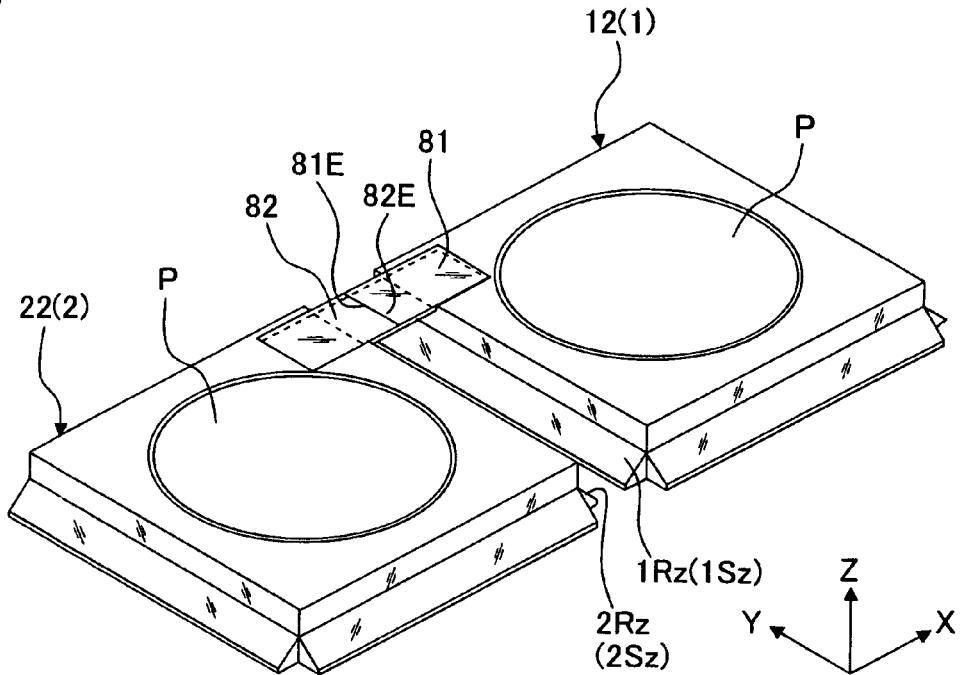
FIG. 15 is a perspective view of exemplary first and second substrate tables according to a second embodiment.

FIG. 15 is a perspective view of first and second substrate tables 12, 22 according to the second embodiment. In the first embodiment described above, the transmitting member 81 is formed so that the transmitting member 81 has the lower surface opposite to the substantially entire region of the reflecting surface 1Sz of the measuring mirror 1Rz arranged on the side surface on the −X side of the first substrate table 12, in other words, the transmitting member 81 has an approximately same size (length) as that of the measuring mirror 2Rz in relation to the Y axis direction. However, as shown in FIG. 15, the transmitting member 81 may be formed so that the transmitting member 81 has the lower surface opposite to a partial area of the reflecting surface 1Sz of the measuring mirror 1Rz. Similarly, the transmitting member 82 may be also formed so that the transmitting member 82 is opposite to a partial area of the reflecting surface 2Sz of the measuring mirror 2Rz arranged on the side surface on the +X side of the second substrate table 22. Even when the transmitting members 81, 82 are formed to be smaller than the measuring mirrors 1Rz, 2Rz, the movement of the first and second substrate stages 1, 2 is controlled so that the end surface 81E of the transmitting member 81 and the end surface 82E of the transmitting member 82 are allowed to be close to each other or make contact with each other, and that the liquid immersion space LS passes across the transmitting members 81, 82. Accordingly, it is possible to smoothly make the change from one to the other of the state that the liquid LQ is retained between the first substrate stage 1 and the first optical element 8 and the state that the liquid LQ is retained between the second substrate stage 2 and the first optical element 8, while suppressing the collision between the measuring mirror 1Rz and the measuring mirror 2Rz and/or the like.

In the embodiment shown in FIG. 15, in accordance with the movement of the first substrate stage 1 (second substrate stage 2), two states, namely a first state that the measuring light ML from the Z interferometer 6Pz passes through the transmitting member 81 (82) and a second state that the measuring light ML from the Z interferometer 6Pz does not pass through the transmitting member 81 (82) are both brought about. In this case, there is such a possibility that any error might appear in the measurement result of the Z interferometer 6Pz between the first state and the second state depending on the change in the optical path length due to the presence or absence of the transmitting member 81 (82).

Accordingly, if necessary, the controller 7 can correct, for example, the error of the measured value of the Z interferometer 6Pz resulting from the presence or absence of the transmitting member 81 (or the transmitting member 82). An explanation will be made below about an exemplary method for correcting the measured value of the Z interferometer 6Pz resulting from the presence or absence of the transmitting member 81.

At first, before exposing the substrate P, the controller 7 previously executes the operation to obtain the position information about the first substrate stage 1 in the Z axis direction by using the Z interferometer 6Pz. The controller 7 monitors, for example, the driving amount of the actuator 11V described above with the encoder system or the like and the controller 7 makes the measuring light ML to be irradiated from the Z interferometer 6Pz while moving the first substrate table 12 (first substrate stage 1) in the Y axis direction such that the position in the Z axis direction of the first substrate table 12 is not changed. Accordingly, the measuring light ML via the reflecting surface 1Sz of the measuring mirror 1Rz and the transmitting area 81S of the transmitting member 81, and the measuring light ML via the reflecting surface 1Sz of the measuring mirror 1Rz but not via the transmitting area 81S of the transmitting member 81 successively come into the Z interferometer 6Pz. That is, the controller 7 obtains the position information about the first substrate stage 1 in the Z axis direction by making the measuring light ML to be irradiated from the Z interferometer 6Pz, and by making the measuring light via the transmitting area 81S of the transmitting member 81 or the measuring light ML not via the transmitting area 81S to be received by the Z interferometer 6Pz.

In this procedure, the measured value of the Z interferometer 6Pz is changed in relation to the Y axis direction depending on the change in the optical path length due to the presence or absence of the transmitting member 81 in relation to the Y axis direction.

The controller 7 derives the correction amount in relation to the measured value of the Z interferometer 6Pz corresponding to the position in the Y axis direction of the reflecting surface 1Sz of the measuring mirror 1Rz. That is, any difference arises in the measured value of the Z interferometer 6Pz between a position at which the transmitting member 81 is present and another position at which the transmitting member 81 is absent. The controller 7 derives the correction amount to cancel the difference. The controller 7 stores the derived correction amount in the storage device 10.

For example, when the controller 7 measures the position information about the first substrate table 12 with the Z interferometer 6Pz upon exposing the substrate P, the controller 7 adjusts the measured value of the Z interferometer 6Pz based on the measurement result of the Z interferometer 6Pz and the storage information of the storage device 10. Namely, the controller 7 adjusts (corrects), based on the correction amount previously determined and stored in the storage device 10, the measured value of the Z interferometer 6Pz which might possibly include the error due to the presence of the transmitting member 81. The controller 7 controls the position in the Z axis direction of the first substrate table 12 based on the measured value of the Z interferometer 6Pz after the adjustment (correction), by using the substrate stage-driving system 5 (mainly the fine movement system 5B). Accordingly, it is possible to satisfactorily adjust the position in the Z axis direction of the first substrate table 12 based on the measured value of the Z interferometer 6Pz in which the error caused by the presence of the transmitting member 81 is canceled.

On the other hand, the controller 7 can also determine, based on the measured value of the Z interferometer 6Pz and the correction amount stored in the storage device 10, the driving amount of the substrate stage-driving system 5 (mainly the fine movement system 5B) to move the first substrate table 12 to a desired position, without adjusting (correcting) the measured value of the Z interferometer 6Pz based on the correction amount stored in the storage device 10; and the controller 7 can also drive the substrate stage-driving system 5 based on the determined driving amount to adjust the position of the first substrate table 12.

The explanation has been made herein about the case in which the position of the first substrate table 12 is adjusted. However, the second substrate table 22 is also dealt with in the same manner as described above.

Third Embodiment

Next, a third embodiment will be explained. In the following description, the constitutive parts or components, which are same as or equivalent to those of the embodiment described above, are designated by the same reference numeral; and any explanation thereof will be simplified or omitted.

Figure 16:
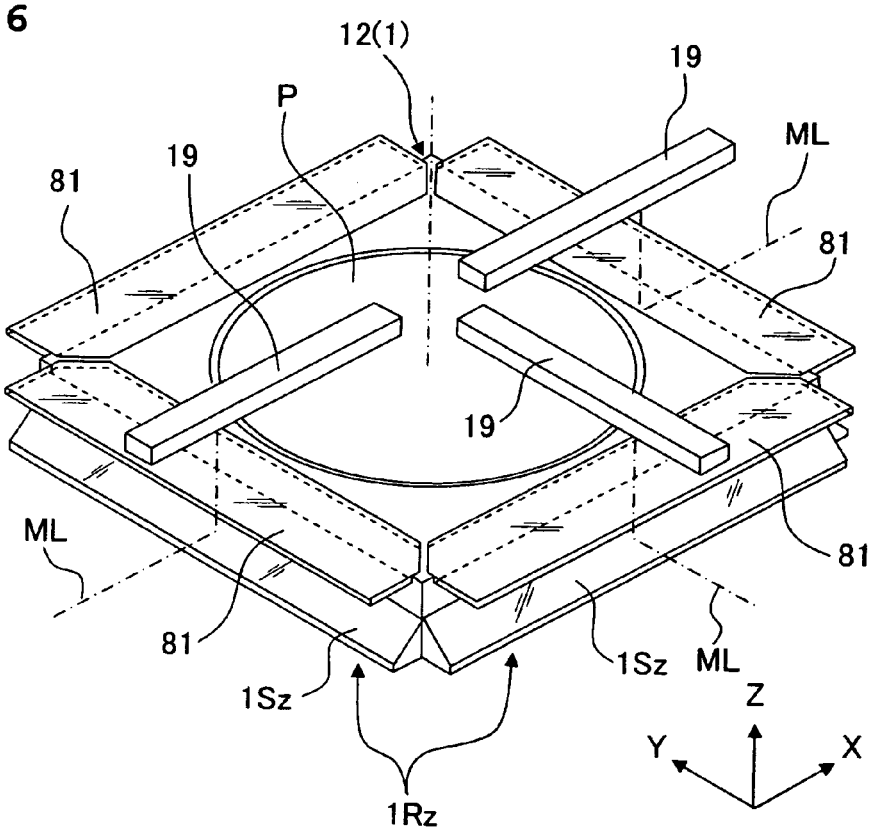
FIG. 16 is a perspective view of an exemplary first substrate table according to a third embodiment.

FIG. 16 is a perspective view of a first substrate table 12 according to the third embodiment. In the first embodiment described above, one piece of the transmitting member 81 is arranged to be opposite to the measuring mirror 1Rz arranged on the side surface on the –X side of the first substrate table 12. However, as shown in FIG. 16, four pieces of the transmitting member 81 may be arranged to be opposite to the measuring mirrors 1Rz arranged on the four side surfaces of the first substrate table 12 respectively. Similarly, four transmitting members 82 may be also provided for the second substrate table 22.

Accordingly, when the change is made from one to the other of the state that the liquid LQ is retained between the first substrate stage 1 and the first optical element 8 and the state that the liquid LQ is retained between the second substrate stage 2 and the first optical element 8, then the first substrate stage 1 and the second substrate stage 2 can be synchronously moved, for example, in a state that an end surface 81E of the transmitting member 81 arranged on the +X side of the first substrate table 12 and an end surface 82E of the transmitting member 82 arranged on the –X side of the second substrate table 22 are close to each other or make contact with each other; or the first substrate stage 1 and the second substrate stage 2 can be synchronously moved in a state that an end surface 81E of the transmitting member 81 arranged on the +Y side of the first substrate table 12 and an end surface 82E of the transmitting member 82 arranged on the –Y side of the second substrate table 22 are close to each other or make contact with each other.

Fourth Embodiment

Next, a fourth embodiment will be explained. In the following description, the constitutive parts or components, which are same as or equivalent to those of the embodiment described above, are designated by the same reference numeral, and any explanation therefor will be simplified or omitted.

The feature of the fourth embodiment is that the transmitting members (movable members) 81, 82 are supported movably with respect to the first and second substrate tables 12, 22; and that the transmitting members 81, 82 are moved to a first position at which the end surfaces 81E, 82E protrude outwardly more than the measuring mirrors 1Rz, 2Rz and to a second positions at which the transmitting members 81, 82 do not obstruct the travels of the measuring lights ML from the reflecting surfaces 2Sz of the measuring mirrors 1Rz, 2Rz, respectively. The phrase "do (does) not obstruct travel of the measuring light (beam)" means that the "do (does) not affect the optical path for the light", namely the measuring light ML does not undergo any one of the transmission, refraction, and reflection with respect to the member 81, 82, and the optical path length of the measuring light is not changed thereby.

Figure 17:
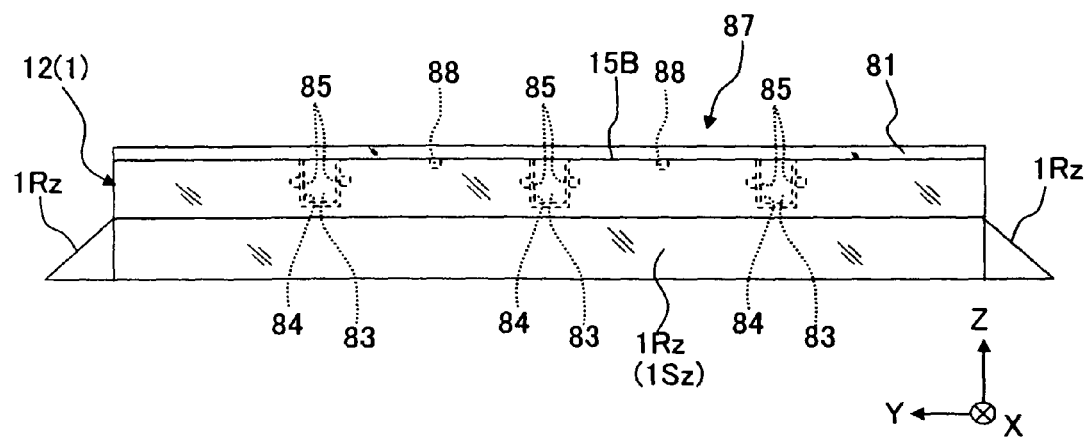
FIG. 17 is a side view of a first substrate table according to a fourth embodiment.
Figure 18:
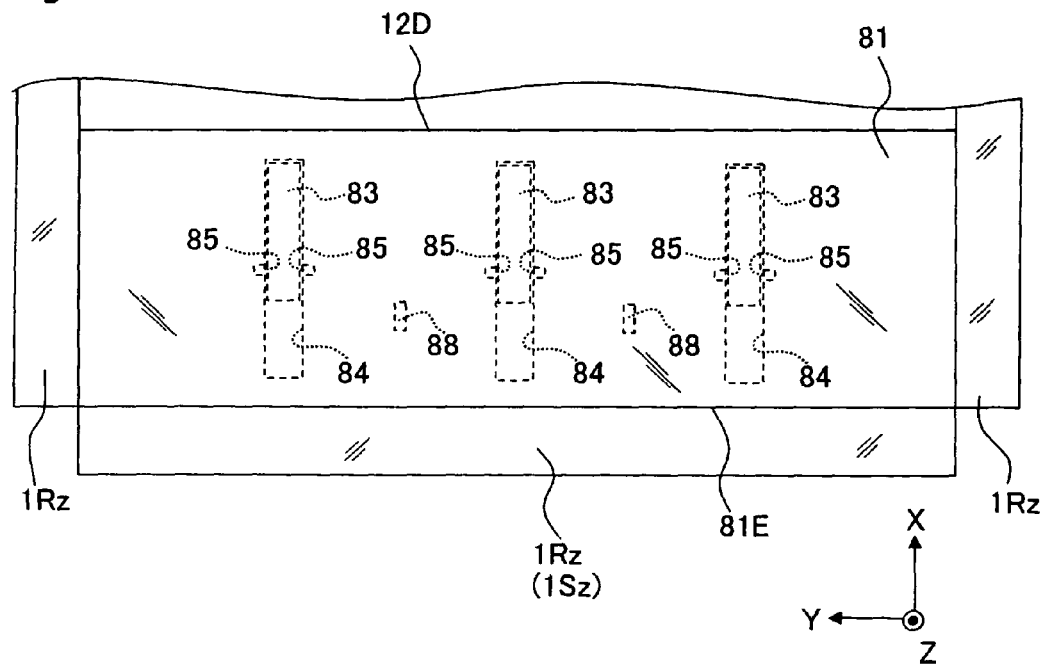
FIG. 18 is a plan view of a part of the first substrate table according to the fourth embodiment.
Figure 19:
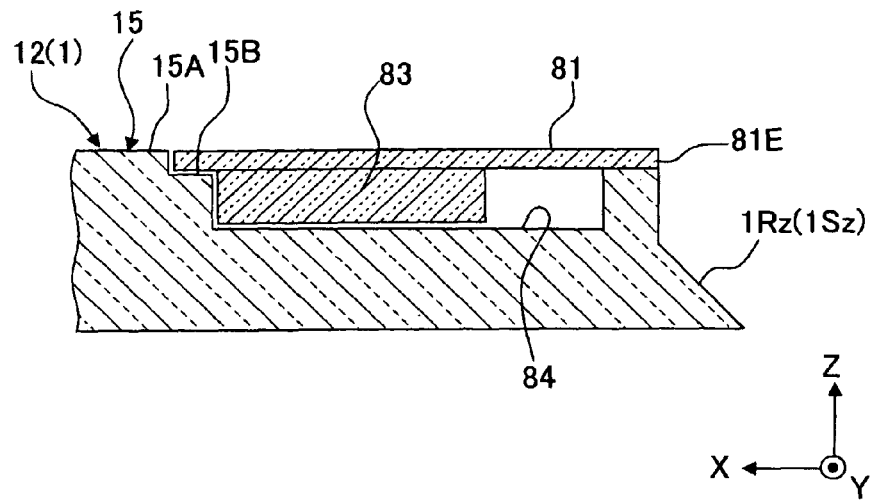
FIG. 19 is a side sectional view of a part of the first substrate table according to the fourth embodiment.

FIG. 17 is a side view of the first substrate table 12 according to the fourth embodiment as viewed from the –X side. FIG. 18 is a plan view of a part of the first substrate table 12. FIG. 19 is a side sectional view of a part of the first substrate table 12. In the following, although an explanation will be given mainly about the first substrate table 12 and the transmitting member 81, the explanation is also applied to the second substrate table 22 and the transmitting member 82 similarly or equivalently as well.

The transmitting member 81 is a plate-shaped member having upper and lower surfaces, and has the end surface 81E in the same manner as in each of the embodiments described above. In this embodiment, the transmitting member 81 is supported movably at least in the X axis direction with respect to the first substrate table 12, in the drawing. The end surface 81E of the transmitting member 81 is arranged in a predetermined positional relationship with respect to the reflecting surface 1Sz of the measuring mirror 1Rz.

In this embodiment, a plurality of (three in this embodiment) guiding objective members 83 extending in the X axis direction are connected to the lower surface, of the transmitting member 81, which is opposite to or facing the first substrate table 12. Guide grooves 84, extending in the X axis direction and each having the guiding objective members 83 arranged therein, are formed inside the holding surface 15B of the opposing surface 15, of the first substrate table 12, which is opposite to or facing the lower surface of the transmitting member 81. The size (length) of each of the guide grooves 84 in relation to the X axis direction is larger (longer) than the size (length) of the guiding objective member 83. The size (width) of the guide groove 84 in relation to the Y axis direction is larger than the size (width) of the guiding objective member 83.

Gas supply ports 85, each of which supplies a gas to a space between the side surfaces of the guiding objective member 83 and the inner side surfaces of one of the guide grooves 84, are formed on the inner side surfaces, of the guide groove 84, which is opposite to or facing the side surfaces of the guiding objective member 83. By the gas which is supplied from the gas supply ports 85, a gap is maintained between the side surfaces of the guiding objective member 83 and the inner side surfaces of the guide groove 84 opposite thereto.

Figure 20:
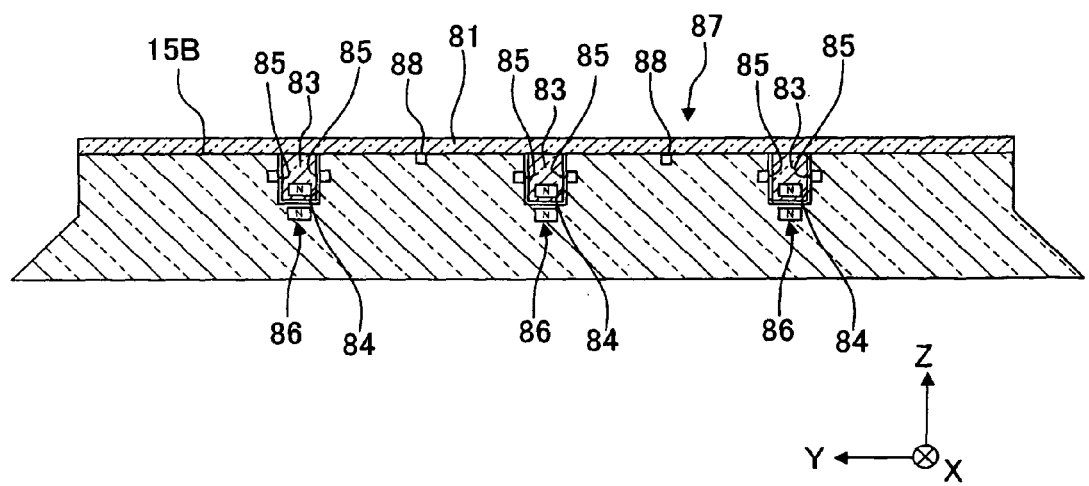
FIG. 20 is a side sectional view of the first substrate table according to the fourth embodiment.
Figure 21:
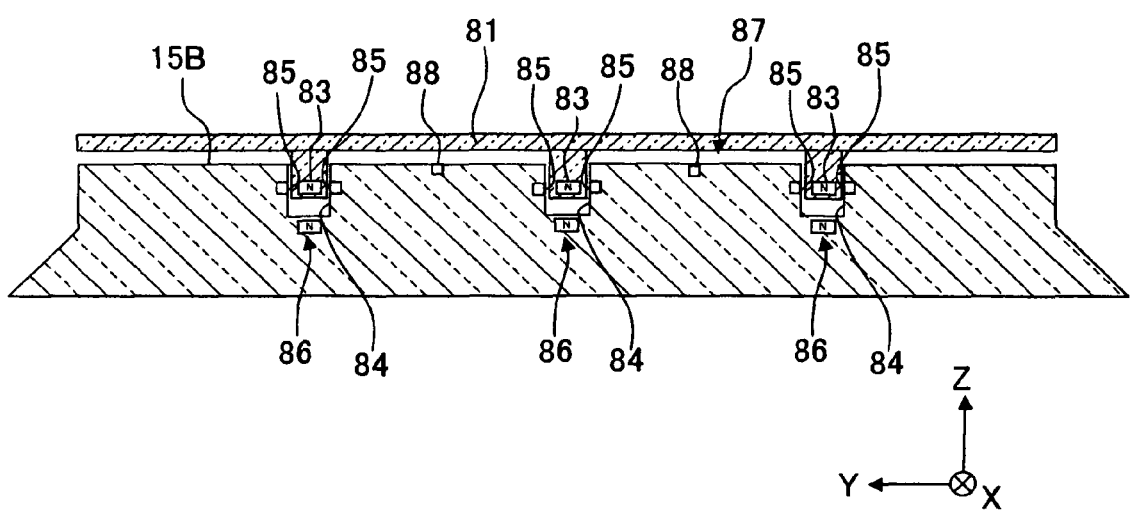
FIG. 21 is a side sectional view of the first substrate table according to the fourth embodiment.

FIGS. 20 and 21 are sectional views of FIG. 17. The first substrate table 12 is provided with support mechanisms 86 which support the transmitting member 81 from the lower surface side in a non-contact manner. In this embodiment, a magnet (for example, the N-pole) is arranged on the lower surface of each of the guiding objective members 83. The support mechanism 86 includes a magnet (for example, the N-pole) arranged on the bottom surface of each of the guide grooves 84 opposite, to the lower surface of the guiding objective member 83. The magnet of the guiding objective member 83 has the pole which is same as the pole of the magnet of the guide groove 84. Therefore, the magnets are repelled to each other, thereby supporting the transmitting member 81 connected to the guiding objective members 83 in the non-contact manner with respect to the holding surface 15B of the first substrate table 12 opposite to the lower surface of the transmitting member 81, as shown in FIG. 21.

The support mechanism 86 also includes the gas supply ports 85 described above. The gap is maintained between the side surfaces of the guiding objective member 83 and the opposing inner side surfaces of the guide groove 84 by the gas supplied from the gas supply ports 85 even in such a state that the guiding objective member 83 is floated by the magnets with respect to the bottom surface of the guide groove 84.

The transmitting member 81, which has the guiding objective members 83 supported in the non-contact manner with respect to the holding surface 15B of the first substrate table 12 by the support mechanisms 86, is movable in the X axis direction while being guided by the guide grooves 84. The transmitting member 81 moves in the X axis direction while being guided by the guide grooves 84, to be thereby movable to the first position at which the end surface 81E protrudes outwardly more than the measuring mirror 1Rz and the second position at which the end surface 81E does not obstruct the travel of the measuring light ML from the reflecting surface 1Sz of the measuring mirror 1Rz.

In this embodiment, the nozzle member 30 is capable of holding the transmitting member 81 from the upper surface side. As described above, the nozzle member 30 of this embodiment includes the seal member which is disclosed, for example, in Japanese Patent Application Laid-open Nos. 2004-289126 (corresponding to U.S. Pat. No. 6,952,253) and 2004-289128 (corresponding to U.S. Pat. No. 7,110,081). The nozzle member 30 has a gas introducing port and a gas discharge port. The controller 7 is capable of forming a gas bearing between the lower surface of the nozzle member 30 and the upper surface of the transmitting member 81 by a gas introducing (supply) operation via the gas introducing port of the nozzle member 30 and a gas discharge (sucking) operation via the gas discharge port, while making the nozzle member 30 to be opposite to the transmitting member 81 supported in the non-contact manner with respect to the holding surface 15B of the first substrate table 12 with the support mechanisms 86. A gas bearing of the pressurizing vacuum type is formed between the lower surface of the nozzle member 30 and the upper surface of the transmitting member 81. A gap G (for example, a gap of 0.1 to 1.0 mm) is maintained by the gas bearing between the lower surface of the nozzle member 30 and the upper surface of the transmitting member 81. The nozzle member 30 is capable of forming the liquid immersion space LS of the liquid LQ with respect to the transmitting member 81. Further, the nozzle member 30 is capable of holding the upper surface of the transmitting member 81 by forming the gas bearing with respect to the transmitting member 81 at the outside of the liquid immersion space LS. That is, the nozzle member 30 holds the transmitting member 81 in the state that the predetermined gap is maintained between the lower surface of the nozzle member 30 and the upper surface of the transmitting member 81, by utilizing the sucking action generated by the formation of the gas bearing between the nozzle member 30 and the transmitting member 81.

In this embodiment, the exposure apparatus EX is provided with a second holding mechanism 87 which is provided for the first substrate table 12 and which is capable of holding the transmitting member 81 by attracting the lower surface of the transmitting member 81 arranged at least one of the first position and the second position. The second holding mechanism 87 includes suction ports 88 which are formed at predetermined positions, of the holding surface 15B, of the first substrate table 12, opposite to the lower surface of the transmitting member 81 and which is capable of sucking the gas, and a vacuum system (not shown) which is connected to the suction ports 88 via a flow passage.

The controller 7 is capable of attracting and holding the lower surface of the transmitting member 81 with the holding surface 15B by driving the vacuum system of the second holding mechanism 87 in a state that the lower surface of the transmitting member 81 and the holding surface 15B of the first substrate table 12 are opposite to each other to thereby suck the gas in the space between the lower surface of the transmitting member 81 and the holding surface 15B via the suction ports 88. The controller 7 is capable releasing the transmitting member 81 from the state of being attracted and held, by stopping the driving operation of the vacuum system of the second holding mechanism 87.

The controller 7 is capable of controlling the second holding mechanism 87 to execute the sucking operation using the suction ports 88, by controlling the vacuum system so that the holding force brought about by the second holding mechanism 87, namely the force (suction force), generated by the sucking operation by the suction ports 88 for the gas between the lower surface of the transmitting member 81 and the holding surface 15B and attracting the transmitting member 81 toward the holding surface 15B, is stronger than the repelling force generated between the magnets of the guiding objective members 83 and the magnets of the guide grooves 84. The controller 7 is capable of holding (suction-holding) the transmitting member 81 with the holding surface 15B of the first substrate table 12 so that the holding surface 15B of the first substrate table 12 and the lower surface of the transmitting member 81 make contact with each other as shown in FIG. 20, by executing the sucking operation using the suction ports 88 so that the force (suction force), generated by the sucking operation by the suction ports 88 and attracting the transmitting member 81 toward the holding surface 15B, is stronger than the repelling force generated between the magnets of the guiding objective members 83 and the magnets of the guide grooves 84.

Next, an explanation will be made, with reference to schematic views shown in FIG. 22, about an example of the operation of the exposure apparatus EX according to the fourth embodiment. In this embodiment, the controller 7 moves the transmitting member 81 to the second position at which the travel of the measuring light from the reflecting surface 1Sz of the measuring mirror 1Rz is not obstructed by the transmitting member 81 as shown, for example, in FIG. 19 at least during the period in which the exposure light EL is irradiated onto the substrate P held by the first substrate table 12. That is, in this embodiment, the transmitting member 81 is arranged at the second position at which the transmitting member 81 does not obstruct at least the travel of the measuring light from the reflecting surface 1Sz of the measuring mirror 1Rz at least during the exposure of the substrate P held by the first substrate table 12. The controller 7 uses the second holding mechanism 87 to hold the lower surface of the transmitting member 81 arranged at the second position so that the lower surface of the transmitting member 81 is attracted to the holding surface 15B of the first substrate table 12. In this embodiment, the transmitting member 81 is held by the second holding mechanism 87 at the position at which the end surface 81E does not protrude outwardly more than or beyond the side surface of the first substrate table 12.

The controller 7 moves the second substrate stage 2 from the second area SP2 of the measuring station ST2 to the first area SP1 of the exposure station ST1 after the exposure process is completed for the substrate P held by the first substrate stage 1 in the exposure station ST1 and the measurement process is completed for the substrate P held by the second substrate stage 2 in the measuring station ST2. The controller 7 executes the exchange operation between the first connecting member 71 and the second connecting member 72 for the first substrate stage 1 and the second substrate stage 2, while maintaining the state that the first substrate stage 1 and the first optical element 8 are opposite to each other.

Subsequently, the controller 7 uses the substrate stage-driving system 5 to make the change from the state that at least one of the first substrate stage 1 and the transmitting member 81 is opposite to the first optical element 8 (namely, state that the liquid LQ is retained between the first optical element 8 and at least one of the first substrate stage 1 and the transmitting member 81) to the state that at least one of the second substrate stage 2 and the transmitting member 82 is opposite to the first optical element 8 (namely, state that the liquid LQ is retained between the first optical element 8 and at least one of the second substrate stage 2 and the transmitting member 82). Accordingly, the substrate P on the second substrate stage 2 can be subjected to the liquid immersion exposure.

At first, the controller 7 controls the position of the first substrate stage 1 by using the substrate stage-driving system 5 so that the nozzle member 30 and the transmitting member 81 are opposite to each other. With this, the liquid immersion space LS is formed between the nozzle member 30 and the transmitting member 81, and the gas bearing is formed at the outside of the liquid immersion space LS. In this embodiment, the size in the X axis direction of the transmitting member 81 is greater than at least the size in the X axis direction of the liquid immersion space LS. In this embodiment, the size of the upper surface of the transmitting member 81 is greater than at least the size of the liquid immersion space LS, in the XY plane substantially parallel to the upper surface of the transmitting member 81. Therefore, the liquid immersion space LS can be formed between the nozzle member 30 and the transmitting member 81.

Figure 22A:
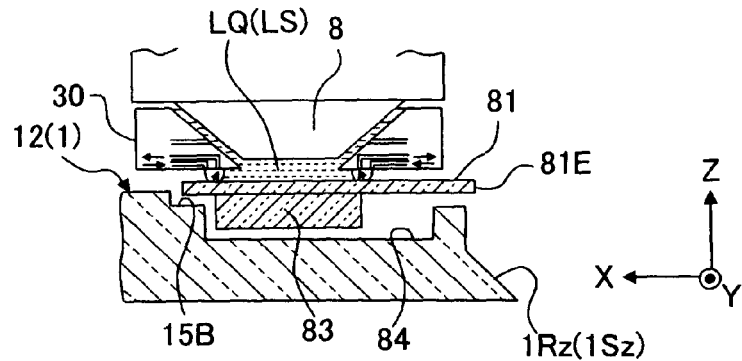
FIGS. 22A to 22D schematically illustrate an exposure method according to the fourth embodiment.

Then, the controller 7 stops the sucking operation which has been performed via the suction ports 88 of the second holding mechanism 87. Accordingly, as shown in FIG. 22A, the transmitting member 81 is supported in the non-contact manner with respect to the holding surface 15B of the first substrate table 12 in accordance with the action of the support mechanisms 86 including the magnets.

The gas bearing is formed between the nozzle member 30 and the upper surface of the transmitting member 81. The nozzle member 30 holds, from the upper surface side, the transmitting member 81 supported in the non-contact manner with respect to the holding surface 15B of the first substrate table 12 by the support mechanisms 86.

Figure 22B:
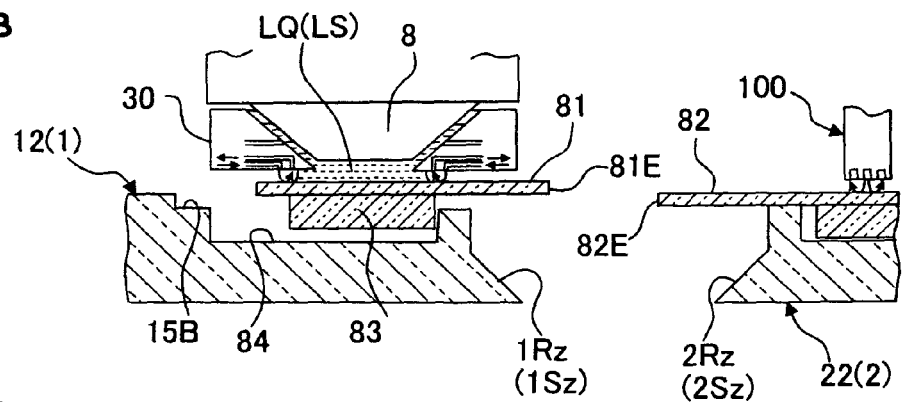

After the controller 7 makes the upper surface of the transmitting member 81 to be held by the nozzle member 30, the controller 7 moves the first substrate table 12 relative to the transmitting member 81 held by the nozzle member 30. In this embodiment, the controller 7 controls the substrate stage-driving system 5 to move the first substrate table 12 (first substrate stage 1) in the +X direction with respect to the transmitting member 81 held by the nozzle member 30. The transmitting member 81 having the guiding objective members 83, which is held by the nozzle member 30, is moved in the −X direction with respect to the first substrate table 12 while being guided by the guide grooves 84. Accordingly, as shown in FIG. 22B, the transmitting member 81 is moved to the first position at which the end surface 81E protrudes outwardly more than or beyond the measuring mirror 1Rz.

In this embodiment, the exposure apparatus EX has a third holding mechanism 100 which is capable of holding the transmitting member 82 of the second substrate table 22 from the upper surface side. The third holding mechanism 100 holds the upper surface of the transmitting member 82 by forming a gas bearing with respect to the upper surface of the transmitting member 82. The controller 7 controls the substrate stage-driving system 5 to move the second substrate table 22 in the −X direction in a state that the upper surface of the transmitting member 82 supported in the non-contact manner with respect to the second substrate table 22 is held by the third holding mechanism 100. Accordingly, as shown in FIG. 22B, the transmitting member 82 is moved to the first position at which the end surface 82E protrudes outwardly more than or beyond the measuring mirror 2Rz.

Figure 22C:
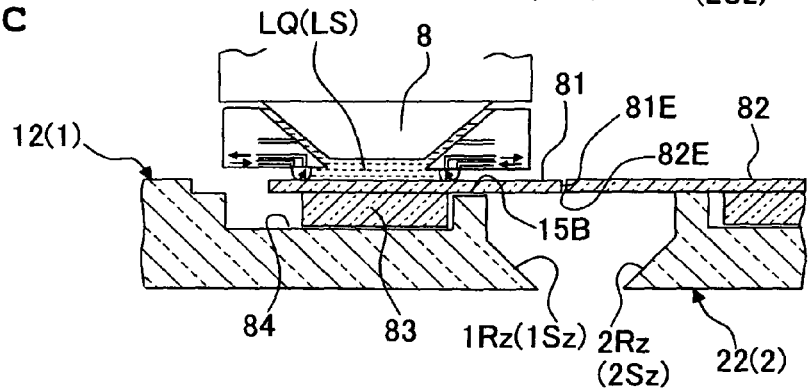

As shown in FIG. 22C, after the transmitting member 81 is moved to the first position, the controller 7 uses the second holding mechanism 87 of the first substrate table 12 to hold the lower surface of the transmitting member 81 arranged at the first position so that the lower surface of the transmitting member 81 is attracted to the holding surface 15B of the first substrate table 12. Similarly, the controller 7 uses the second holding mechanism of the second substrate table 22 to hold the transmitting member 82 arranged at the first position so that the transmitting member 82 is attracted to the holding surface of the second substrate table 22.

The controller 7 controls the substrate stage-driving system 5 to synchronously move the first substrate stage 1 and the second substrate stage 2 in the state that the end surface 81E of the transmitting member 81 of the first substrate table 12 moved to the first position and the end surface 82E of the transmitting member 82 of the second substrate table 22 moved to the first position are close to each other or make contact with each other.

When the controller 7 synchronously moves the first substrate stage 1 and the second substrate stage 2 by using the substrate stage-driving system 5, the controller 7 moves the transmitting member 81 and the transmitting member 82 to the first positions respectively to allow the end surface 81E of the transmitting member 81 of the first substrate table 12 and the end surface 82E of the transmitting member 82 of the second substrate table 22 to be close to each other or make contact with each other. By doing so, at least one of the transmitting member 81, the transmitting member 82, the first substrate stage 1, and the second substrate stage 2 forms the space capable of holding the liquid LQ with respect to the first optical element 8.

That is, when the controller 7 synchronously moves the first substrate table 12 and the second substrate table 22 by using the substrate stage-driving system 5, the controller 7 moves the transmitting members 81, 82 to the first positions by using, for example, the nozzle member 30, the third holding mechanism 100, the substrate stage-driving system 5 and the like.

The controller 7 uses the substrate stage-driving system 5 to move the first substrate stage 1 and the second substrate stage 2 synchronously in the XY plane with respect to the first optical element 8 in the first area SP1 of the guide surface GF including the position at which the exposure light EL from the first optical element 8 is irradiated and which is opposite to the first optical element 8, in the state that the end surface 81E of the transmitting member 81 and the end surface 82E of the transmitting member 82 are close to each other or make contact with each other. Accordingly, the controller 7 can make the change from the state that at least one of the first substrate table 12 and the transmitting member 81 is opposite to the first optical element 8 and the liquid LQ is retained between the first optical element 8 and at least one of the first substrate table 12 and the transmitting member 81 to the state that at least one of the second substrate table 22 and the transmitting member 82 is opposite to the first optical element 8 and the liquid LQ is retained between the first optical element 8 and at least one of the second substrate table 22 and the transmitting member 82.

In this embodiment, when the change is made from the state that the liquid LQ is retained between the first substrate table 12 and the first optical element 8 to the state that the liquid LQ is retained between the second substrate table 22 and the first optical element 8, the end surface 81E of the transmitting member 81 is moved to the first position at which the end surface 81E protrudes outwardly more than the measuring mirror 1Rz, and the end surface 82E of the transmitting member 82 is moved to the first position at which the end surface 82E protrudes outwardly more than the measuring mirror 2Rz. Since the end surface 81E of the transmitting member 81 and the end surface 82E of the transmitting member 82 are allowed to be close to each other or make contact with each other, it is possible to suppress or prevent the contact (collision) between the measuring mirror 1Rz of the first substrate table 12 and at least one of the second substrate table 22 and the measuring mirror 2Rz and to suppress or prevent the contact (collision) between the measuring mirror 2Rz of the second substrate table 22 and at least one of the first substrate table 12 and the measuring mirror 1Rz. Accordingly, it is possible to smoothly make the change from the state that the liquid LQ is retained between the first substrate stage 1 and the first optical element 8 to the state that the liquid LQ is retained between the second substrate stage 2 and the first optical element 8, while suppressing the leakage of the liquid LQ.

After making the nozzle member 30 and the transmitting member 82 to be opposite to each other, the controller 7 cancels or releases the holding operation for the transmitting member 82 having been effected by the second holding mechanism of the second substrate table 22. Accordingly, the transmitting member 82 is supported in the non-contact manner with respect to the holding surface 15B of the second substrate table 22.

The nozzle member 30 holds the upper surface of the transmitting member 82 by forming the liquid immersion space LS between the nozzle member 30 and the upper surface of the transmitting member 82 and forming the gas bearing between the nozzle member 30 and the transmitting member 82 at the outside of the liquid immersion space LS. In this embodiment, the size in the X axis direction of the transmitting member 82 is greater than at least the size in the X axis direction of the liquid immersion space LS. In this embodiment, the size of the upper surface of the transmitting member 82 is greater than at least the size of the liquid immersion space LS, in the XY plane substantially parallel to the upper surface of the transmitting member 82. Therefore, the liquid immersion space LS can be formed between the nozzle member 30 and the transmitting member 82.

After making the upper surface of the transmitting member 82 to be held by the nozzle member 30, the controller 7 moves the second substrate table 22 relative to the transmitting member 82 held by the nozzle member 30. In this embodiment, the controller 7 controls the substrate stage-driving system 5 to move the second substrate table 22 (second substrate stage 2) in the +X direction with respect to the transmitting member 82 held by the nozzle member 30. Accordingly, as shown in FIG. 22D, the transmitting member 82 is moved to the second position at which the transmitting member 82 does not obstruct the travel of the measuring light from the reflecting surface 2Sz of the measuring mirror 2Rz, namely the transmitting member 82 is not irradiated with the measuring light.

After making the transmitting member 82 to be moved to the second position, the controller 7 uses the second holding mechanism of the second substrate table 22 to effect the holding so that the lower surface of the transmitting member 82 is attracted by suction (suction-attracted) to the holding surface of the second substrate table 22. After moving the transmitting member 82 to the second position, the controller 7 starts the exposure of the substrate P held by the second substrate table 22.

Figure 22D:
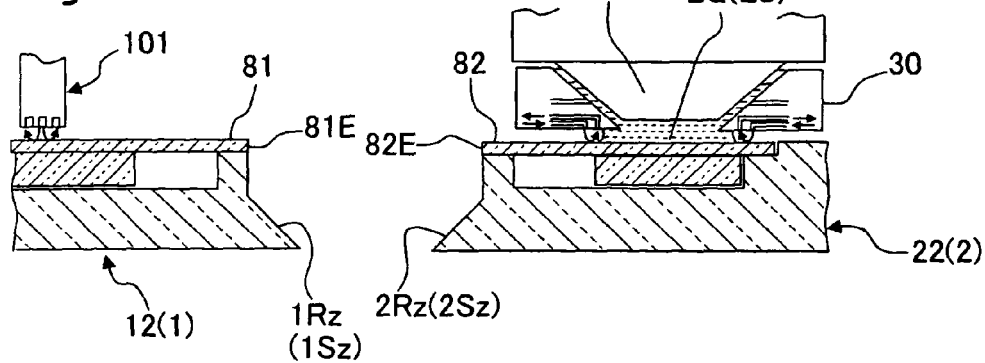

In this embodiment, as shown in FIG. 22D, the exposure apparatus EX is provided with a fourth holding mechanism 101 which is capable of holding the transmitting member 81 of the first substrate table 12 from the upper surface side. The fourth holding mechanism 101 holds the upper surface of the transmitting member 81 by forming a gas bearing with respect to the upper surface of the transmitting member 81. The controller 7 moves the first substrate table 12 in the −X direction in a state that the upper surface of the transmitting member 81 supported in the non-contact manner with respect to the first substrate table 12 is held by the fourth holding mechanism 101. Accordingly, as shown in FIG. 22D, the transmitting member 81 is moved to the second position at which the transmitting member 81 does not obstruct the travel of the measuring light from the reflecting surface 1Sz of the measuring mirror 1Rz. After moving the transmitting member 81 to the second position, the controller 7 uses the second holding mechanism 87 of the first substrate table 12 to effect the holding so that the lower surface of the transmitting member 81 is suction-attracted to the holding surface 15B of the first substrate table 12.

As explained above, according to this embodiment, the transmitting members 81, 82 are moved to the first positions so that the end surfaces 81E, 82E of the transmitting members 81, 82 protrude outwardly more than the measuring mirrors 1Rz, 2Rz respectively only when the change is made from one to the other of the state that the liquid LQ is retained between the first substrate table 1 and the first optical element 8 and the state that the liquid LQ is retained between the second substrate stage 2 and the first optical element 8. Since the transmitting members 81, 82 are moved to the second positions so that the transmitting members 81, 82 do not obstruct the travels of the measuring lights of the Z interferometers 6Pz at least when the exposure of the substrate P is performed, it is possible to smoothly execute the movement of the liquid immersion space LS between the first substrate table 12 and the second substrate table 22, and it is possible to maintain the measurement accuracy of the Z interferometer 6Pz at least during the exposure of the substrate P. Therefore, the substrate P can be exposed satisfactorily.

In the fourth embodiment, the transmitting members 81, 82 are moved to the positions at which the transmitting members 81, 82 do not obstruct the travels of the measuring lights of the Z interferometers 6Pz at least during the exposure of the substrate P. Therefore, it is not necessarily indispensable that the transmitting members 81, 82 have the function to transmit the light beam. Namely, it is possible to use a non-transmissive member instead of the transmitting members 81, 82 used in the first embodiment. For example, it is possible to use a member formed of a metal including stainless steel, titanium and the like; or a synthetic resin having the liquid repellence including polytetrafluoroethylene and the like. Alternatively, only a portion covering the optical sensor 75 may be made light transmissive, and other portions may be formed of a non-transmissive member.

In the projection optical system of each of the first to fourth embodiments described above, the optical path space on the image plane (light-exit surface) side of the optical element arranged at the end portion, is filled with the liquid. However, as disclosed for example in International Publication No. 2004/019128 (corresponding to United States Patent Application Publication No. 2005/0248856) etc., it is also possible to adopt a projection optical system wherein the optical path space on the object plane (light incident surface) side of the optical element arranged at the end portion is also filled with the liquid. Further, a thin film, which has the liquid-attracting and/or dissolution-preventive function, may be formed on all or a part (including at least the contact surface which makes contact with the liquid) of the surface of the terminal end optical element 8. Although silica glass has the high affinity for the liquid, and thus any dissolution-preventive film is unnecessary therefor, it is preferable to form at least an anti-dissolution film for calcium fluoride.

The measuring operation in the measuring station ST2 may be performed in a state that the liquid immersion space LS is formed on the substrate P and/or on the first and second substrate tables 12, 22. The supply operation and the recovery operation for the liquid LQ may be possibly required in order to form the liquid immersion space LS in the measuring station ST2. However, it is enough that the operations described above are performed during the period in which the exposure is performed for the substrate P in the other station. Therefore, the throughput is scarcely affected thereby.

Each of the embodiments described above is illustrative of the case in which the transmitting member 81 is provided for the first substrate table 12 and the transmitting member 82 is provided for the second substrate table 22. However, it is also allowable that the transmitting member is provided for only any one of the substrate tables. In this case, by making the transmitting member to have a length which is not less than twice the length of a protruding portion, of one measuring mirror, for example, the measuring mirror 1Rz, protruding outwardly from the substrate table 12, it is possible to prevent the measuring mirrors 1Rz, 2Rz from colliding with each other when the liquid immersion space LS is delivered from the first substrate table 12 to the second substrate table 22. Further, in each of the above-described embodiments, the interferometer mirrors (reflecting surfaces) are provided on four side surfaces, respectively, of each of the substrate tables (12, 22). However, the number and arrangement of the mirrors (reflecting surfaces) are not limited to this. For example, the mirrors may be provided on only two or three side surfaces. Further, in each of the above-described embodiments, the transmitting member is provided on the end portion, of the substrate table, for which the interferometer is provided. However, the arrangement of the transmitting member is not limited to this. For example, it is allowable that the transmitting member is provided on an end portion, of the substrate table, for which any interferometer mirror is not provided.

Each of the foregoing embodiments have been explained as exemplified by the multi-stage type exposure apparatus using the liquid immersion method by way of example. However, the present invention is not limited thereto. It is also allowable to adopt any exposure apparatus which has one stage, and it is also allowable to adopt any exposure apparatus which does not use the liquid immersion method. It is possible to use the present invention depending on the relationship between the position of the substrate table and the position of passage of the measuring light for the Z interferometer.

The liquid LQ is water in the embodiment of the present invention. However, the liquid LQ may be any liquid other than water. For example, when the light source of the exposure light EL is the $F_2$ laser, the $F_2$ laser beam is not transmitted through water. Therefore, as the liquid LQ, it is allowable to use, for example, fluorine-based fluids such as fluorine-based oil and perfluoropolyether (PFPE). Alternatively, other than the above, it is also possible to use, as the liquid LQ, liquids (for example, cedar oil and the like) which have the transmittance with respect to the exposure light EL, which have the refractive index as high as possible, and which are stable against the photoresist coated on the surface of the substrate P and the projection optical system PL. As for the liquid LQ, it is also allowable to use liquids having the refractive index of about 1.6 to 1.8. The liquid LQ, which has the refractive index higher than that of pure water (for example, the refractive index of not less than 1.5), includes, for example, predetermined liquids having the C—H bond or the O—H bond such as isopropanol having a refractive index of about 1.50 and glycerol (glycerin) having a refractive index of about 1.61; predetermined liquids (organic solvents) such as hexane, heptane, and decane; and decalin (decahydronaphthalene) having a refractive index of about 1.60. As for the liquid LQ, it is also allowable to use those obtained by mixing arbitrary two or more liquids of the foregoing liquids and those obtained by adding (mixing) at least one of the foregoing liquid or liquids to (with) pure water. Further, as for the liquid LQ, it is also allowable to use those obtained by adding (mixing) base or acid such as $H^+$, $Cs^+$, $K^+$, $Cl^-$, $SO_4^{2-}$, and $PO_4^{2-}$ to (with) pure water, and it is also allowable to use those obtained by adding (mixing) fine particles of Al oxide or the like to (with) pure water. As for the liquid LQ, it is preferable to use those which have small coefficient of light absorption, which have small temperature dependency, and which are stable against the photosensitive material (or, for example, the top coat film or the antireflection film) coated on the surface of the substrate P and/or the projection system PL. As for the liquid LQ, it is also possible to use various fluids including, for example, supercritical fluids.

In the respective embodiments described above, the interferometer system is used to measure the position information about each of the mask stage and the substrate stage. However, the measurement of the position information is not limited to this. For example, it is also allowable to use an encoder system for detecting the scale (diffraction grating) provided on each of the stages, as disclosed, for example, in International Publication No. 2007/083758 (corresponding to U.S. patent application Ser. No. 11/655,082), International Publication No. 2007/097379 (corresponding to U.S. patent application Ser. No. 11/708,533) and the like. Alternatively, it is allowable to use an encoder system having an encoder head which is provided on the substrate table and a scale provided at a position above or over the substrate table, as disclosed, for example, in United States Patent Application Publication No. 2006/0227309 and the like. In this case, it is preferable that a hybrid system comprising both of the interferometer system and the encoder system is provided, and that the measurement result of the encoder system is calibrated (subjected to the calibration) by using the measurement result of the interferometer system. The position control of the stage may be performed by switchingly using the interferometer system and the encoder system or using both of the interferometer system and the encoder system. Further, in each of the embodiments, it is allowable to use, as the actuator driving the first and second substrate stages, a planar motor.

The substrate P, which is usable in the respective embodiments described above, is not limited to the semiconductor wafer for producing the semiconductor device. Those applicable include, for example, a glass substrate for the display device, a ceramic wafer for the thin film magnetic head, a master plate (synthetic silica glass, silicon wafer) for the mask or the reticle to be used for the exposure apparatus, a film member and the like. The shape of the substrate P is not limited only to the circular shape, and may be any other shape including, for example, rectangular shapes.

As for the exposure apparatus EX, the present invention is also applicable to a scanning type exposure apparatus based on the step-and-scan system (scanning stepper) for performing the scanning exposure with the pattern of the mask M by synchronously moving the mask M and the substrate P as well as to a projection exposure apparatus based on the step-and-repeat system (stepper) for performing the full field exposure with the pattern of the mask M in a state that the mask M and the substrate P are allowed to stand still, and successively step-moving the substrate P.

In the exposure based on the step-and-repeat system, a reduction image of a first pattern may be transferred onto the substrate P by using the projection optical system in a state that the first pattern and the substrate P are allowed to substantially stand still; and then the full field exposure may be performed on the substrate P by partially overlaying a reduction image of a second pattern with respect to the first pattern by using the projection optical system in a state that the second pattern and the substrate P are allowed to substantially stand still. Namely, the exposure apparatus EX may be a full field exposure apparatus based on the stitch system. As for the exposure apparatus based on the stitch system, the present invention is also applicable to an exposure apparatus based on the step-and-stitch system in which at least two patterns are partially overlaid and transferred on the substrate P, and the substrate P is successively moved. Note that the exposure apparatus of the stitch system may be a scanning type exposure apparatus which transfers each of the patterns by the scanning exposure.

The present invention is also applicable to an exposure apparatus provided with a substrate stage which holds the substrate; and a measuring stage which is provided with a reference member having a reference mark formed therein and/or various photoelectric sensors as disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963). The contents of U.S. Pat. No. 6,897,963 etc. is incorporated herein by reference within a range of permission of the domestic laws and ordinances of the designated state or the selected state. For example, when a measuring mirror (having a mirror surface formed of an inclined surface), which protrudes from the side surface, is provided on or for at least one of the substrate stage and the measuring stage, the substrate P can be efficiently exposed by applying the present invention. In this case, the liquid immersion space can be moved between the substrate stage and the measuring stage such that the substrate stage and the measuring stage are moved in a state that the substrate stage and the measuring stage are made to approach to each other or brought into contact with each other and that the other of the substrate stage and the measuring stage is arranged to be opposite to the optical element 8 in exchange with respect to one of the substrate stage and the measuring stage. On the measuring stage, the measurement relating to the exposure (for example, the base line measurement) can be executed by using the measuring device (measuring member) provided on the measuring stage in a state that the liquid immersion space is formed. Accordingly, it is possible to obtain the information required for the liquid immersion exposure for the substrate P (for example, the base line amount, the illuminance of the exposure light EL, and/or the like). Details of the operation for moving the liquid immersion space between the substrate stage and the measuring stage and the measuring operation of the measuring stage during the exchange of the substrate are disclosed, for example, in International Publication No. 2005/074014 (corresponding to European Patent Application Publication No. 1713113) and International Publication No. 2006/013806. Further, the exposure apparatus having the measuring stage may be provided with a plurality of substrate stages.

The respective embodiments described above have been explained as exemplified by the exposure apparatus provided with the projection optical system PL by way of example. However, the present invention is applicable to an exposure apparatus and an exposure method in which the projection optical system PL is not used. Even when the projection optical system PL is not used in such apparatus and method, the exposure light beam is radiated onto the substrate via an optical member such as a lens, and the liquid immersion area is formed in a predetermined space between such an optical member and the substrate. It is also possible to omit the mask stage depending on the above-described exposure system.

The respective embodiments described above have been explained as exemplified by the case of the application of the liquid immersion method in which the substrate P is exposed in such a state that the optical path space for the exposure light EL is filled with the liquid LQ by way of example. However, the present invention is also applicable to the ordinary dry type exposure apparatus in which the optical path space for the exposure light EL is filled only with a gas, rather than being filled with the liquid LQ.

The optical element (terminal end optical element) 8 of the projection optical system PL may be formed of, for example, a single crystal material of fluorine compound such as barium fluoride, strontium fluoride, lithium fluoride, sodium fluoride and the like; or silica glass (silica), instead of calcium fluoride. Alternatively, the optical element (terminal end optical element) 8 may be formed of a material having a refractive index higher than those of silica glass and calcium fluoride (for example, a material having a refractive index of not less than 1.6). Materials usable as the material having the refractive index of not less than 1.6 include, for example, sapphire, germanium dioxide and the like disclosed in International Publication No. 2005/059617, and potassium chloride (refractive index: about 1.75) disclosed in International Publication No. 2005/059618.

In the respective embodiments described above, the ArF excimer laser is used as the light source for the exposure light EL. However, it is also allowable to use a high harmonic wave-generating device which includes, for example, a solid laser light source such as a DFB semiconductor laser or a fiber laser; a light-amplifying section having a fiber amplifier or the like; and a wavelength-converting section, and which outputs a pulse light beam having a wavelength of 193 nm as disclosed, for example, in U.S. Pat. No. 7,023,610. Further, in the respective embodiments described above, the projection area (exposure area) is rectangular. However, it is also allowable to adopt any other shape including, for example, circular arc-shaped, trapezoidal, parallelogramic, rhombic shapes and the like.

As for the type of the exposure apparatus EX, the present invention is not limited to the exposure apparatus for the semiconductor device production which exposes the substrate P with the semiconductor device pattern. The present invention is also widely applicable, for example, to an exposure apparatus which produces a liquid crystal display device or for producing a display as well as to an exposure apparatus which produces, for example, a thin film magnetic head, an image pickup device (CCD), a micromachine, MEMS, a DNA chip, a reticle, or a mask; and the like.

In the embodiments described above, the light-transmissive type mask is used, in which a predetermined light-shielding pattern (or phase pattern or dimming or light-reducing pattern) is formed on a light-transmissive substrate. However, in place of such a mask, as disclosed, for example, in U.S. Pat. No. 6,778,257, it is also allowable to use an electronic mask which forms, based on electronic data of a pattern to be subjected to the exposure a transmissive pattern, a reflective pattern, or a light-emitting pattern. The electronic mask is also referred to as "variable shaped mask", "active mask" or "image generator" and includes DMD (Digital Micro-mirror Device) as a kind of the non-light emission type image display device (spatial image modulator). The exposure apparatus using DMD is disclosed, for example, in Japanese Patent Application Laid-open Nos. 8-313842 and 2004-304135 in addition to U.S. Pat. No. 6,778,257 as mentioned above. The contents of U.S. Pat. No. 6,778,257 is incorporated herein by reference within a range of permission of the domestic laws and ordinances of the designated state or the selected state.

The present invention is also applicable to an exposure apparatus (lithography system) in which the substrate P is exposed with a line-and-space pattern by forming interference fringes on the substrate P as disclosed, for example, in International Publication No. 2001/035168.

The present invention is also applicable, for example, to an exposure apparatus in which patterns of two masks are combined on the substrate via the projection optical system, and one shot area on the substrate is subjected to the double exposure substantially simultaneously by performing one time of the scanning exposure as disclosed, for example, Published Japanese Translation of PCT International Publication for Patent Application No. 2004-519850 (corresponding to U.S. Pat. No. 6,611,316). The contents of U.S. Pat. No. 6,611,316 is incorporated herein by reference within a range of permission of the domestic laws and ordinances of the designated state or the selected state of this international application. The present invention is also applicable, for example, to an exposure apparatus based on the proximity system and a mirror projection aligner.

As described above, the exposure apparatus EX according to each of the embodiments of the present invention is produced by assembling the various subsystems including the respective constitutive elements as defined in claims so that the predetermined mechanical accuracy, electric accuracy, and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness and the like are managed.

Figure 23:
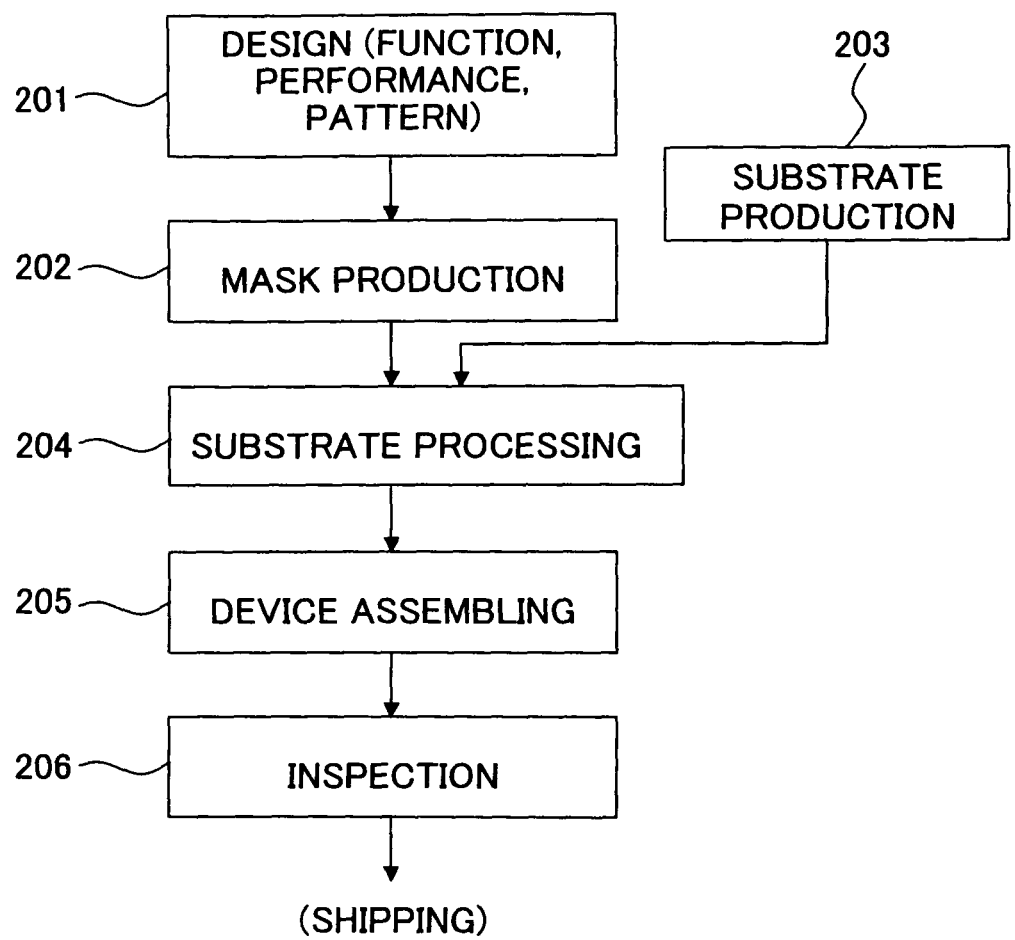
FIG. 23 is a flow chart illustrating exemplary steps of producing a microdevice.

As shown in FIG. 23, a microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate-processing step 204 including the process of exposing the substrate P in accordance with the embodiment described above and developing the exposed substrate P, a step 205 of assembling the device (including processing processes such as a dicing step, a bonding step, a packaging step and the like), and an inspection step 206.

As for various United States patents, United States patent application Publications and the like referred to in this specification, the contents thereof are incorporated herein by reference within a range of permission of the domestic laws and ordinances of the designated state or the selected state, in relation to those other than those having been specifically and explicitly incorporated herein by reference as well.

According to the present invention, the substrate can be exposed efficiently and satisfactorily. Even when the present invention is applied to the liquid immersion exposure, it is possible to produce the device having the desired performance at a good productivity. Therefore, the present invention can remarkably contribute to the development of the precision mechanical equipment industry including the semiconductor industry in our country.

What is claimed is:

1. An immersion exposure apparatus, comprising:
   an optical system via which the exposure beam exits;
   a first stage placing thereon a substrate onto which the exposure beam is irradiated;
   a second stage which is movable independently from the first stage;
   a liquid immersion system which supplies a liquid beneath the optical system and forms a liquid immersion area;
   a bridge member which is provided on the first stage and which has an upper surface retaining the liquid immersion area between the upper surface and the optical system;
   a driving device which moves the first stage and the bridge member relative to each other; and
   a driving system which moves the first stage and the second stage so that a change is made from a first stage in which the liquid immersion area is retained between the optical system and the first stage to a second stage in which the liquid immersion area is retained between the optical system and the second stage;
   wherein for an operation of the change, the bridge member is moved in the first stage from a first position to a second position by the driving device so that the upper surface of the bridge member is arranged between the first and second stages;

the liquid immersion area is retained beneath the optical system and is moved from the first stage to the second stage via the bridge member during the operation of the change; and the substrate is exposed with the exposure beam via the optical system and the liquid and is moved relative to the liquid immersion area by the first stage during an operation of the exposure.

2. The immersion exposure apparatus according to claim 1, further comprising a holding member which is provided on the first stage and which holds the bridge member moved to the second position.

3. The immersion exposure apparatus according to claim 2, wherein the bridge member is held at the second position so that the upper surface of the bridge member is substantially flush with a surface of the first stage and a surface of the second stage.

4. The immersion exposure apparatus according to claim 3, wherein before the operation of the change, the first stage and the second stage are moved so that the first stage and the second stage are close to each other with respect to a predetermined direction; and during the operation of the change, the first stage and the second stage are moved in the predetermined direction in a state in which the bridge member is held at the second position.

5. The immersion exposure apparatus according to claim 4, wherein the substrate is placed on each of the first stage and the second stage;

the immersion exposure apparatus further comprises a measuring system which obtains position information about a position of the substrate via an optical member disposed separately and away from the optical system; and at least part of an exposure operation for the substrate placed on one of the first and second stages which is arranged beneath the optical system is performed concurrently with at least a part of a measurement operation for the substrate placed on the other of the first and second stages which is arranged beneath the optical member.

6. The immersion exposure apparatus according to claim 5, wherein another bridge member different from the bridge member is provided on the second stage; and the first stage and the second stage are moved in a state in which the bridge member and the another bridge member are brought into contact with each other or close to each other during the operation of the change.

7. The immersion exposure apparatus according to claim 6, wherein the bridge member and the another bridge member are held on the first stage and the second stage respectively so that the upper surface of the bridge member and an upper surface of the another bridge member are substantially flush with each other.

8. A method for producing a device, comprising:
exposing a substrate by using the exposure apparatus as defined in claim 1;
developing the exposed substrate; and
processing the developed substrate.

9. An immersion exposure method, comprising:
supplying a liquid beneath an optical system from which an exposure beam exits to form a liquid immersion area, and exposing a substrate placed on a first stage with an exposure beam via the optical system and the liquid;

moving the first stage and a second stage which is movable independently from the first stage so that a change is made from a first state in which the liquid immersion area is retained between the optical system and the first stage to a second state in which the liquid immersion area is retained between the optical system and the second stage; and moving, for an operation of the change, a bridge member which is provided on the first stage from a first position to a second position in the first stage so that an upper surface of the bridge member is arranged between the first and second stages;

wherein the liquid immersion area is retained beneath the optical system and is moved from the first stage to the second stage via the bridge member during the operation of the change; and the substrate is moved relative to the liquid immersion area by the first stage during an operation of the exposure.

10. The immersion exposure method according to claim 9, further comprising holding, by a holding member provided on the first stage, the bridge member moved to the second position.

11. The immersion exposure method according to claim 10, wherein the bridge member is held at the second position so that the upper surface of the bridge member is substantially flush with a surface of the first stage and a surface of the second stage.

12. The immersion exposure method according to claim 11, wherein before the operation of the change, the first stage and the second stage are moved so that the first stage and the second stage are close to each other with respect to a predetermined direction; and during the operation of the change, the first stage and the second stage are moved in the predetermined direction in a state in which the bridge member is held at the second position.

13. The immersion exposure method according to claim 12, wherein the substrate is placed on each of the first stage and the second stage; and at least part of an exposure operation for the substrate placed on one of the first and second stages which is arranged beneath the optical system is performed concurrently with at least a part of a measurement operation for the substrate placed on the other of the first and second stages which is arranged beneath an optical member disposed separately and away from the optical system.

14. The immersion exposure method according to claim 13, wherein another bridge member different from the bridge member is provided on the second stage; and the first stage and the second stage are moved in a state in which the bridge member and the another bridge member are brought into contact with each other or close to each other during the operation of the change.

15. The immersion exposure method according to claim 14, wherein the bridge member and the another bridge member are held on the first stage and second stage respectively so that the upper surface of the bridge member and an upper surface of the another bridge member are substantially flush with each other.

16. A method for producing a device, comprising:
exposing a substrate by using the exposure method as defined in claim 9;
developing the exposed substrate; and
processing the developed substrate.

* * * * *